(12) United States Patent
Hashiguchi et al.

(10) Patent No.: US 12,336,317 B2
(45) Date of Patent: Jun. 17, 2025

(54) SOLID-STATE IMAGING DEVICE AND ELECTRONIC DEVICE INCLUDING COUPLING STRUCTURES FOR ELECTRICALLY INTERCONNECTING STACKED SEMICONDUCTOR SUBSTRATES

(71) Applicant: SONY SEMICONDUCTOR SOLUTIONS CORPORATION, Kanagawa (JP)

(72) Inventors: Hideto Hashiguchi, Kanagawa (JP); Reijiroh Shohji, Kanagawa (JP); Hiroshi Horikoshi, Kanagawa (JP); Ikue Mitsuhashi, Kanagawa (JP); Tadashi Iijima, Kanagawa (JP); Takatoshi Kameshima, Kanagawa (JP); Minoru Ishida, Kanagawa (JP); Masaki Haneda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/581,727

(22) Filed: Feb. 20, 2024

(65) Prior Publication Data
US 2024/0194718 A1    Jun. 13, 2024

Related U.S. Application Data

(63) Continuation of application No. 17/869,659, filed on Jul. 20, 2022, now Pat. No. 11,948,961, which is a
(Continued)

(30) Foreign Application Priority Data

Apr. 4, 2017  (JP) .................................. 2017-074806
Aug. 14, 2017 (JP) .................................. 2017-156586

(51) Int. Cl.
H10F 39/00      (2025.01)
H10F 39/12      (2025.01)
H10F 39/18      (2025.01)

(52) U.S. Cl.
CPC ......... *H10F 39/811* (2025.01); *H10F 39/182* (2025.01); *H10F 39/199* (2025.01);
(Continued)

(58) Field of Classification Search
CPC ......... H01L 27/14605; H01L 27/14612; H01L 27/14634; H01L 27/1464; H01L 27/14645;
(Continued)

(56) References Cited

U.S. PATENT DOCUMENTS

2015/0115389 A1* 4/2015 Chuang ............... H01L 27/1464
                                              257/774
2015/0194455 A1* 7/2015 Ho .................... H01L 27/14636
                                              438/109
(Continued)

FOREIGN PATENT DOCUMENTS

CN   104718622 A   6/2015
CN   104779243 A   7/2015
(Continued)

OTHER PUBLICATIONS

International Search Report and Written Opinion of PCT Application No. PCT/JP2018/011569, issued on Jun. 12, 2018, 15 pages of English Translation and 12 pages of ISRWO.
(Continued)

*Primary Examiner* — Matthew E. Gordon
(74) *Attorney, Agent, or Firm* — CHIP LAW GROUP

(57) ABSTRACT

To provide a solid-state imaging device and an electronic apparatus with further improved performance. A solid-state imaging device including: a first substrate on which a pixel
(Continued)

unit is formed, and a first semiconductor substrate and a first multi-layered wiring layer are stacked; a second substrate on which a circuit having a predetermined function is formed, and a second semiconductor substrate and a second multi-layered wiring layer are stacked; and a third substrate on which a circuit having a predetermined function is formed, and a third semiconductor substrate and a third multi-layered wiring layer are stacked. The first substrate, the second substrate, and the third substrate are stacked in this order. The pixel unit has pixels arranged thereon. The first substrate and the second substrate are bonded together in a manner that the first multi-layered wiring layer and the second semiconductor substrate are opposed to each other. A first coupling structure for electrically coupling a circuit of the first substrate and the circuit of the second substrate to each other does not include a coupling structure formed from the first substrate as a base over bonding surfaces of the first substrate and the second substrate. Alternatively, the first coupling structure does not exist.

9 Claims, 72 Drawing Sheets

Related U.S. Application Data continuation of application No. 16/497,497, filed as application No. PCT/JP2018/011569 on Mar. 23, 2018, now Pat. No. 11,411,037.

(52) U.S. Cl.
CPC ..... *H10F 39/8023* (2025.01); *H10F 39/8037* (2025.01); *H10F 39/809* (2025.01)

(58) Field of Classification Search
CPC ............. H01L 27/14636; H10F 39/811; H10F 39/182; H10F 39/199; H10F 39/8023; H10F 39/8037; H10F 39/809
USPC ........................................................ 257/291
See application file for complete search history.

(56) References Cited

U.S. PATENT DOCUMENTS

| | | | | |
|---|---|---|---|---|
| 2015/0221694 A1* | 8/2015 | Baba | ................. | H01L 27/14636 257/443 |
| 2015/0270307 A1* | 9/2015 | Umebayashi | ..... | H01L 27/14623 257/292 |
| 2016/0111468 A1 | 4/2016 | Qian et al. | | |
| 2016/0181226 A1 | 6/2016 | Wan | | |
| 2016/0218135 A1 | 7/2016 | Umebayashi et al. | | |
| 2016/0254299 A1 | 9/2016 | Gomi | | |
| 2016/0284753 A1* | 9/2016 | Komai | ................. | H01L 23/481 |
| 2017/0077168 A1 | 3/2017 | Wan | | |
| 2017/0092680 A1 | 3/2017 | Kwon | | |
| 2017/0148839 A1 | 5/2017 | Umebayashi et al. | | |
| 2017/0263665 A1 | 9/2017 | Komai et al. | | |
| 2017/0373113 A1 | 12/2017 | Wan | | |
| 2017/0373114 A1 | 12/2017 | Wan | | |
| 2018/0033817 A1 | 2/2018 | Ho et al. | | |

FOREIGN PATENT DOCUMENTS

| | | |
|---|---|---|
| CN | 105593995 A | 5/2016 |
| CN | 106471621 A | 3/2017 |
| CN | 107425021 A | 12/2017 |
| CN | 107482024 A | 12/2017 |
| DE | 102014118969 A1 | 7/2015 |
| DE | 112015005719 T5 | 9/2017 |
| EP | 2909862 A1 | 8/2015 |
| EP | 3084831 A1 | 10/2016 |
| EP | 3238274 A1 | 11/2017 |
| GB | 2548186 A | 9/2017 |
| JP | 2014-099582 A | 5/2014 |
| JP | 2015-135938 A | 7/2015 |
| KR | 10-2015-0066527 A | 6/2015 |
| KR | 10-2016-0100904 A | 8/2016 |
| TW | 201417255 A | 5/2014 |
| TW | 201526219 A | 7/2015 |
| TW | 201532193 A | 8/2015 |
| TW | 201705753 A | 2/2017 |
| WO | 2014/061240 A1 | 4/2014 |
| WO | 2015/093017 A1 | 6/2015 |
| WO | 2016/105658 A1 | 6/2016 |
| WO | 2016/194653 A1 | 12/2016 |
| WO | 2017/018215 A1 | 2/2017 |

OTHER PUBLICATIONS

International Preliminary Report on Patentability of PCT Application No. PCT/JP2018/011569, issued on Oct. 17, 2019, 15 pages of English Translation and 09 pages of IPRP.
Non-Final Office Action for U.S. Appl. No. 16/497,497, issued on Nov. 15, 2021, 20 pages.
Notice of Allowance for U.S. Appl. No. 16/497,497, issued on Mar. 28, 2022, 11 pages.
Notice of Allowance for U.S. Appl. No. 17/869,659, issued on Dec. 22, 2023, 06 pages.
Notice of Allowance for U.S. Appl. No. 17/869,659, issued on Nov. 13, 2023, 08 pages.
Non-Final Office Action for U.S. Appl. No. 17/869,659, issued on Jul. 27, 2023, 13 pages.

* cited by examiner

[FIG. 1]
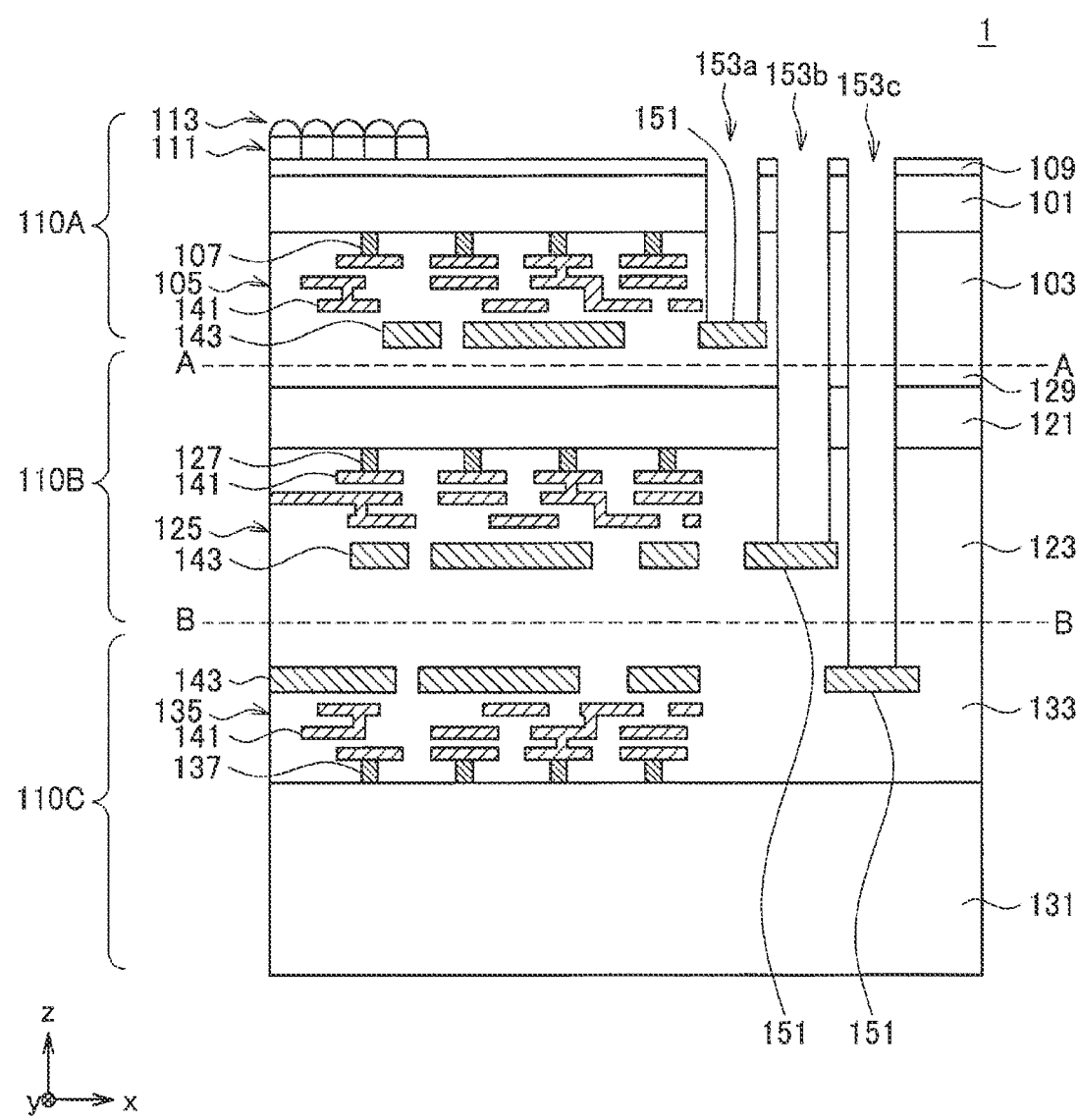

[FIG. 2A]
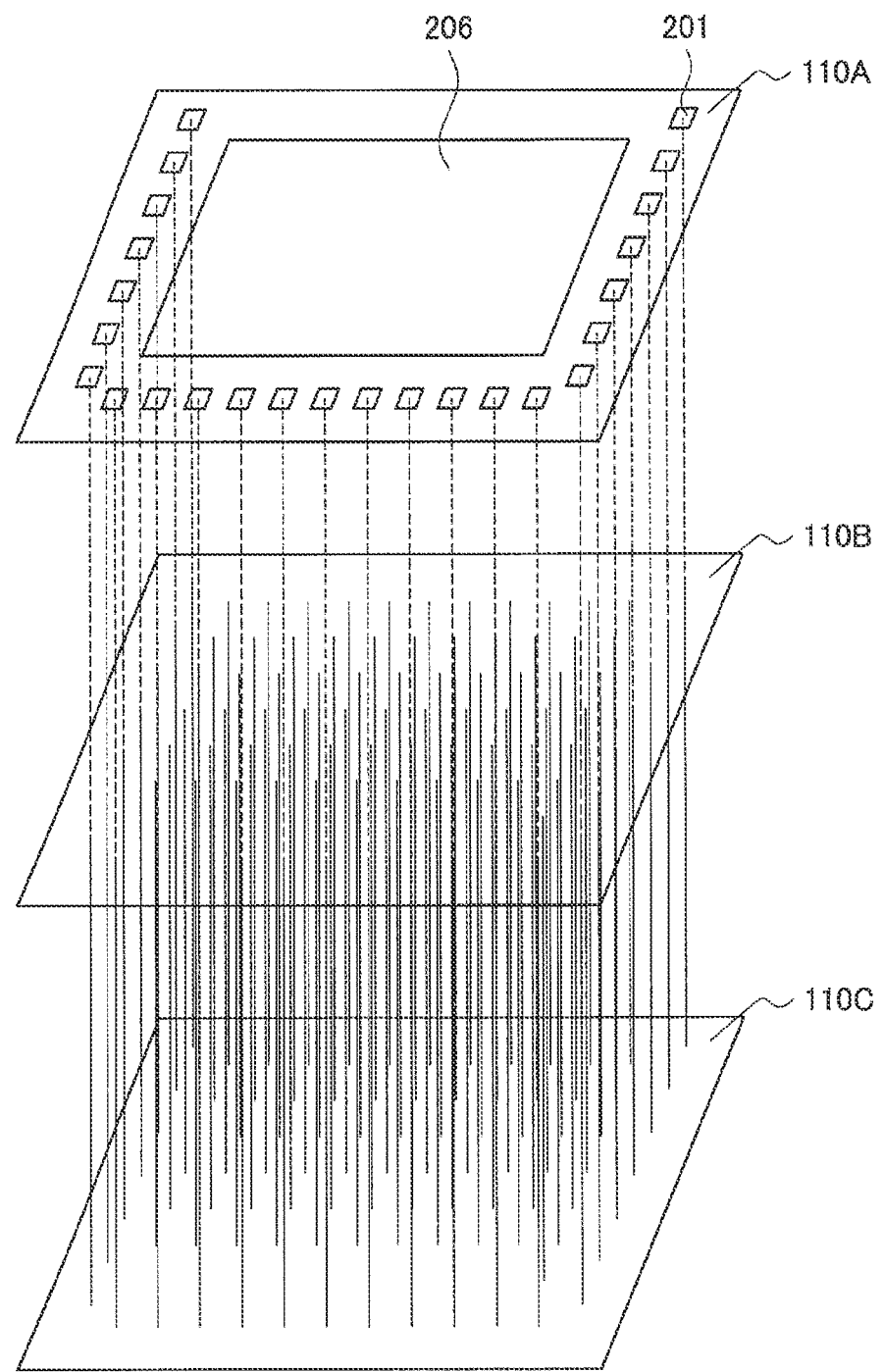

[FIG. 2B]
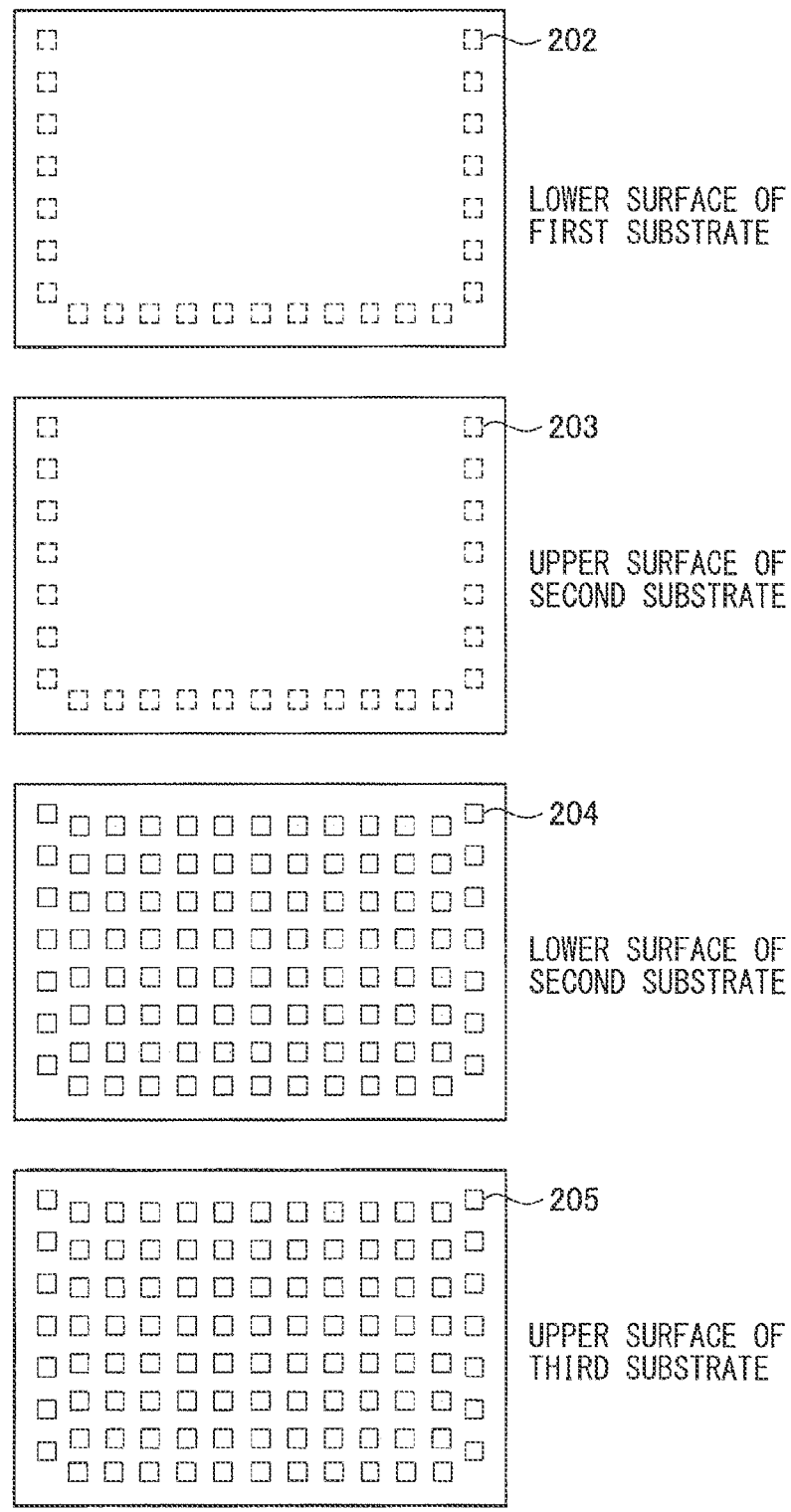

[FIG. 2C]
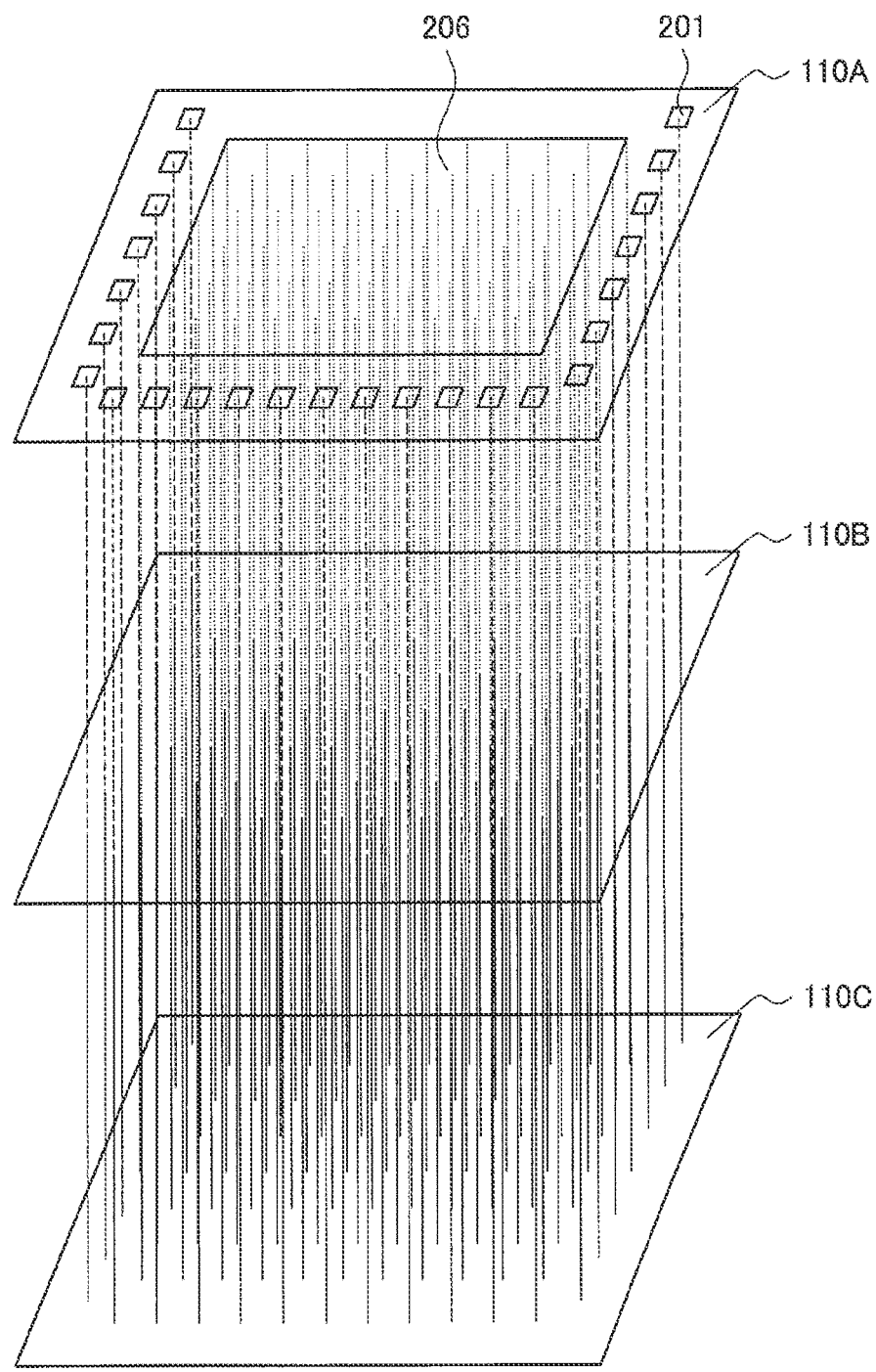

[FIG. 2D]
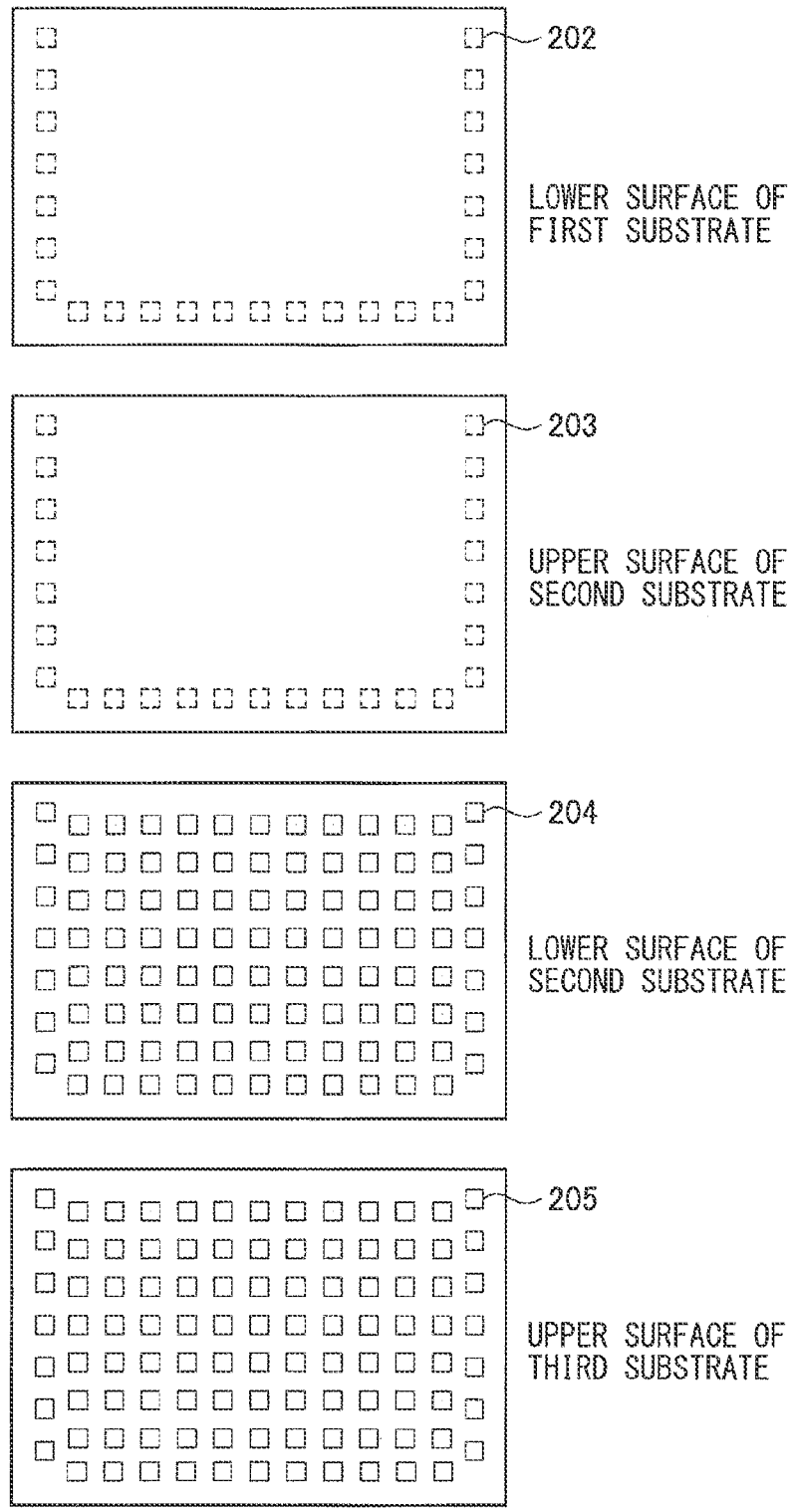

[FIG. 2E]
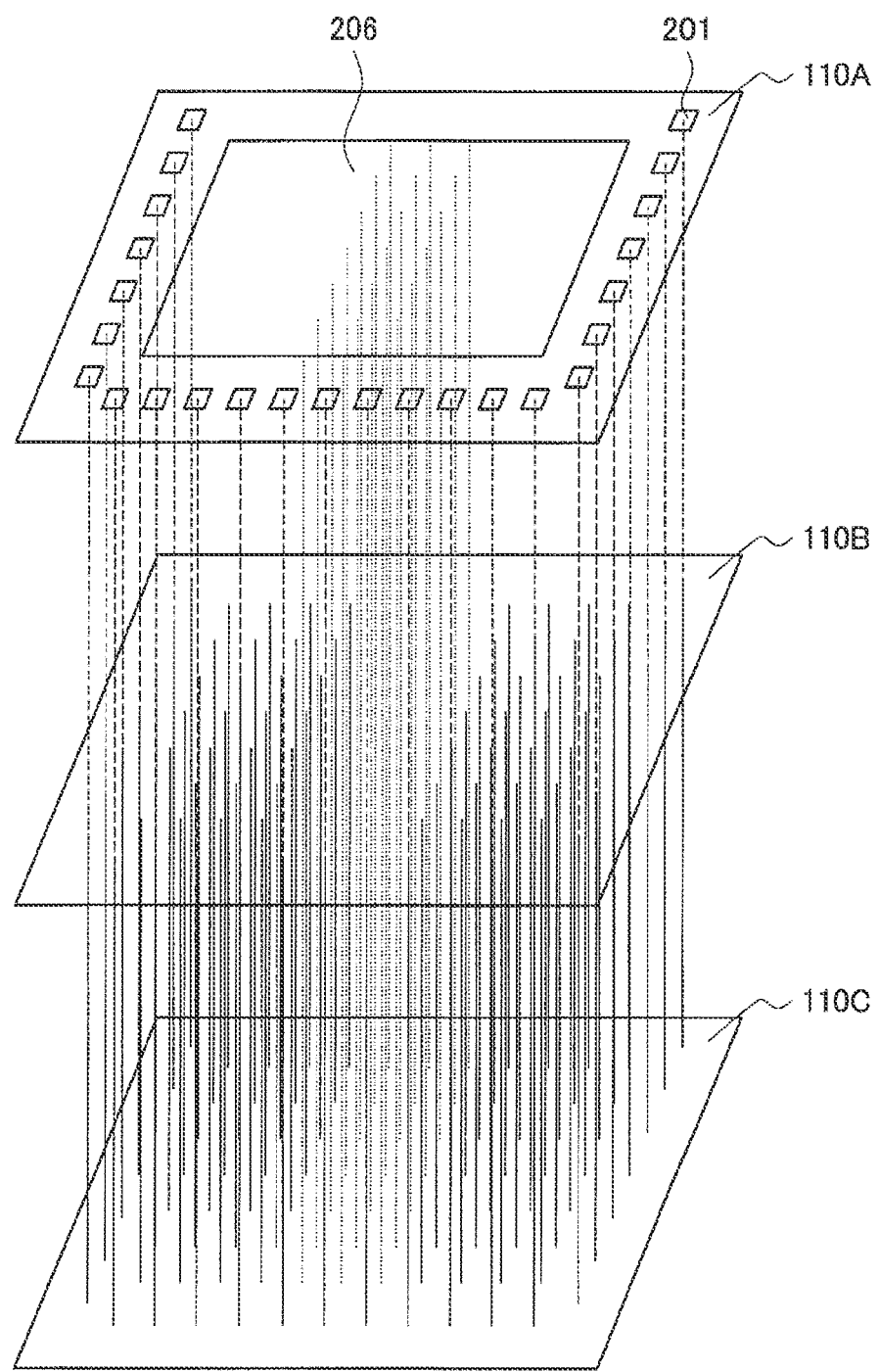

[FIG. 2F]
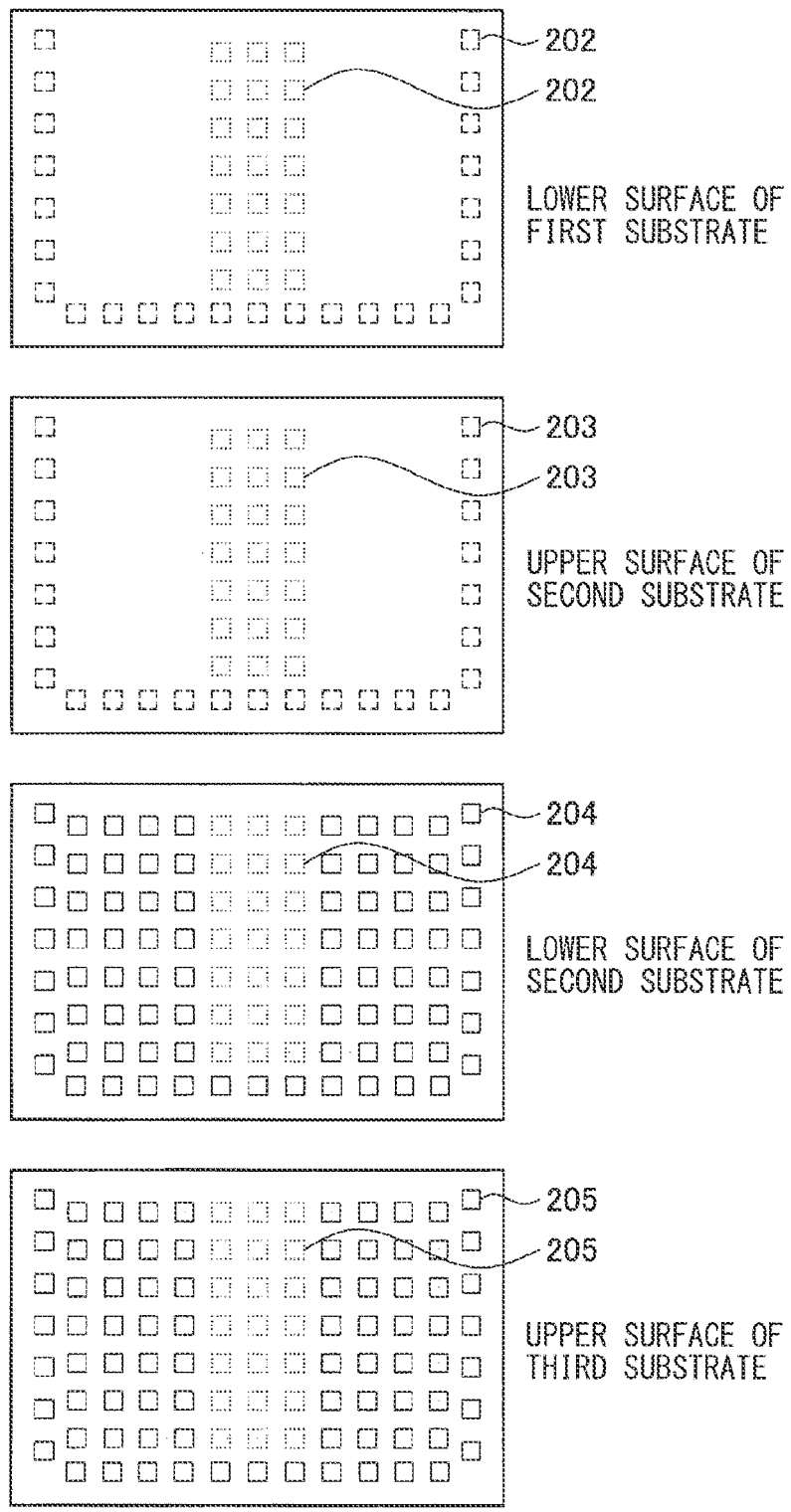

[FIG. 3A]
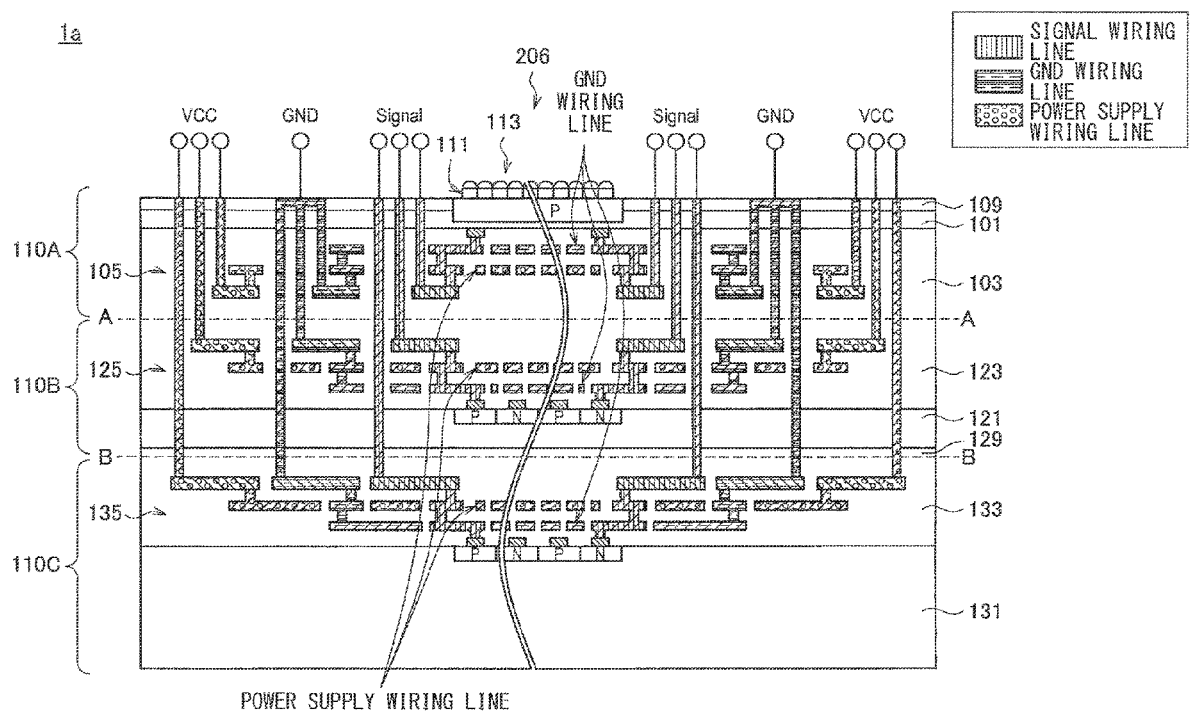

[FIG. 3B]
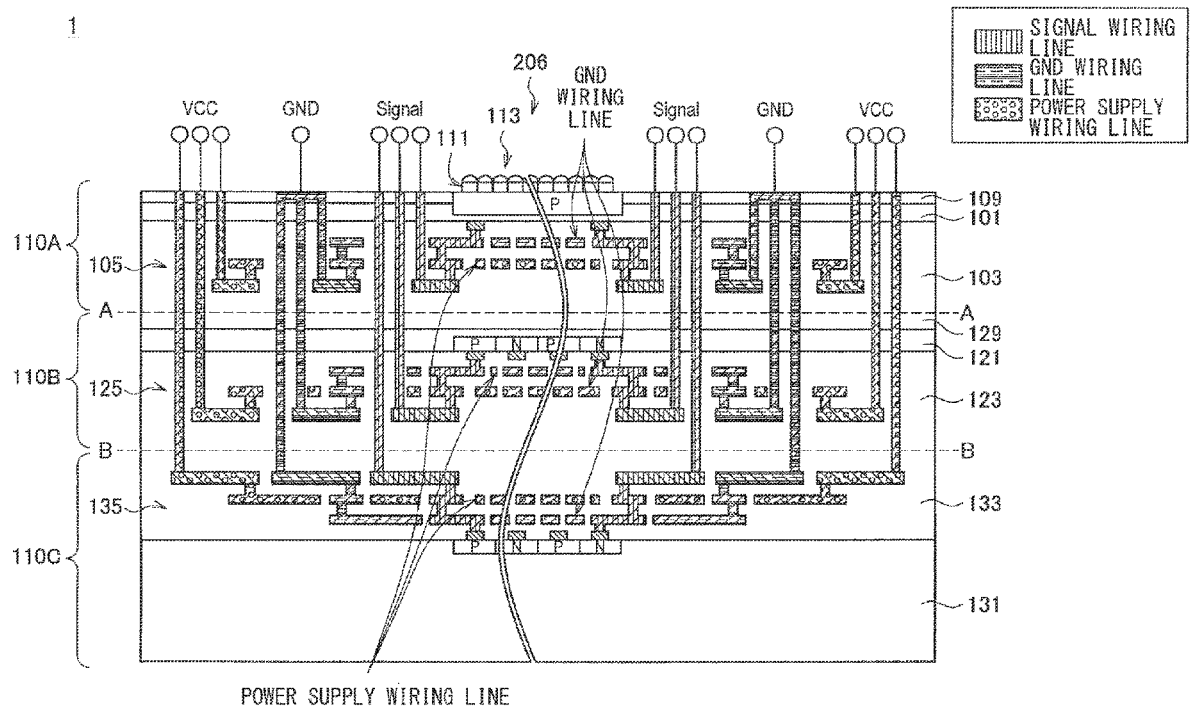

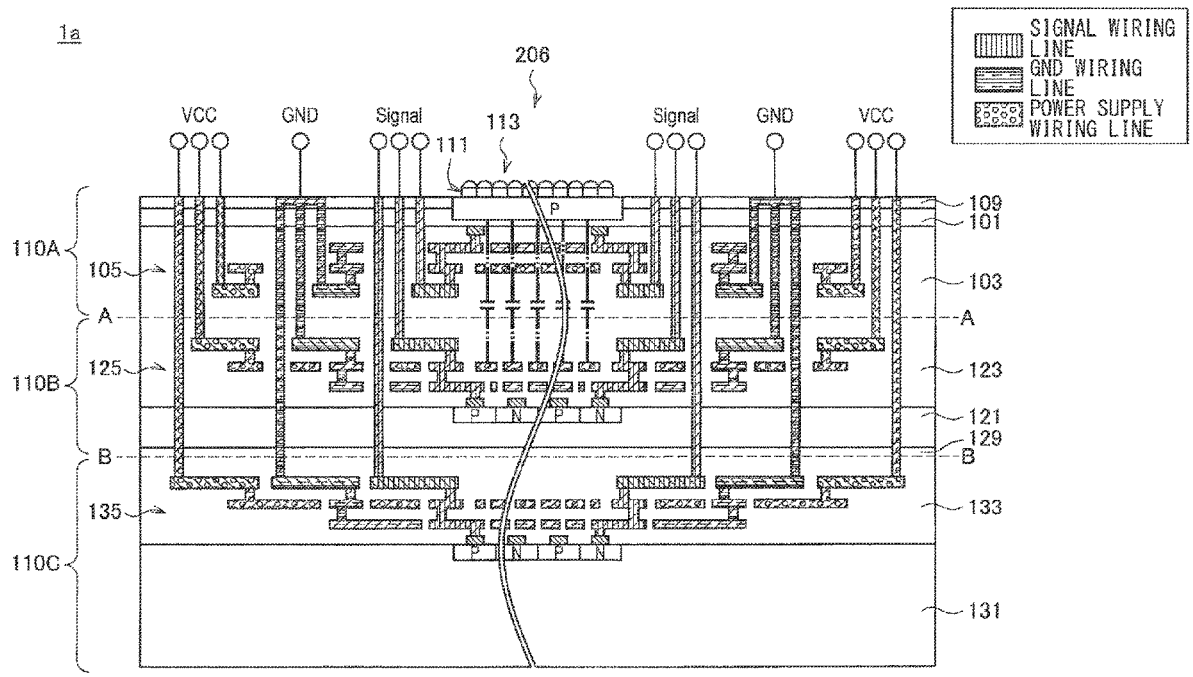
[FIG. 4A]

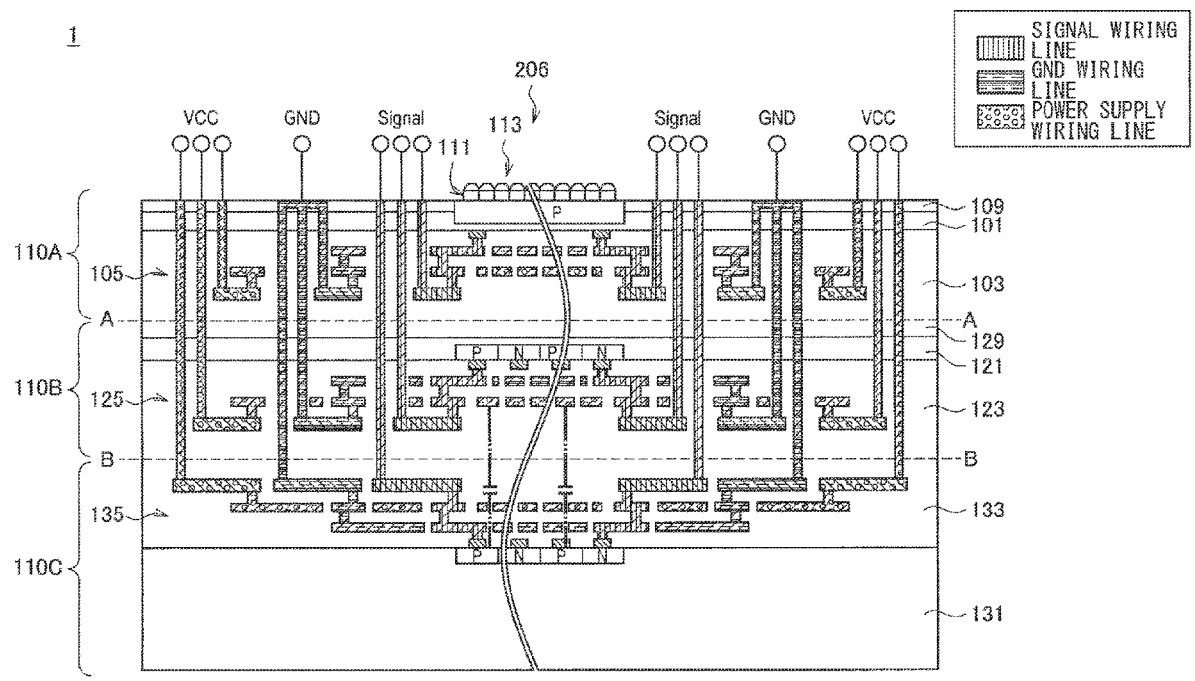

[FIG. 5A]
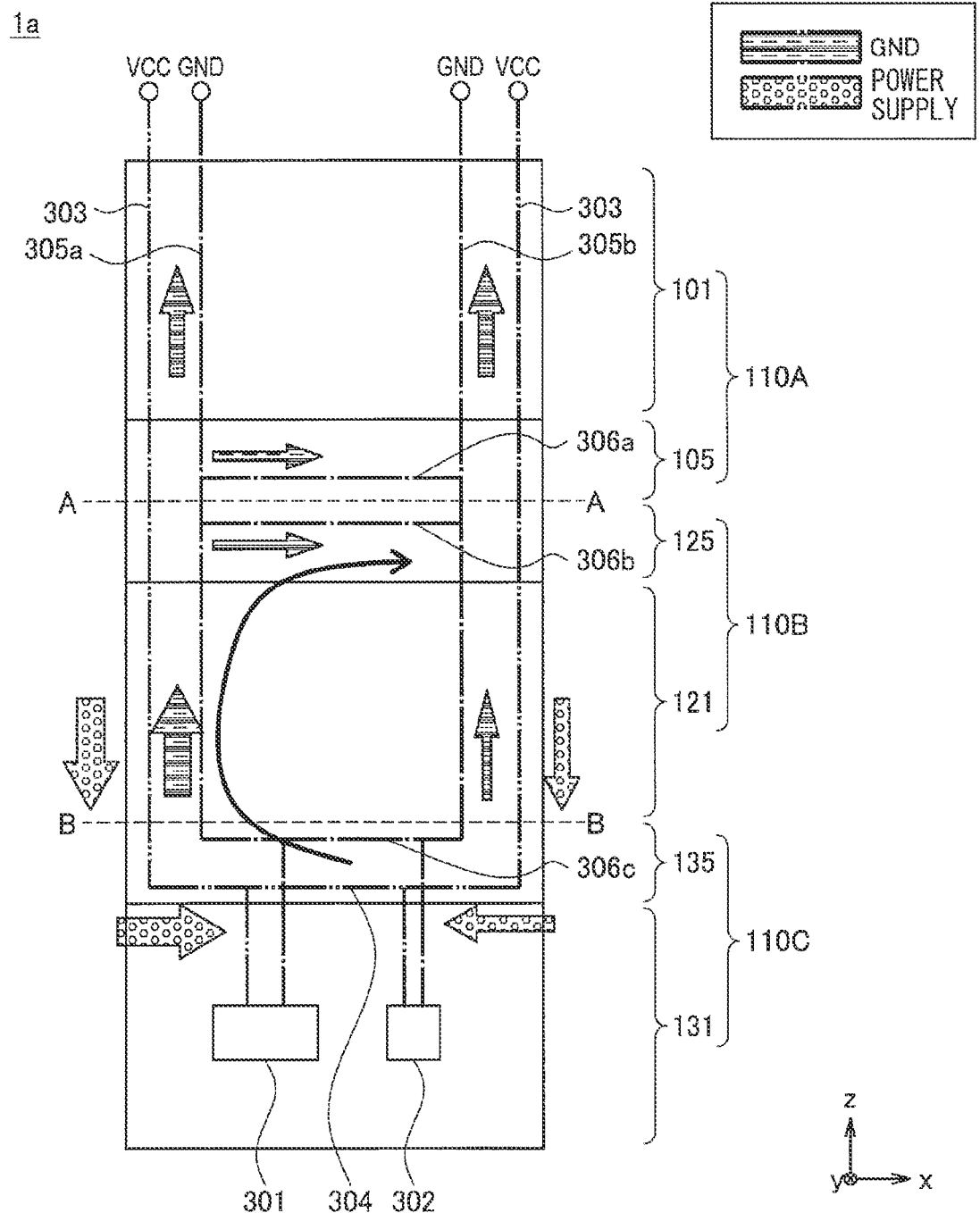

[FIG. 5B]
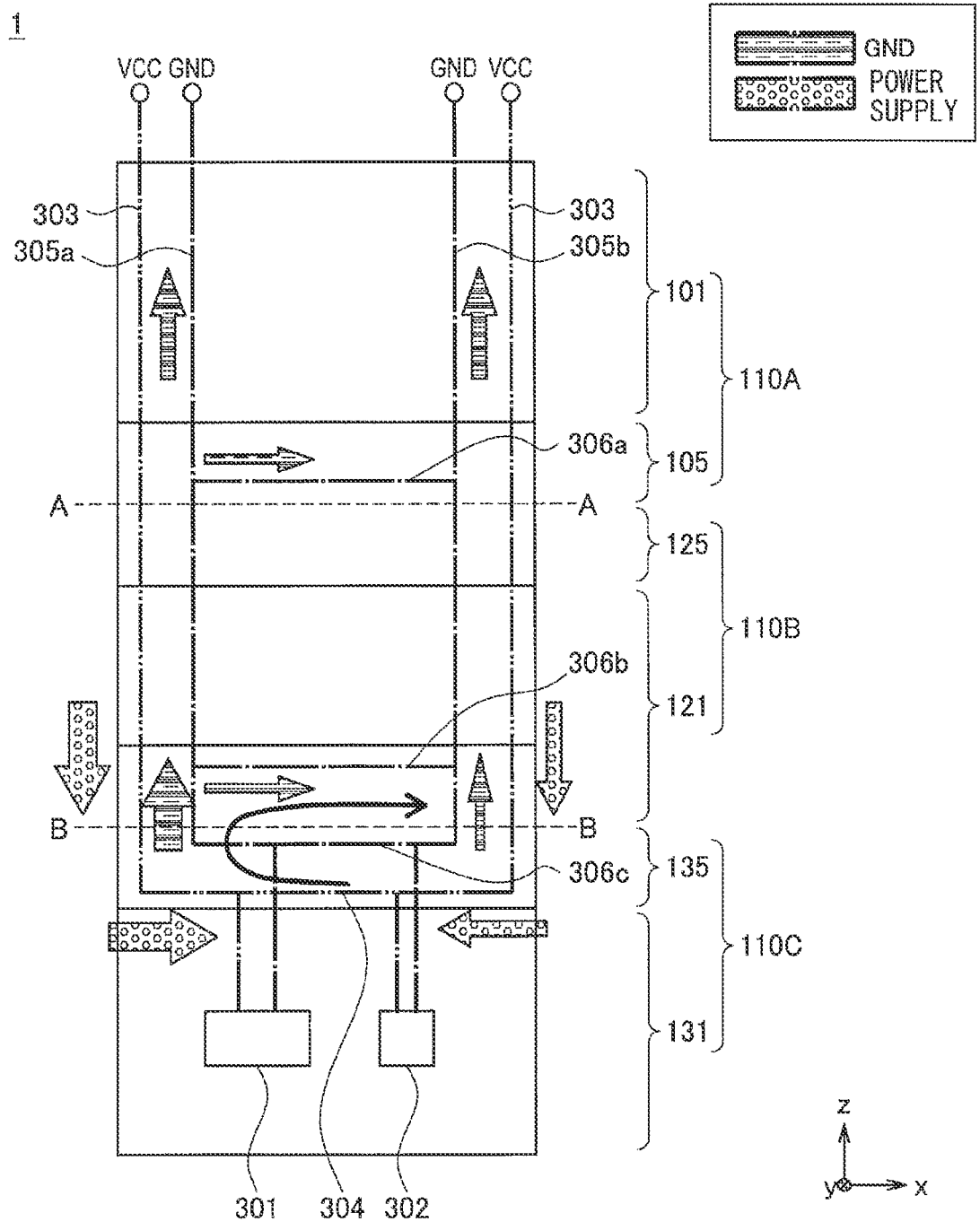

[FIG. 5C]
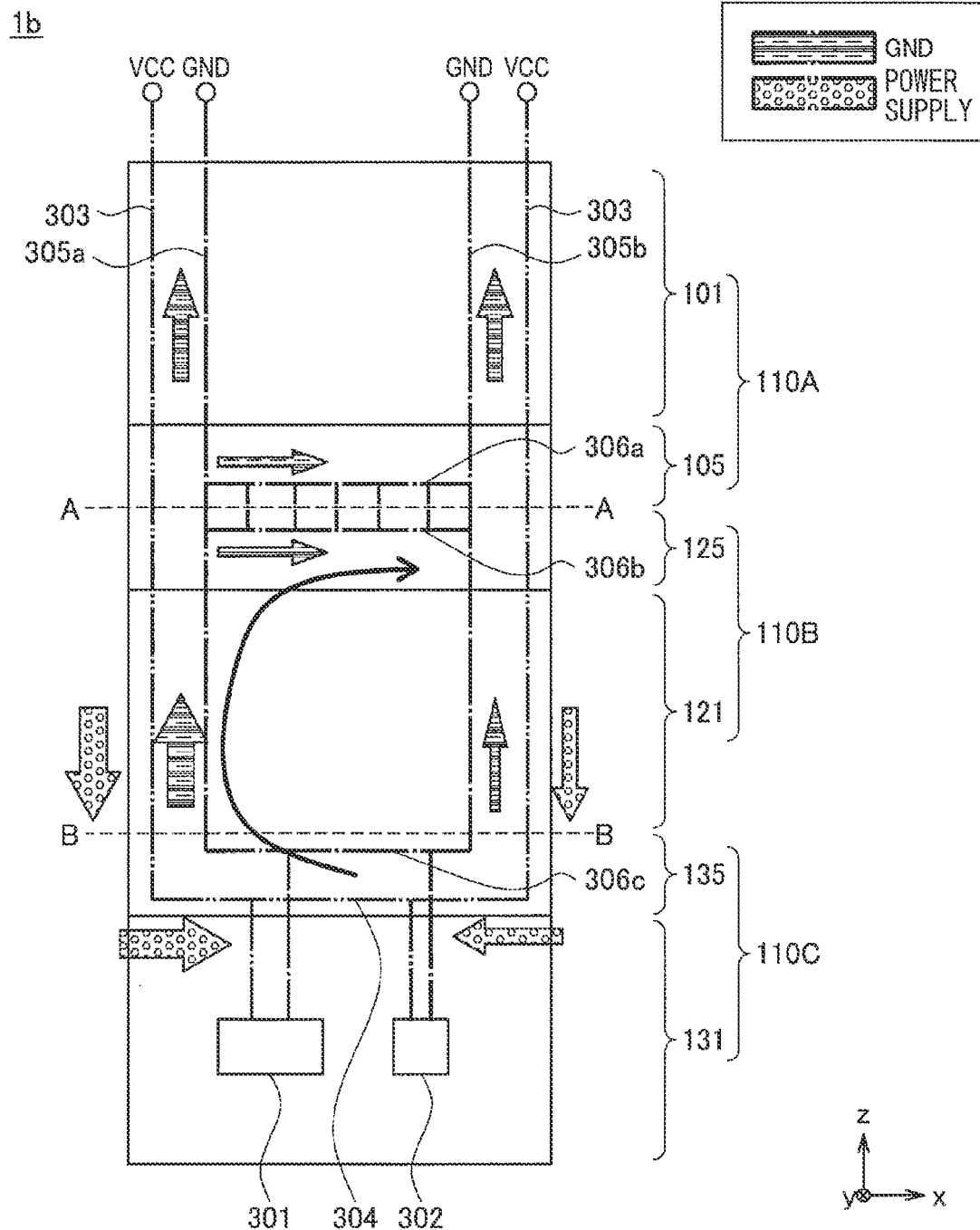

[FIG. 6A]
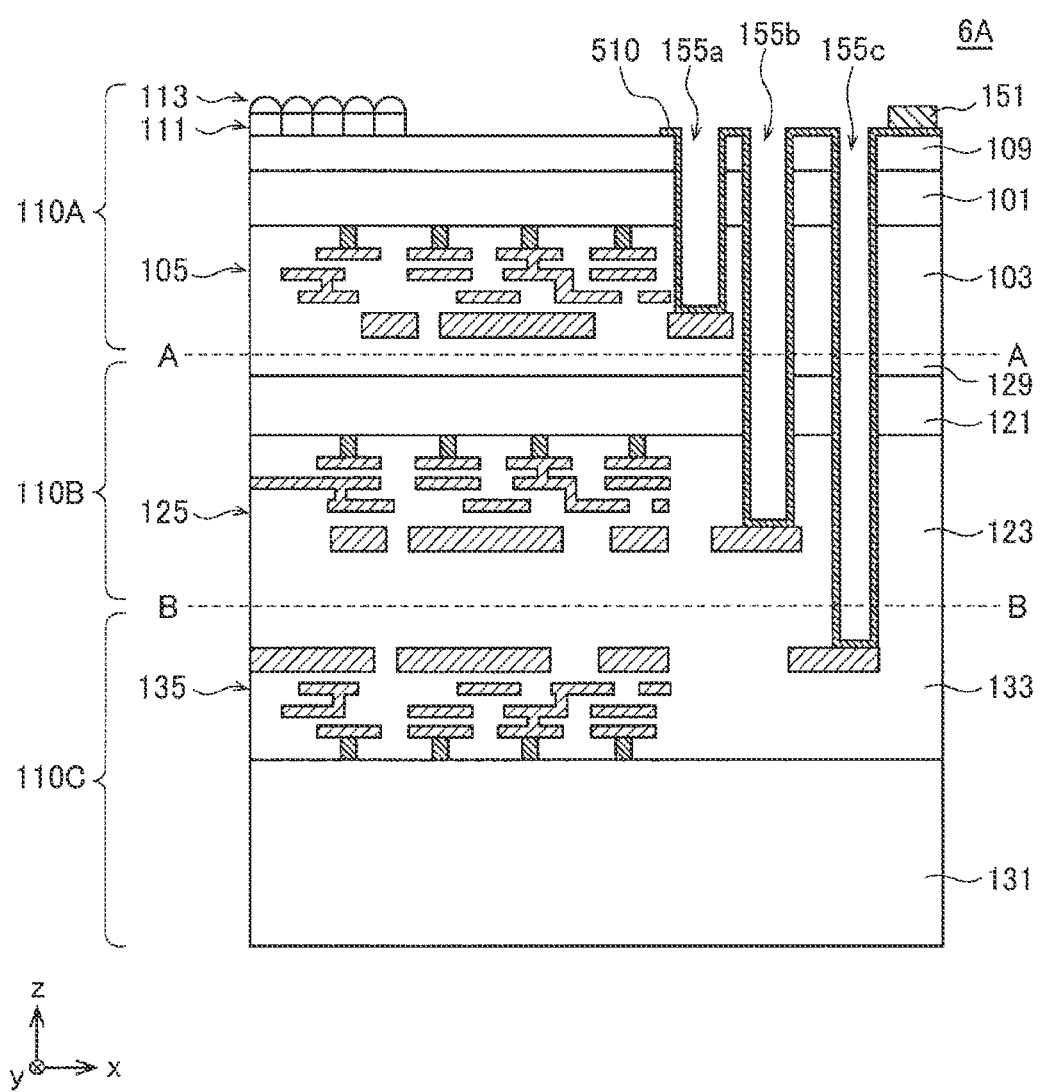

[FIG. 6B]
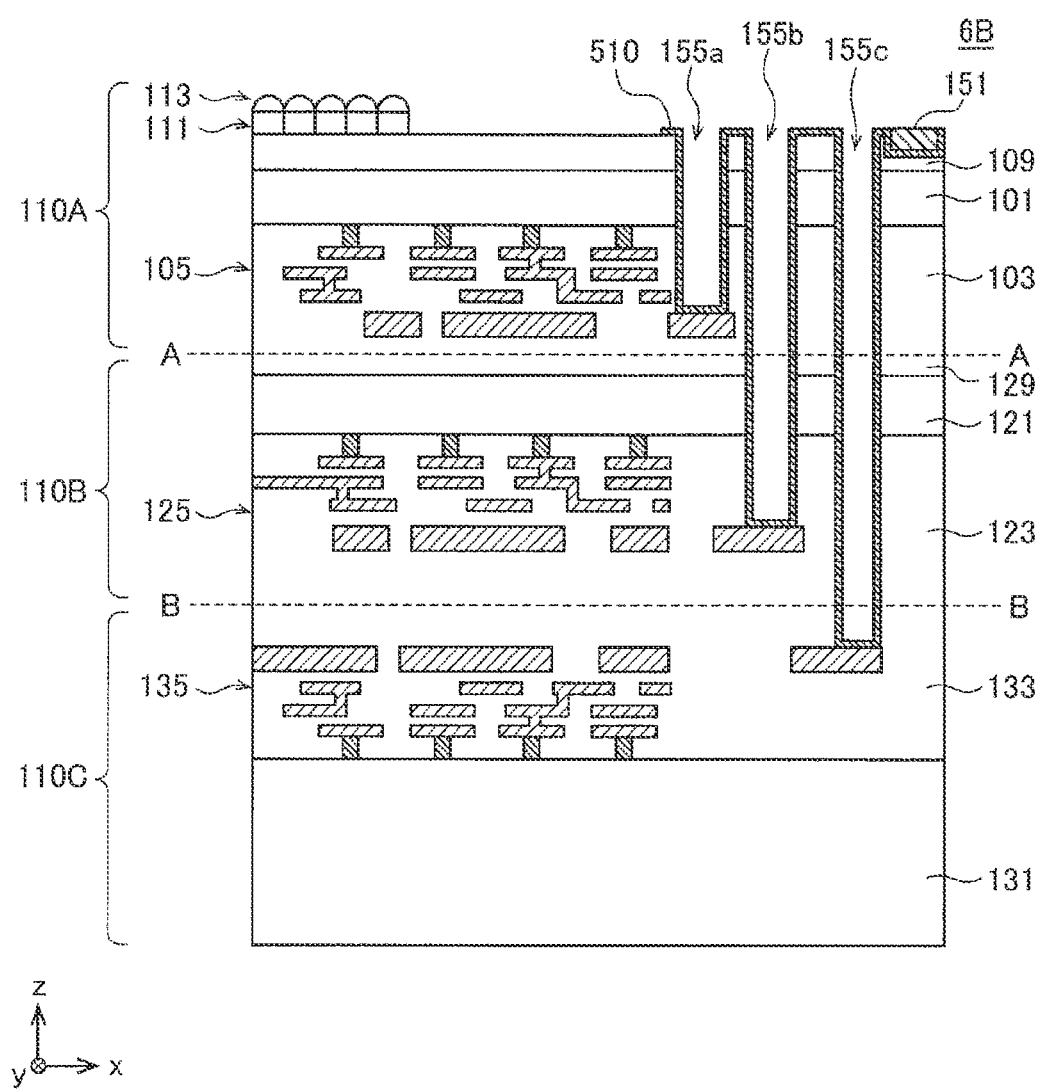

[FIG. 7A]
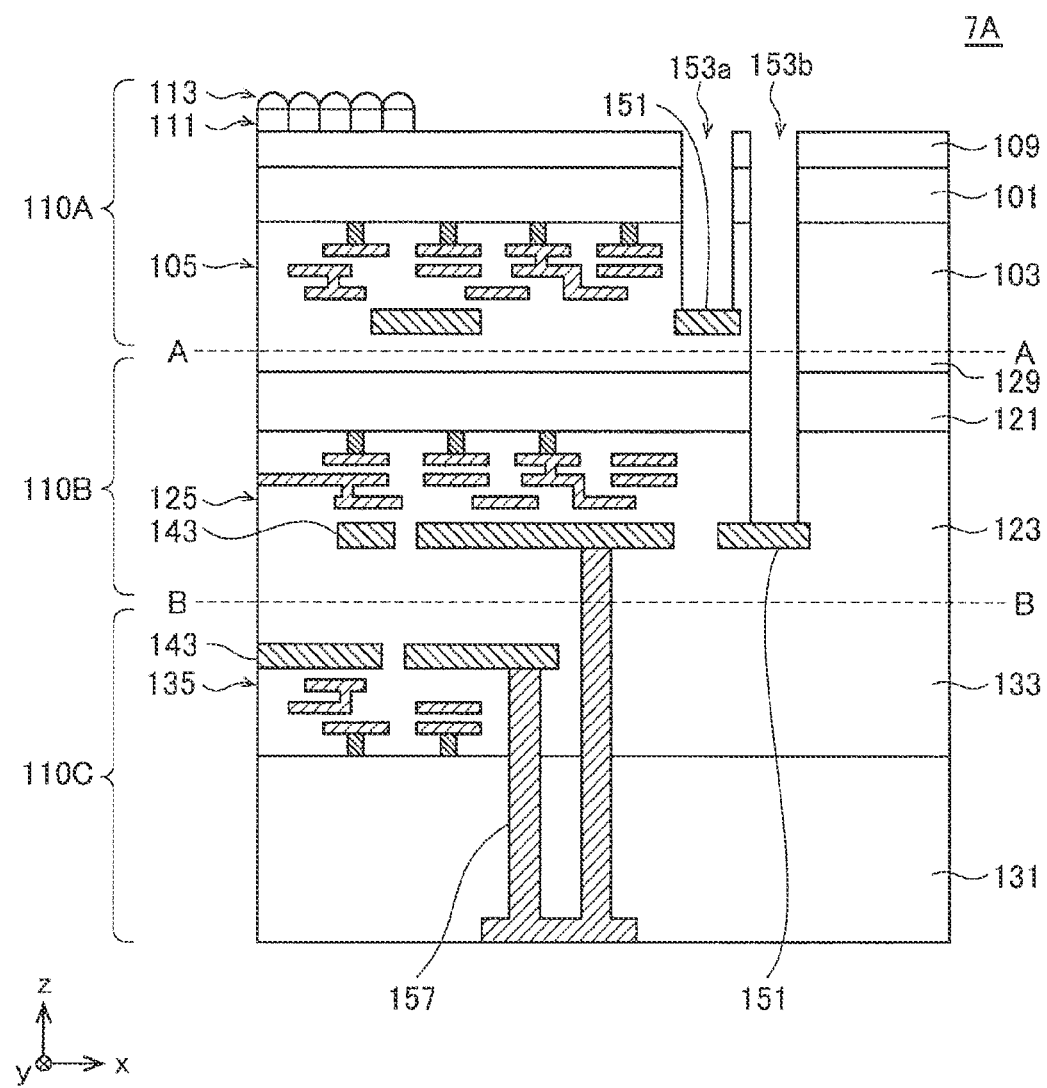

[FIG. 7B]
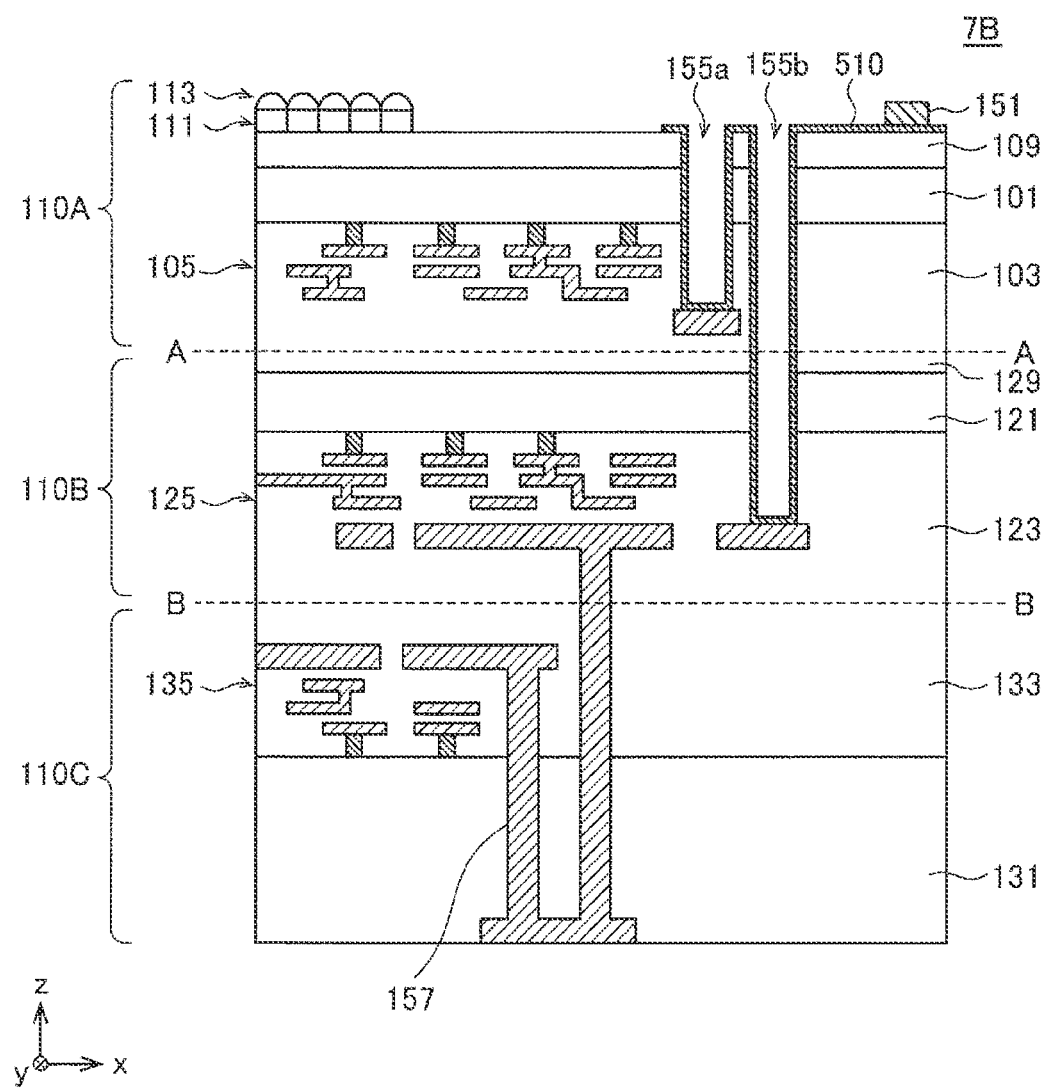

[FIG. 7C]
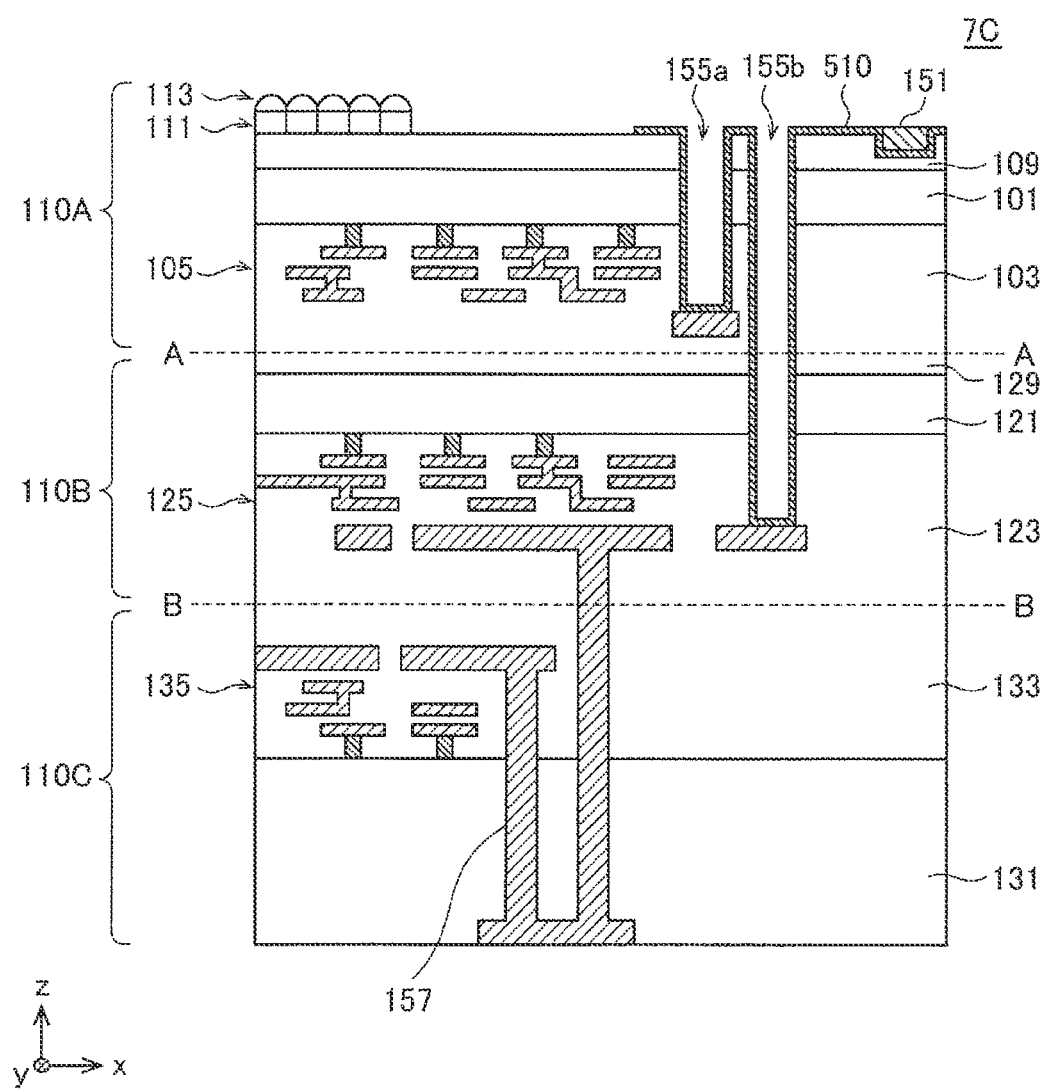

[FIG. 7D]
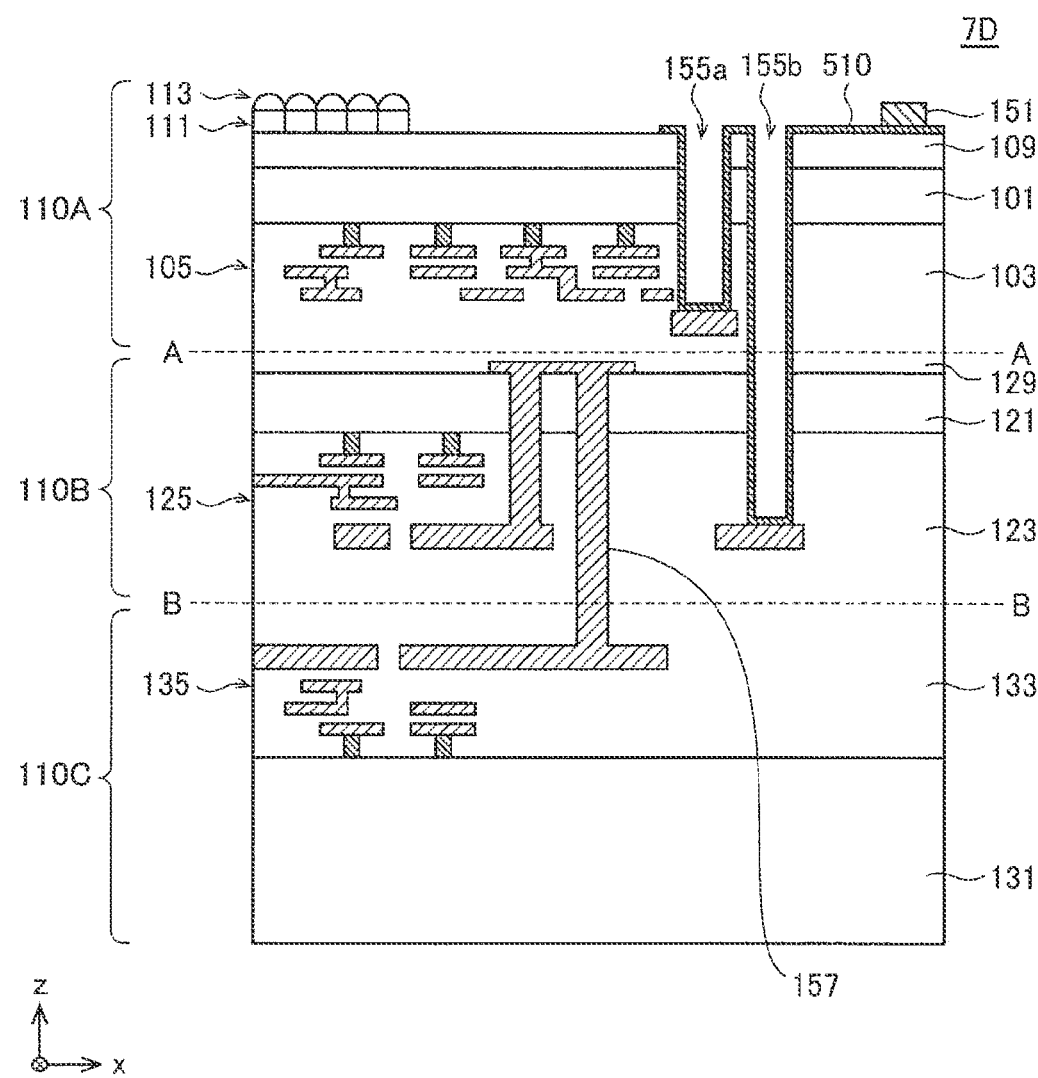

[FIG. 7E]
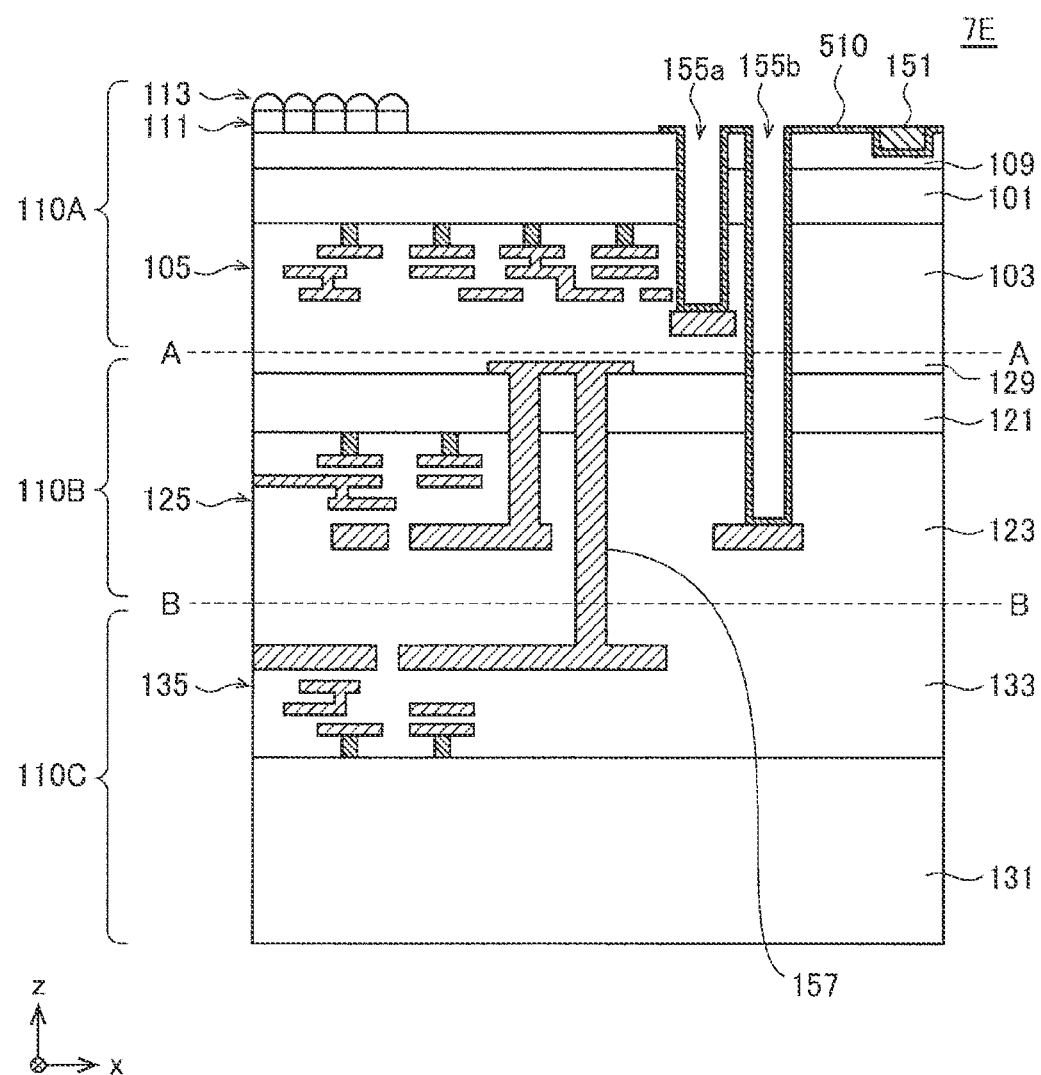

[FIG. 8A]
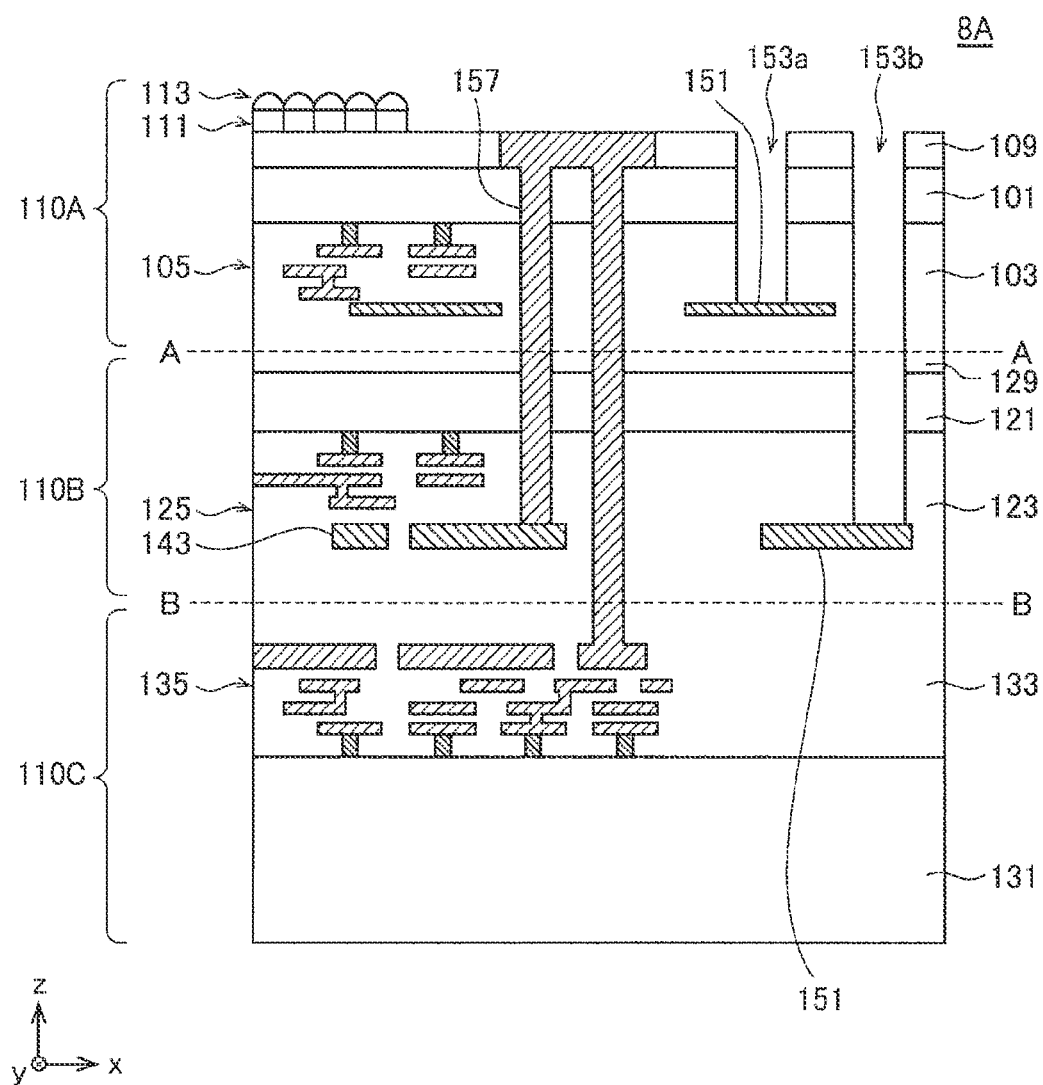

[FIG. 8B]
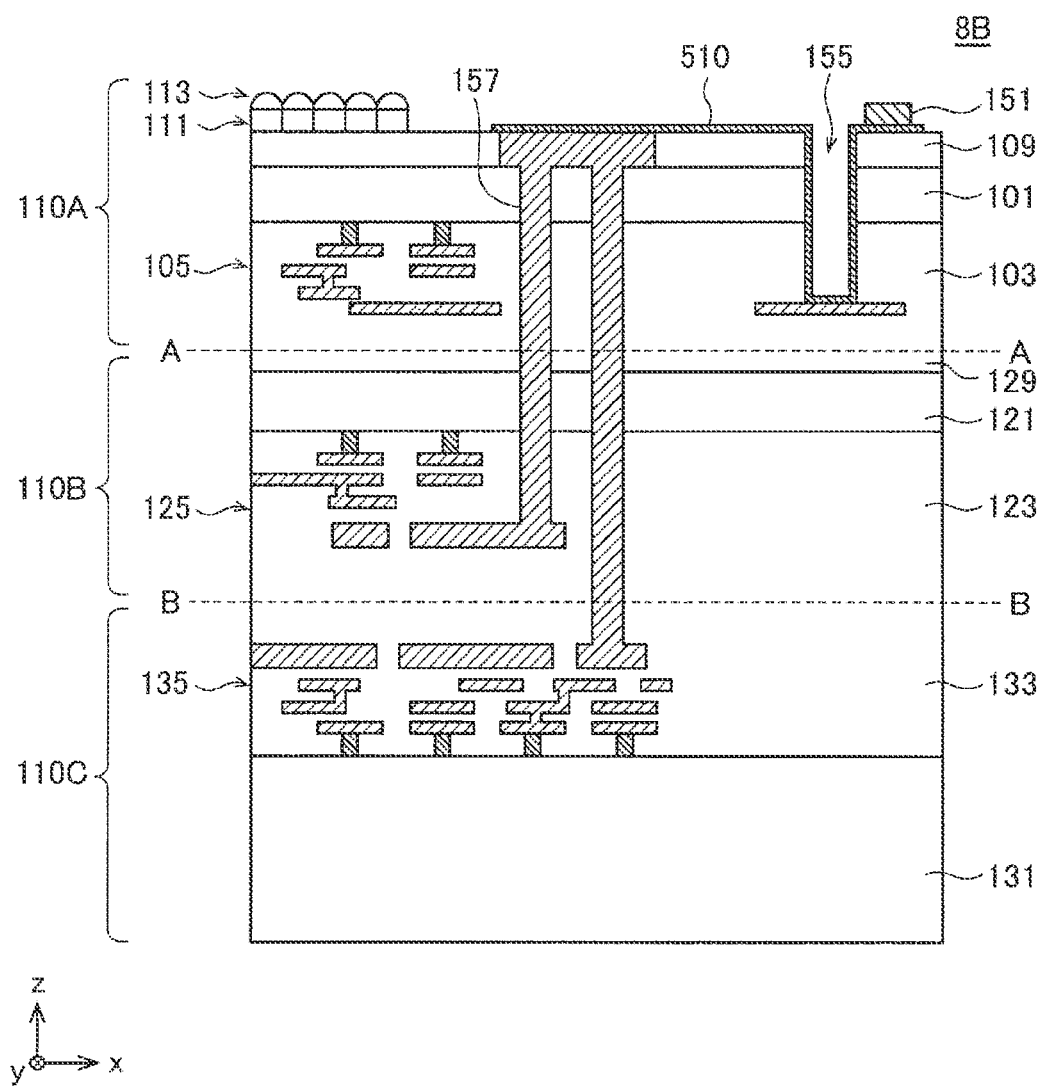

[FIG. 8C]
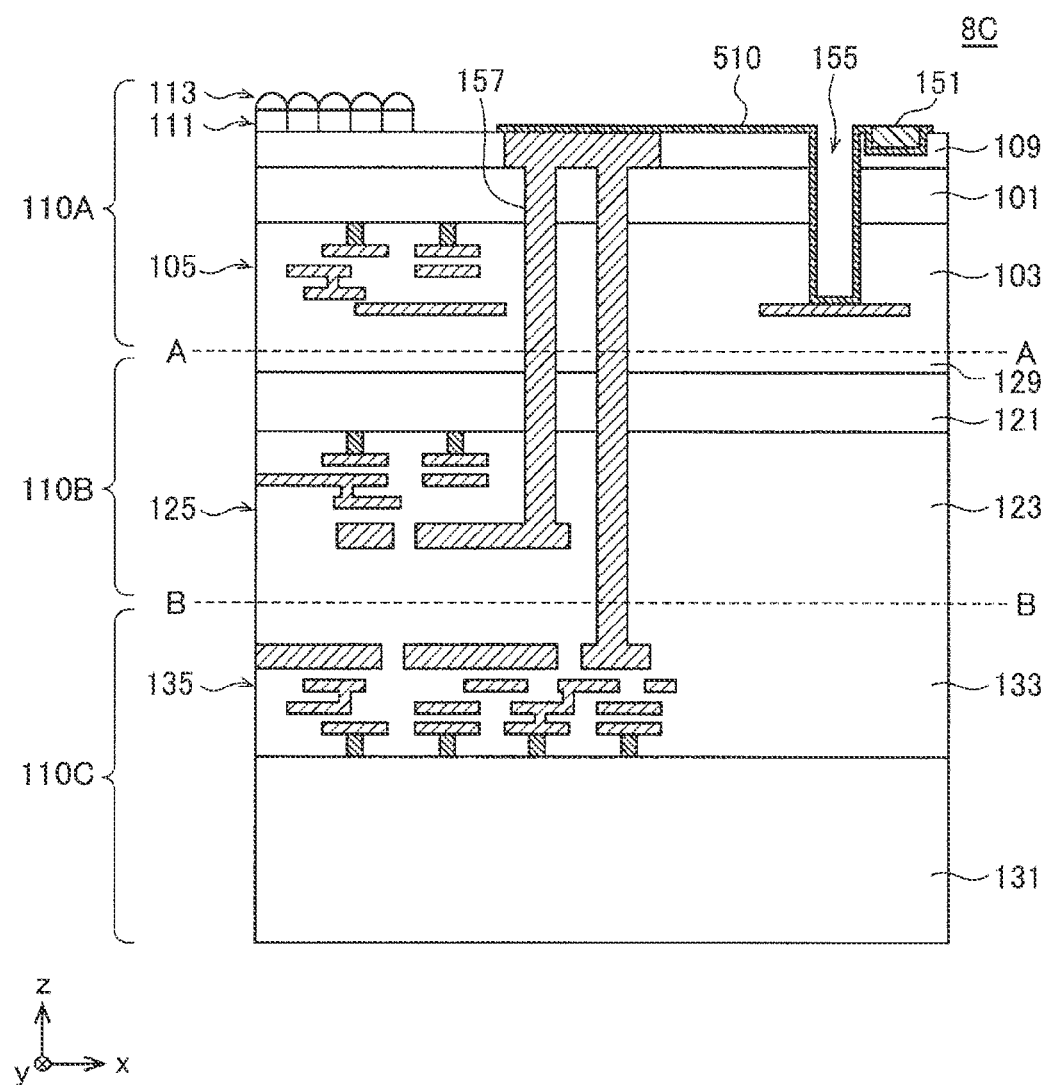

[FIG. 8D]
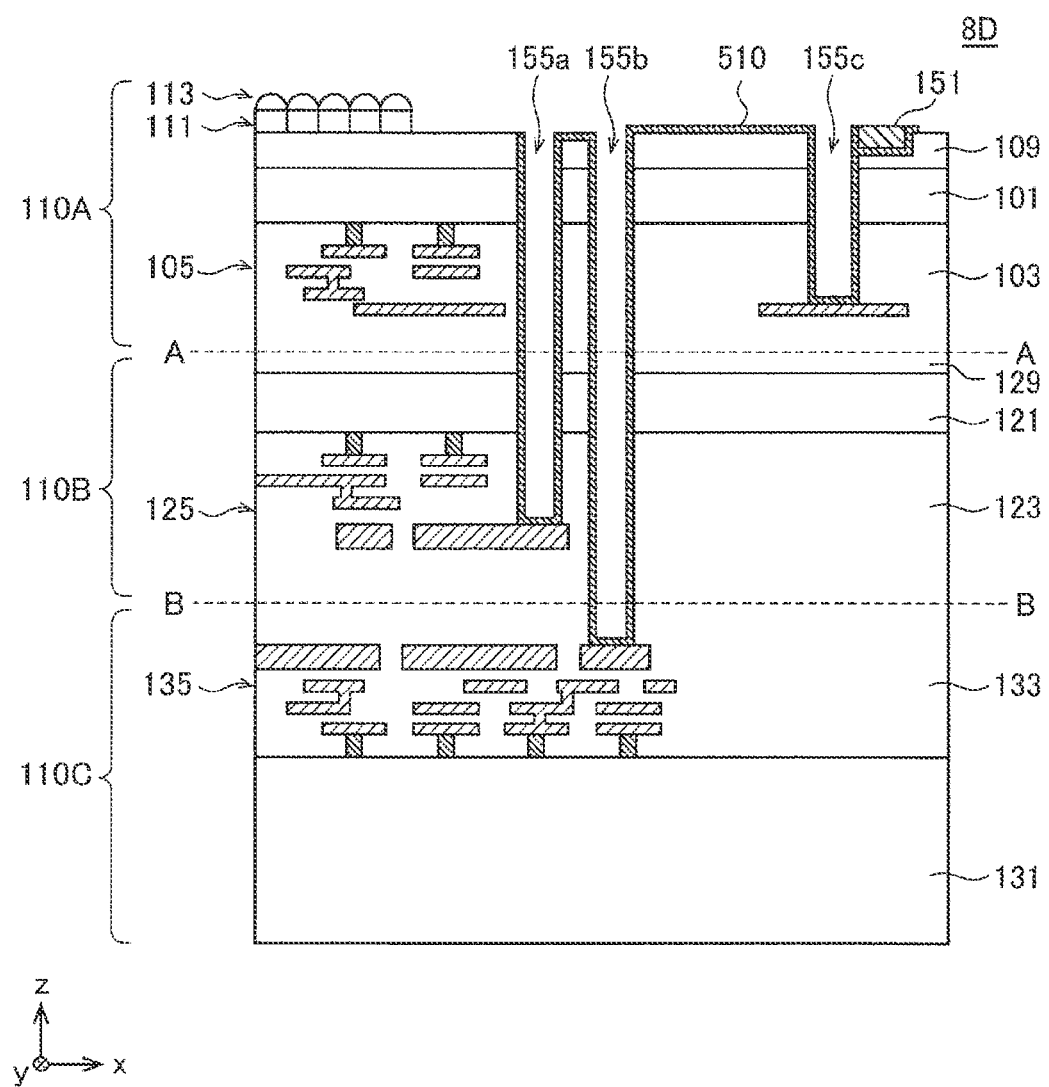

[FIG. 8E]
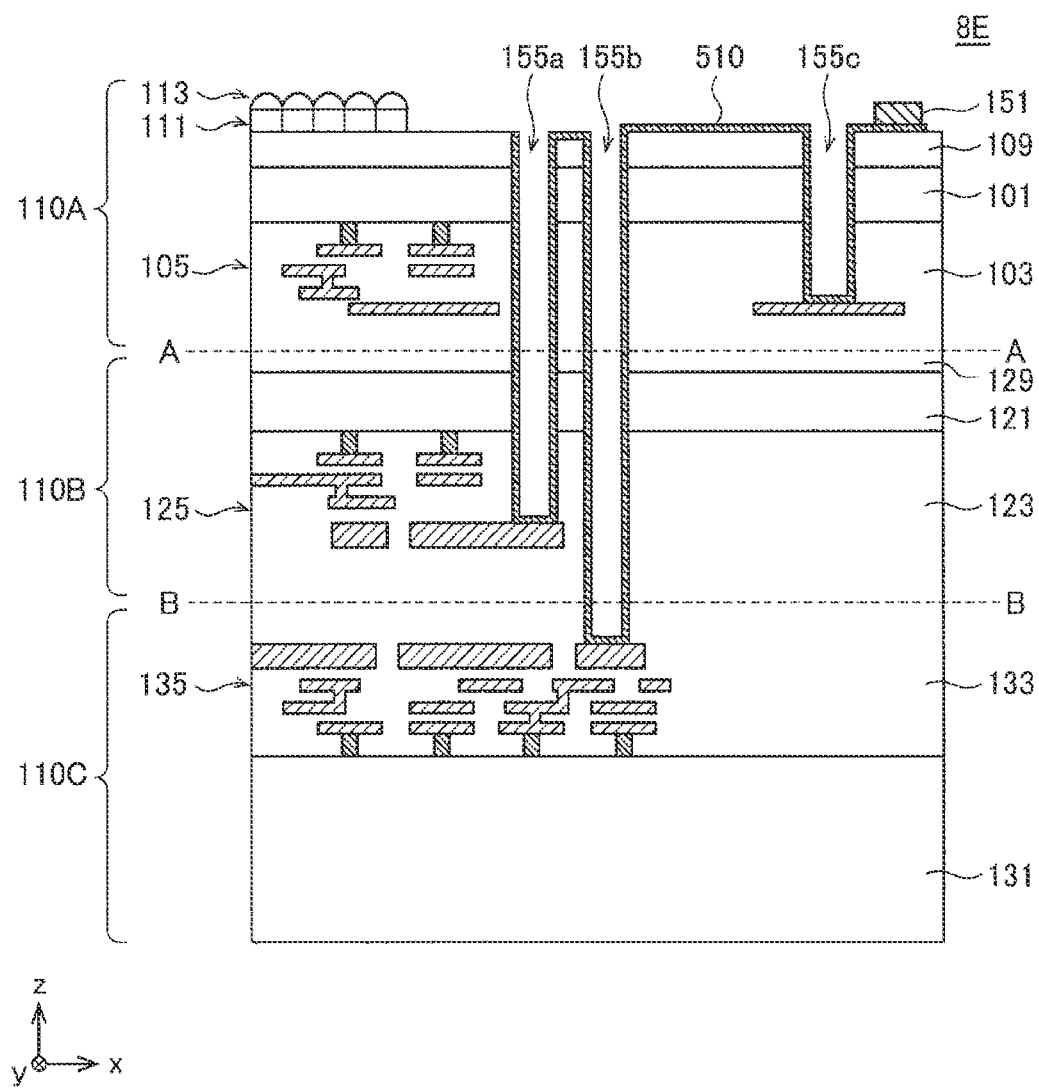

[FIG. 8F]
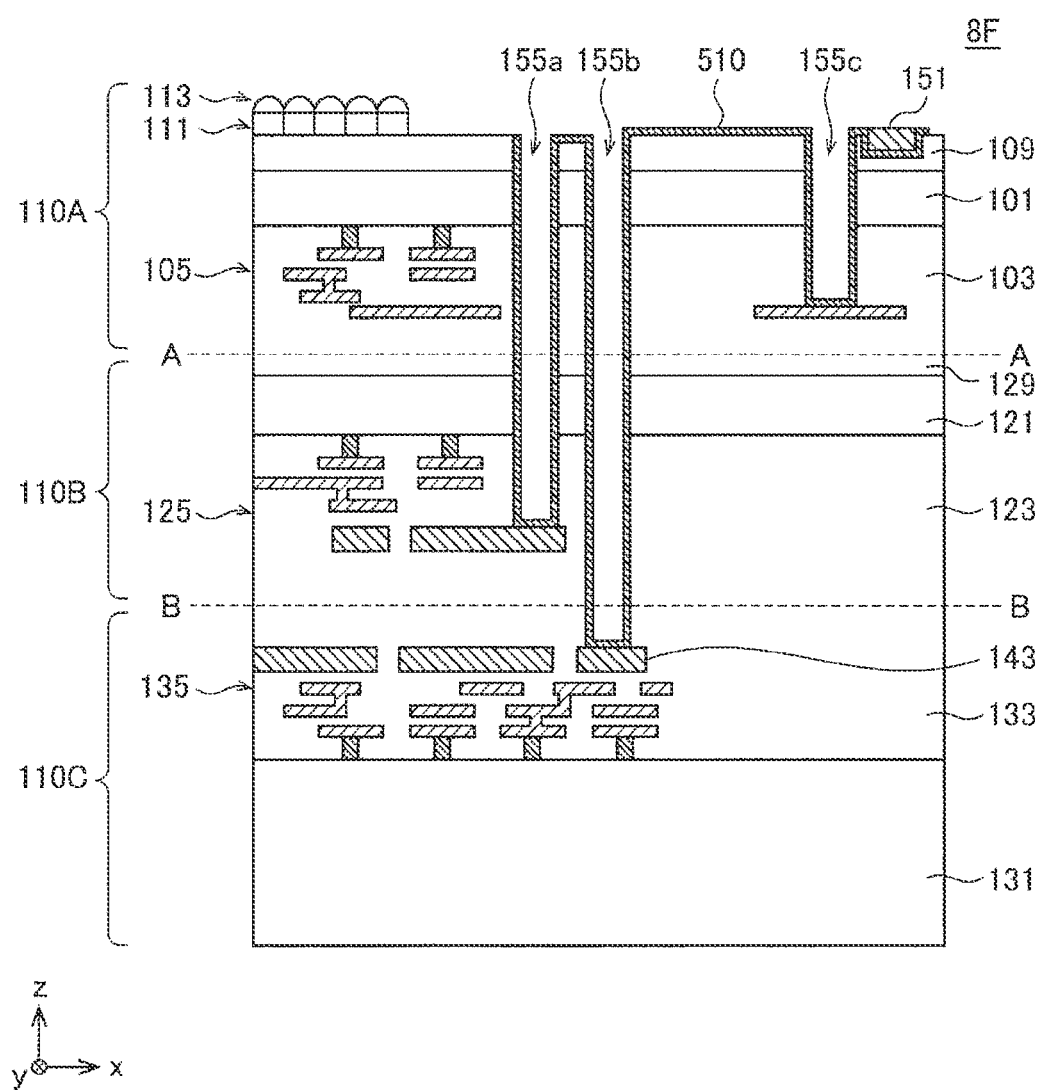

[FIG. 8G]
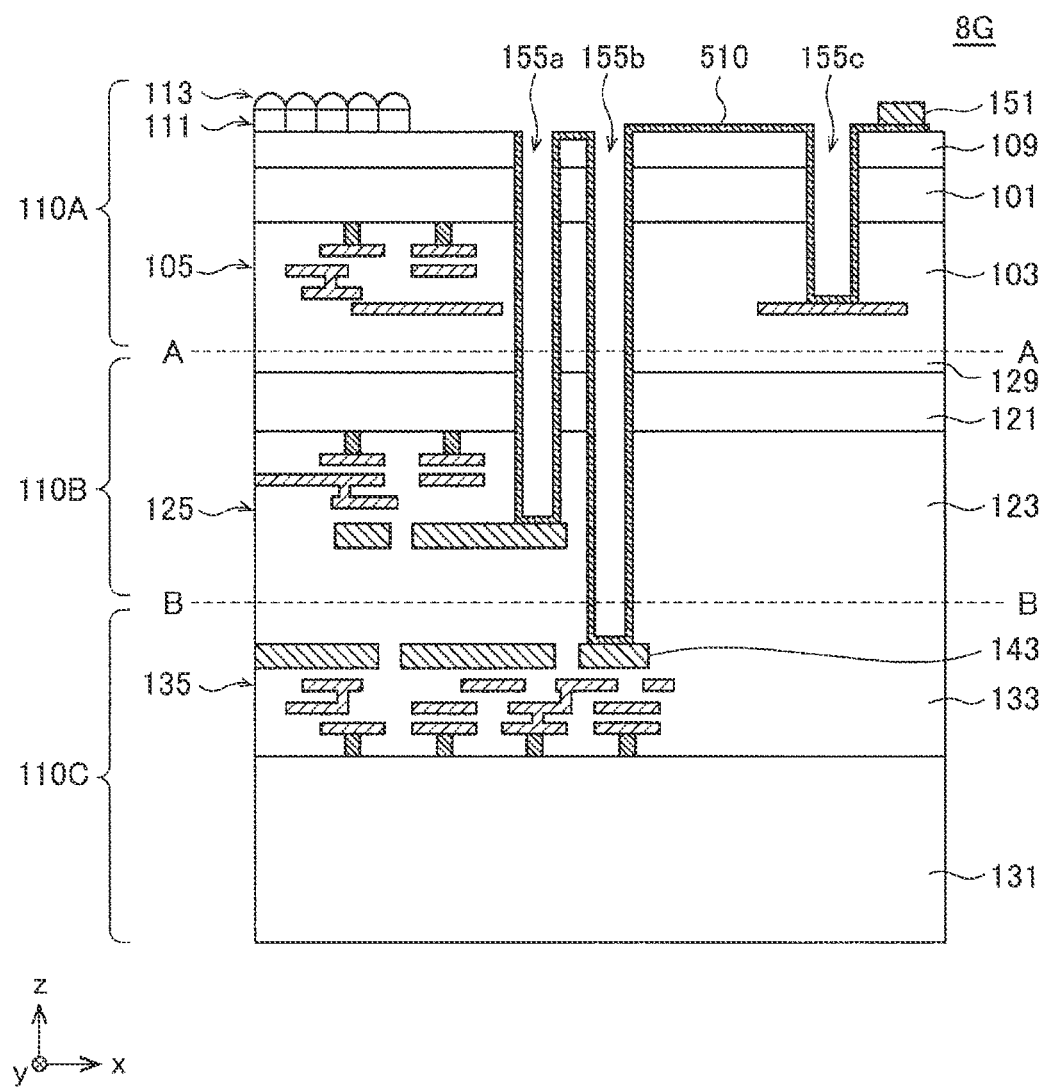

[FIG. 9A]
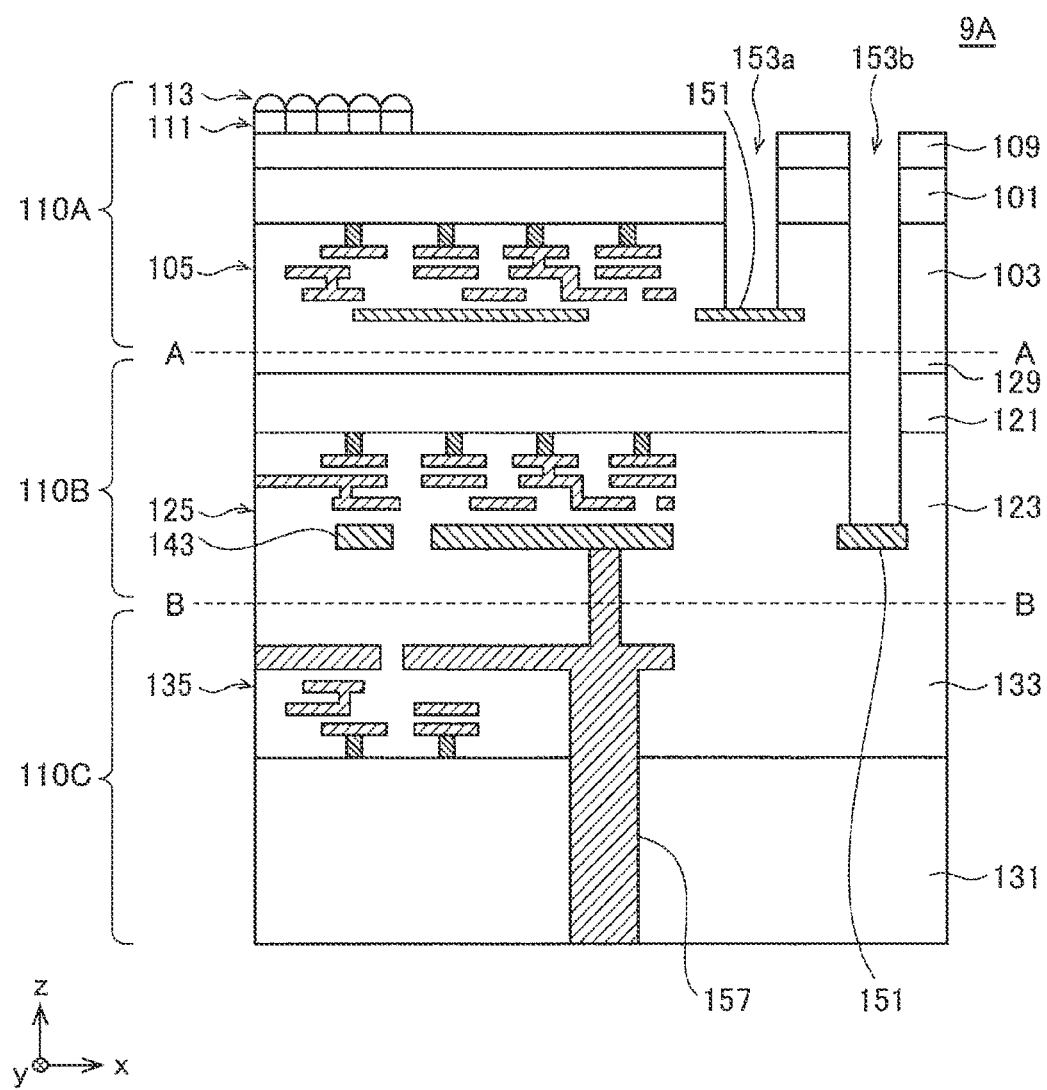

[FIG. 9B]
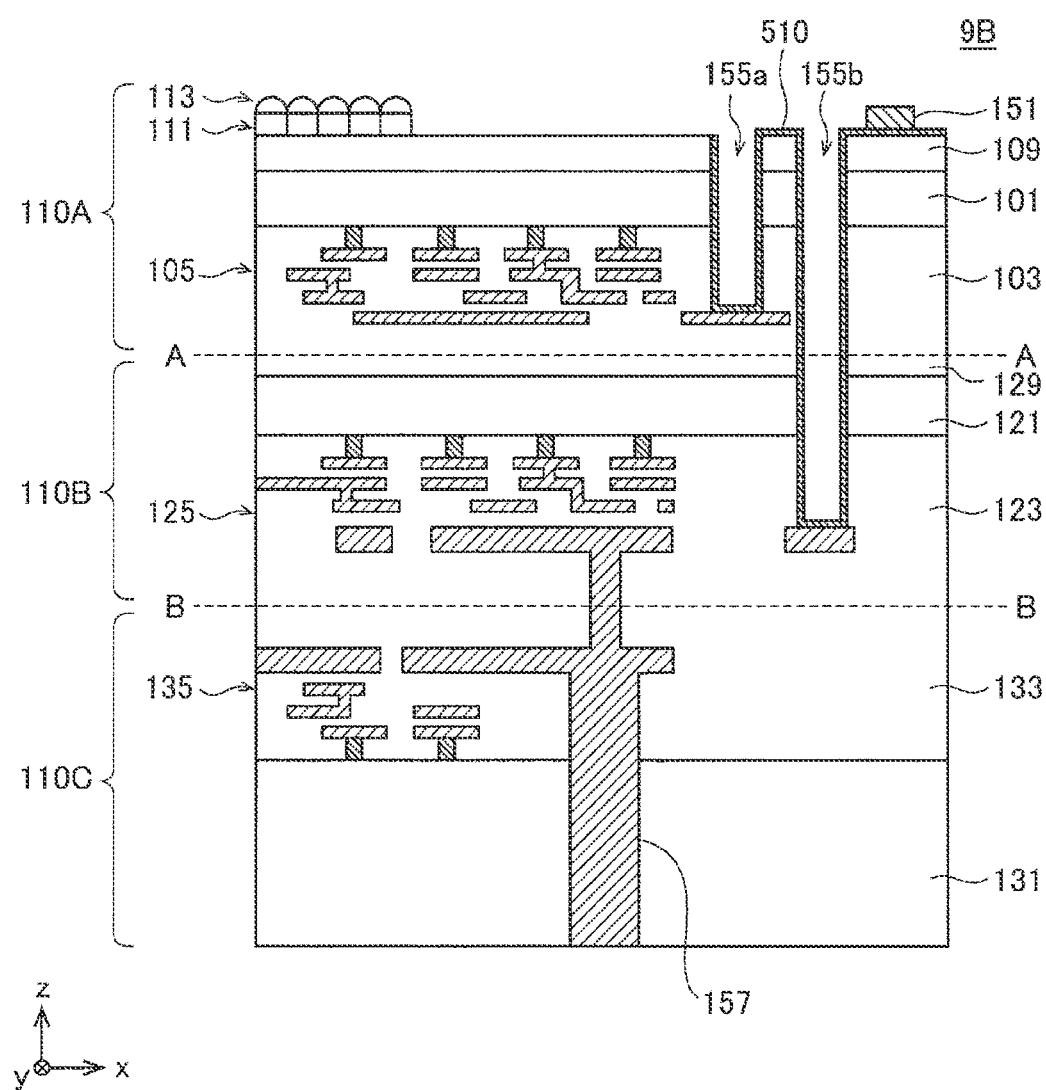

[FIG. 9C]
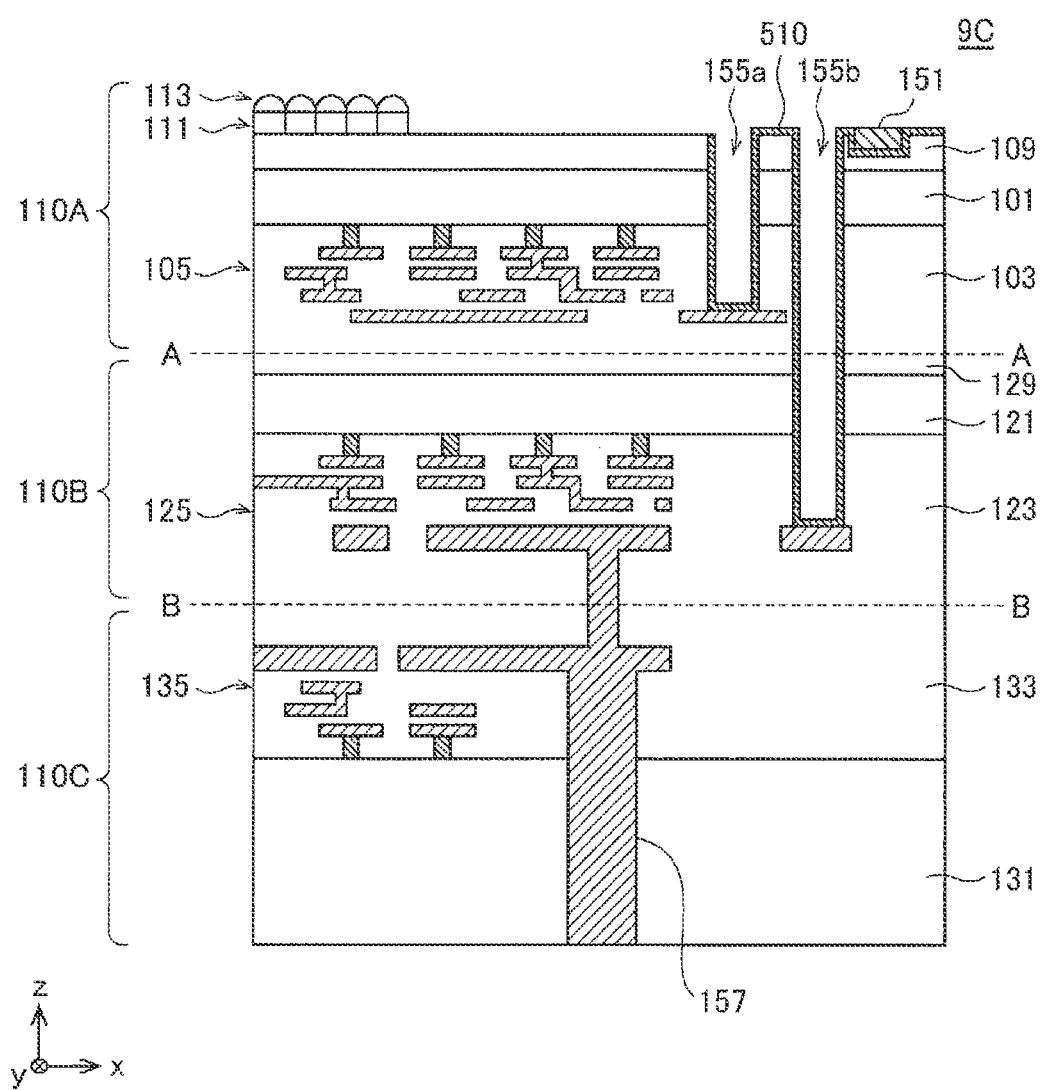

[FIG. 9D]
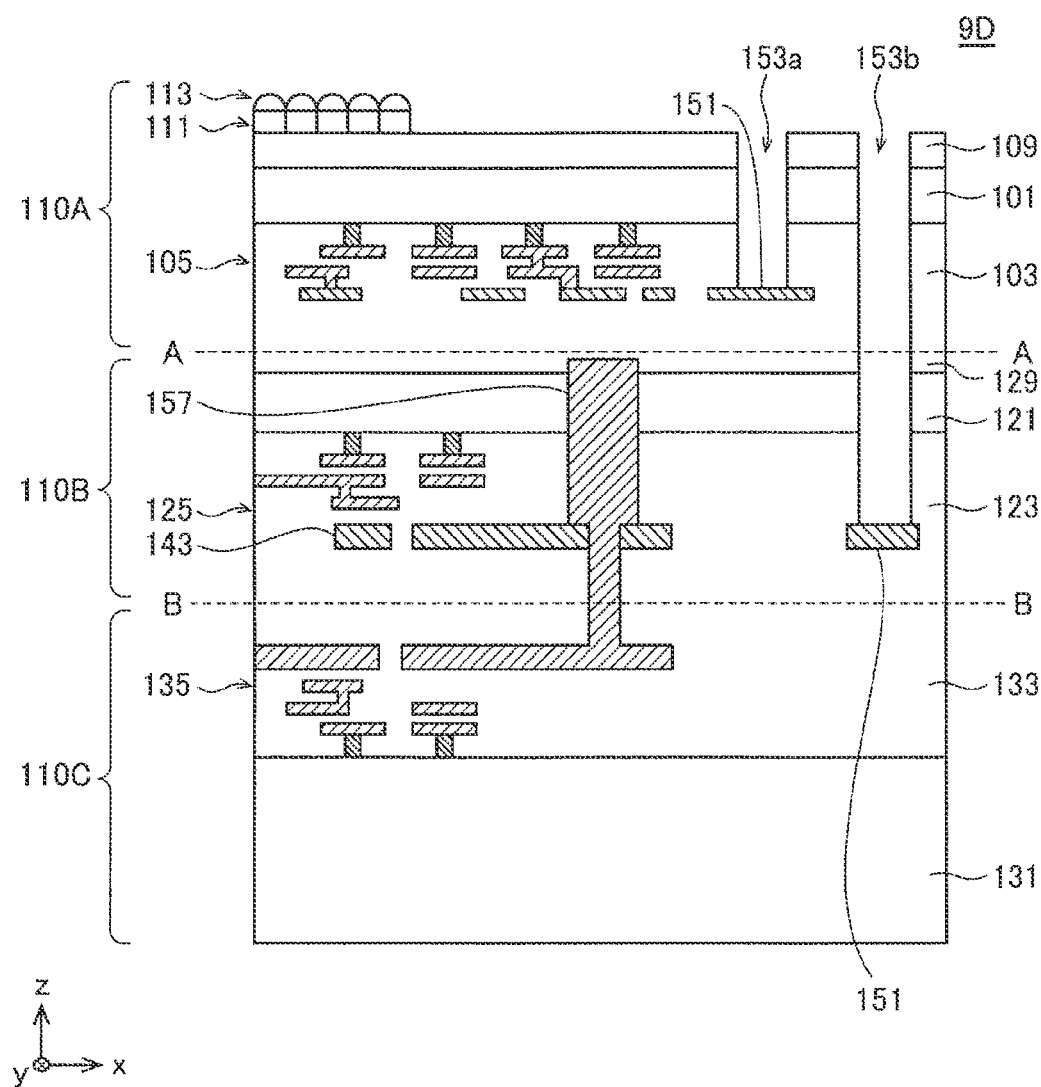

[FIG. 9E]
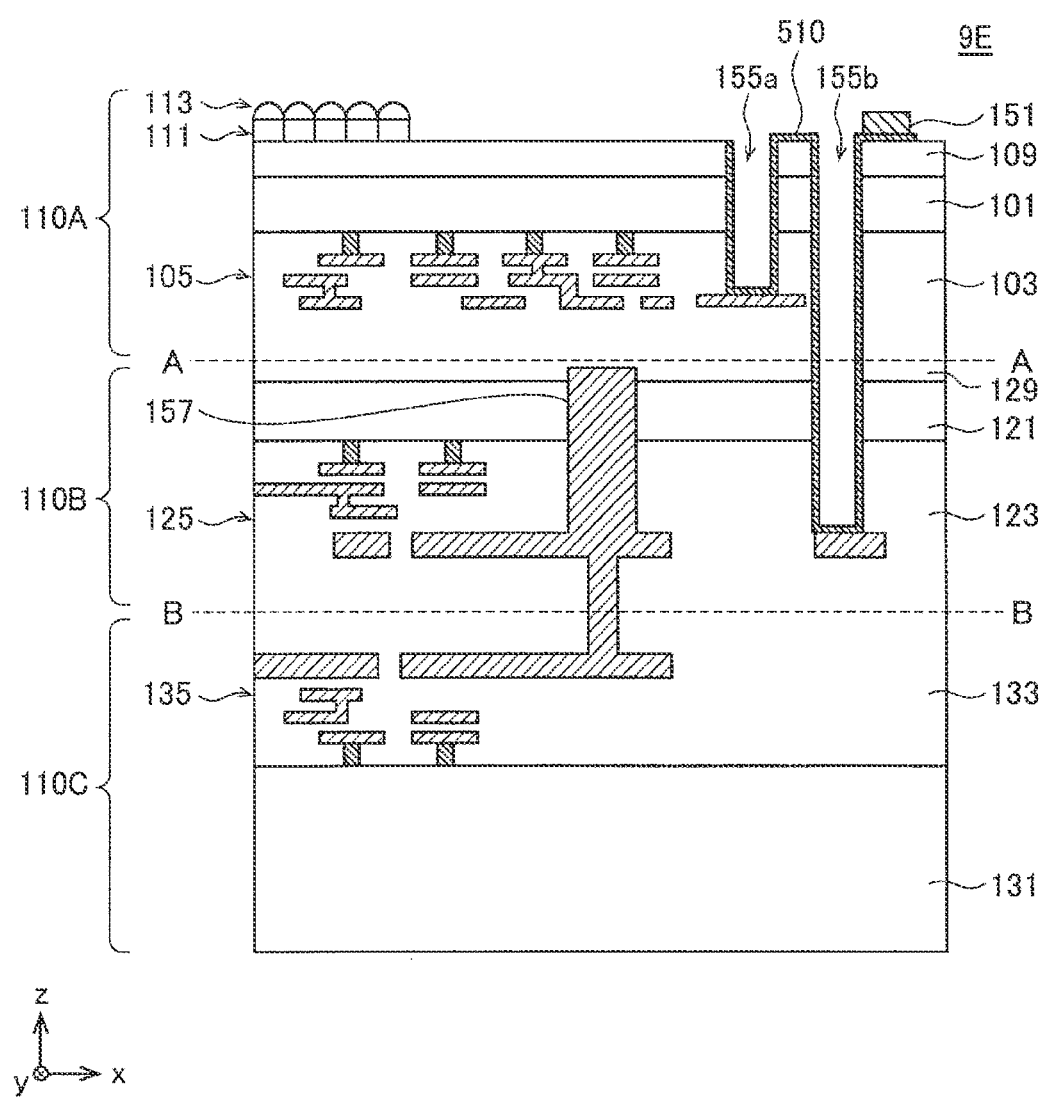

[FIG. 9F]
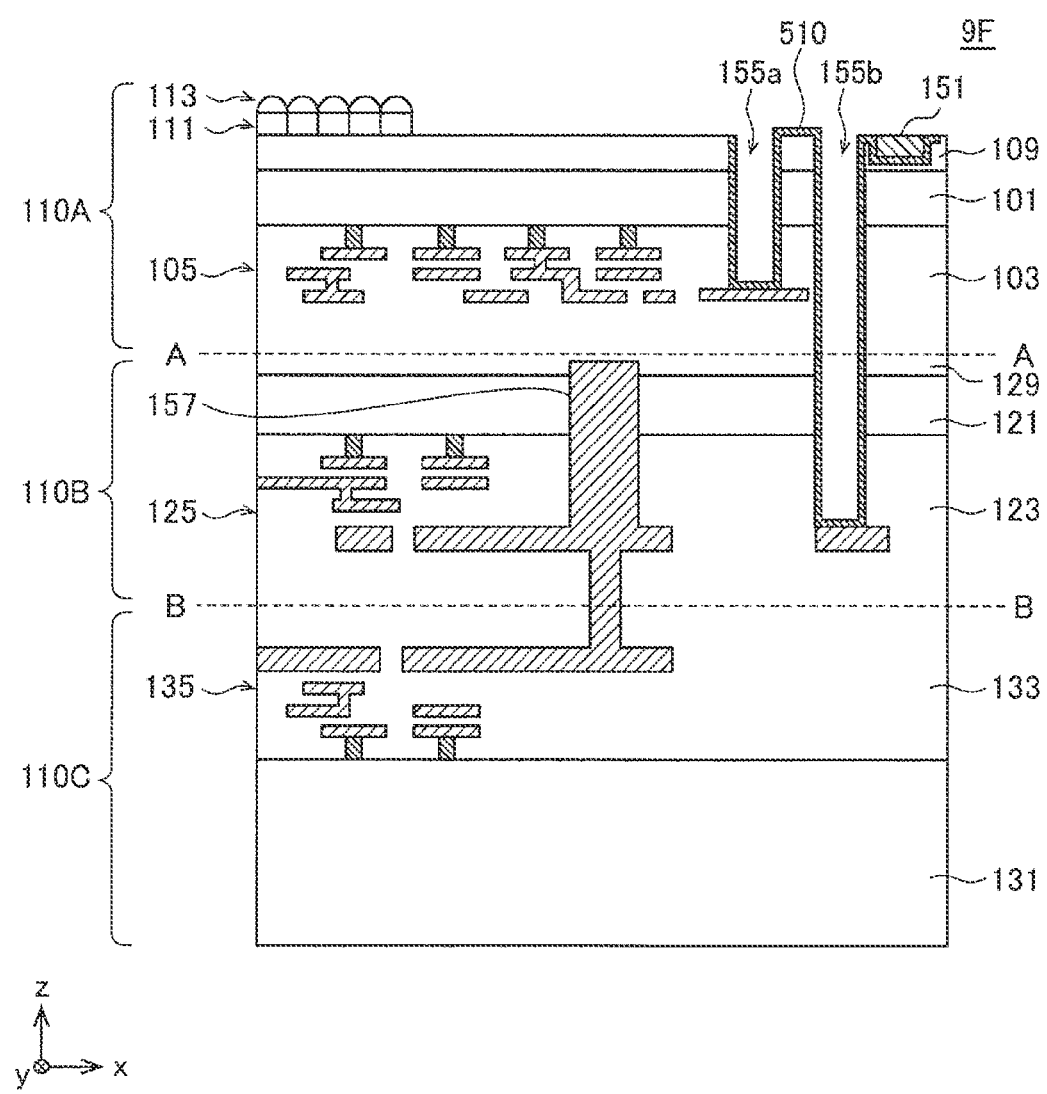

[FIG. 10A]
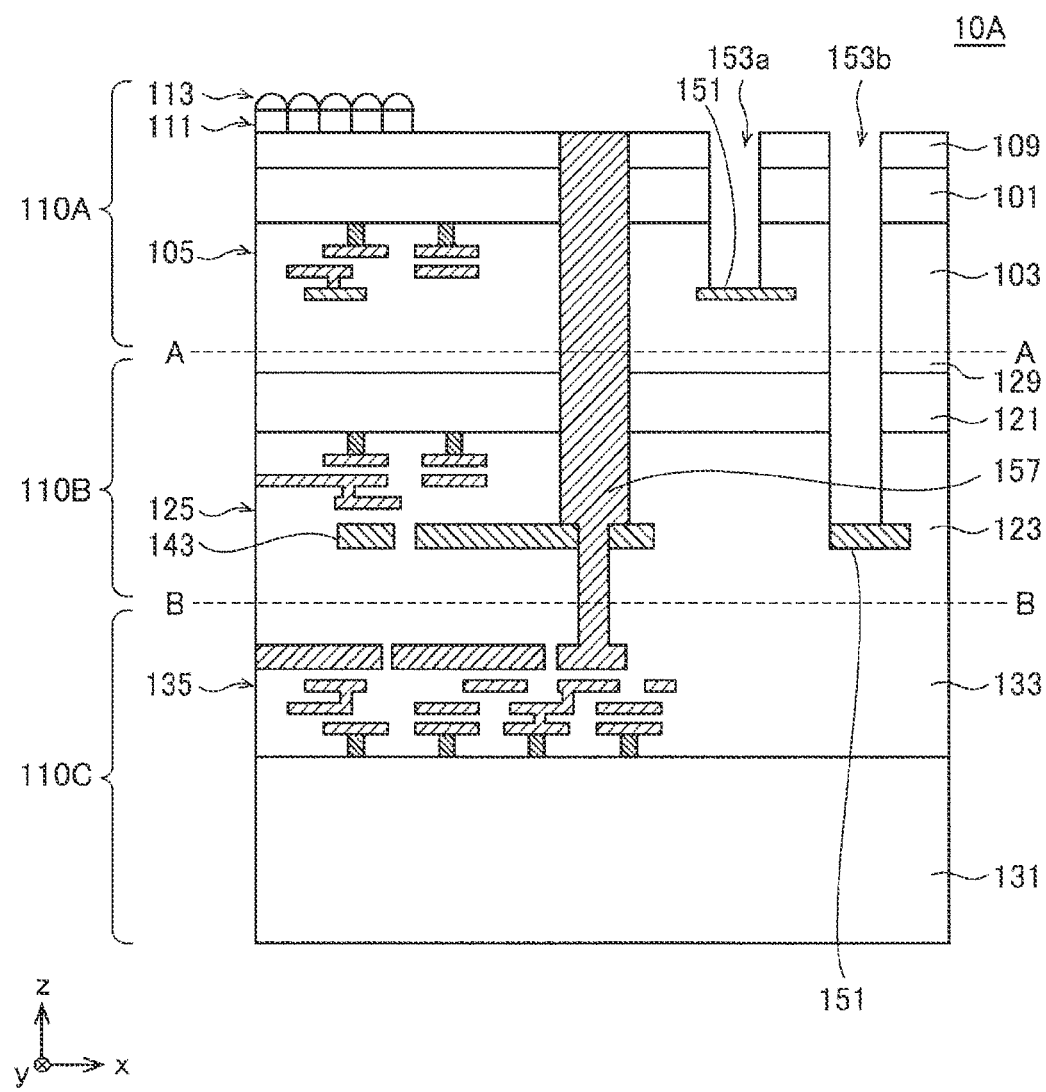

[ FIG. 10B ]
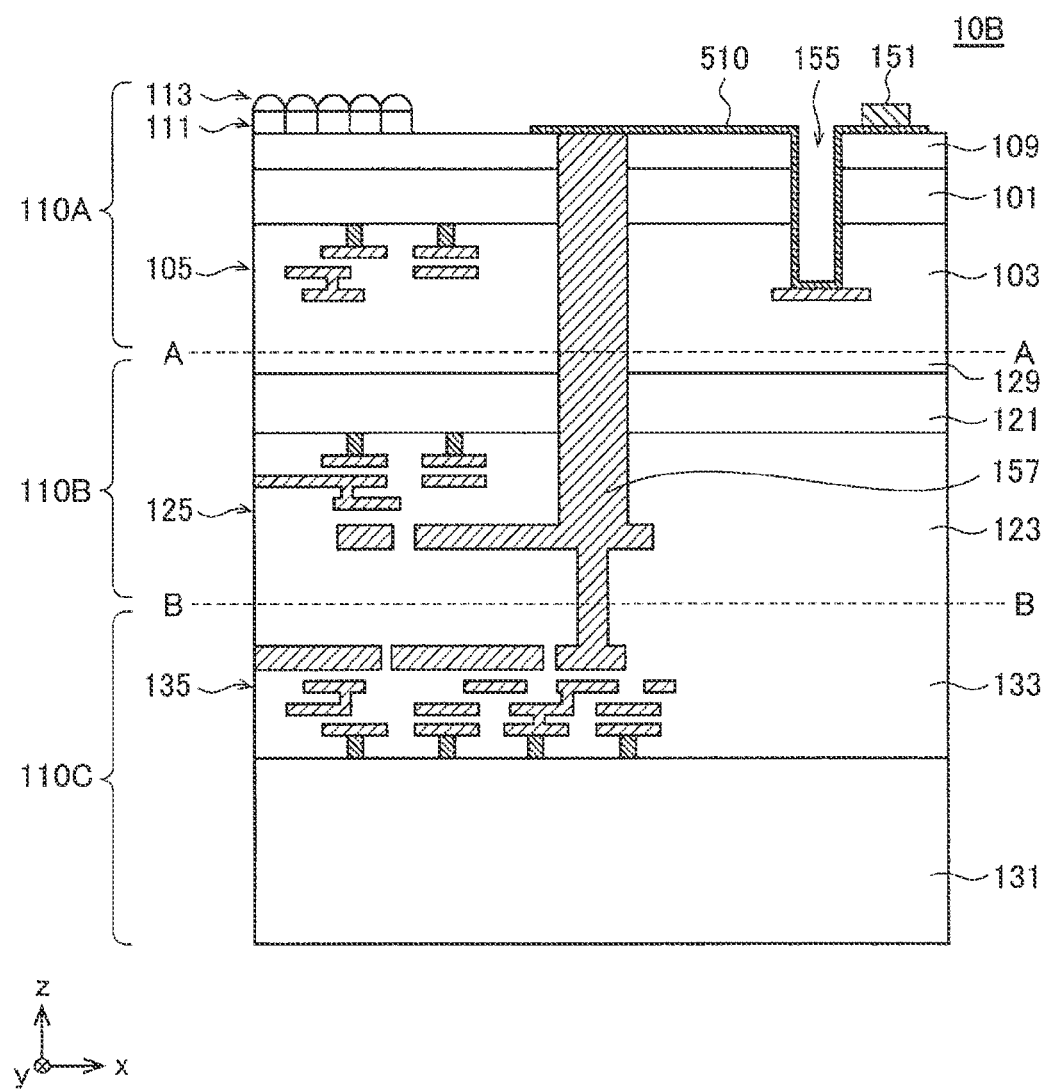

[FIG. 10C]
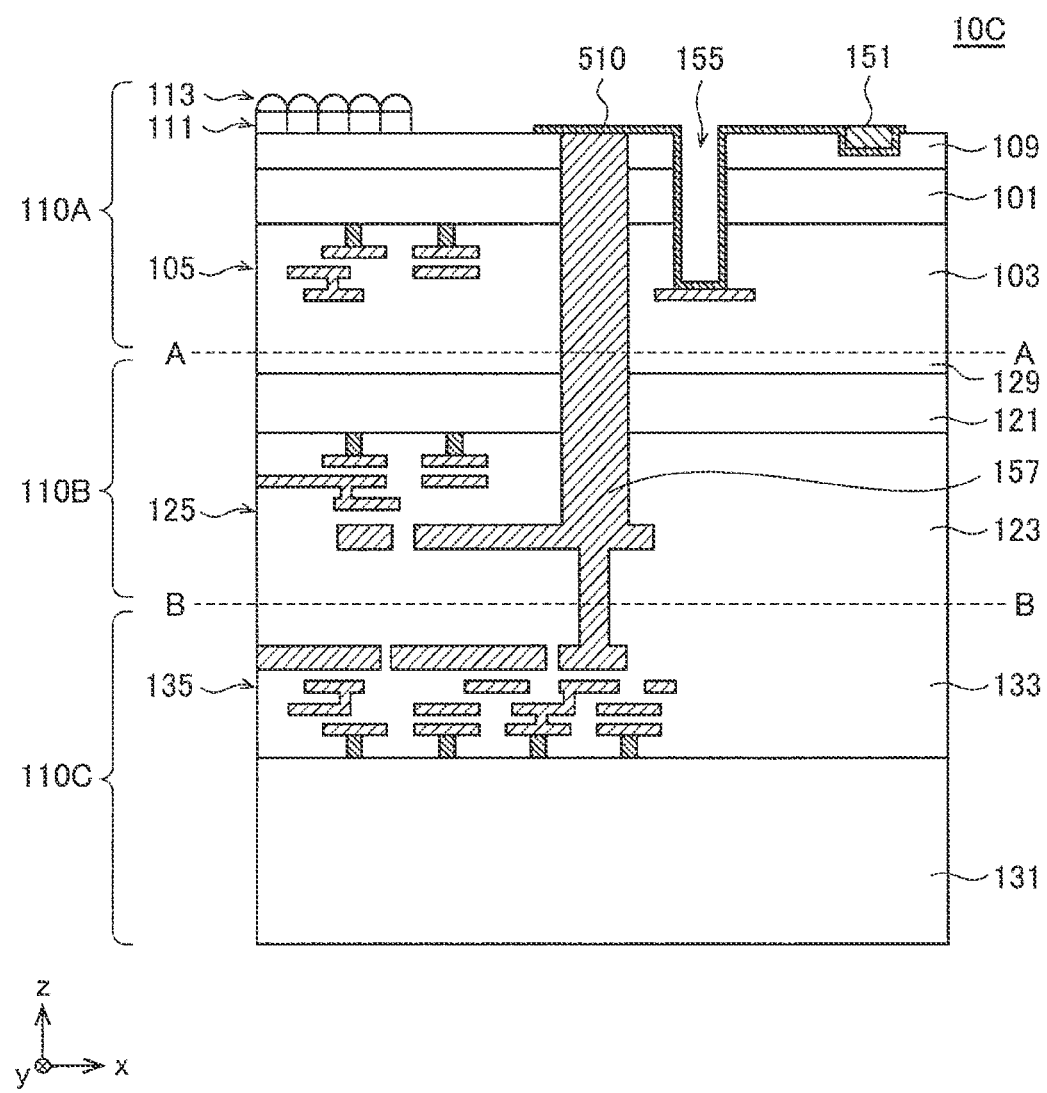

[FIG. 10D]
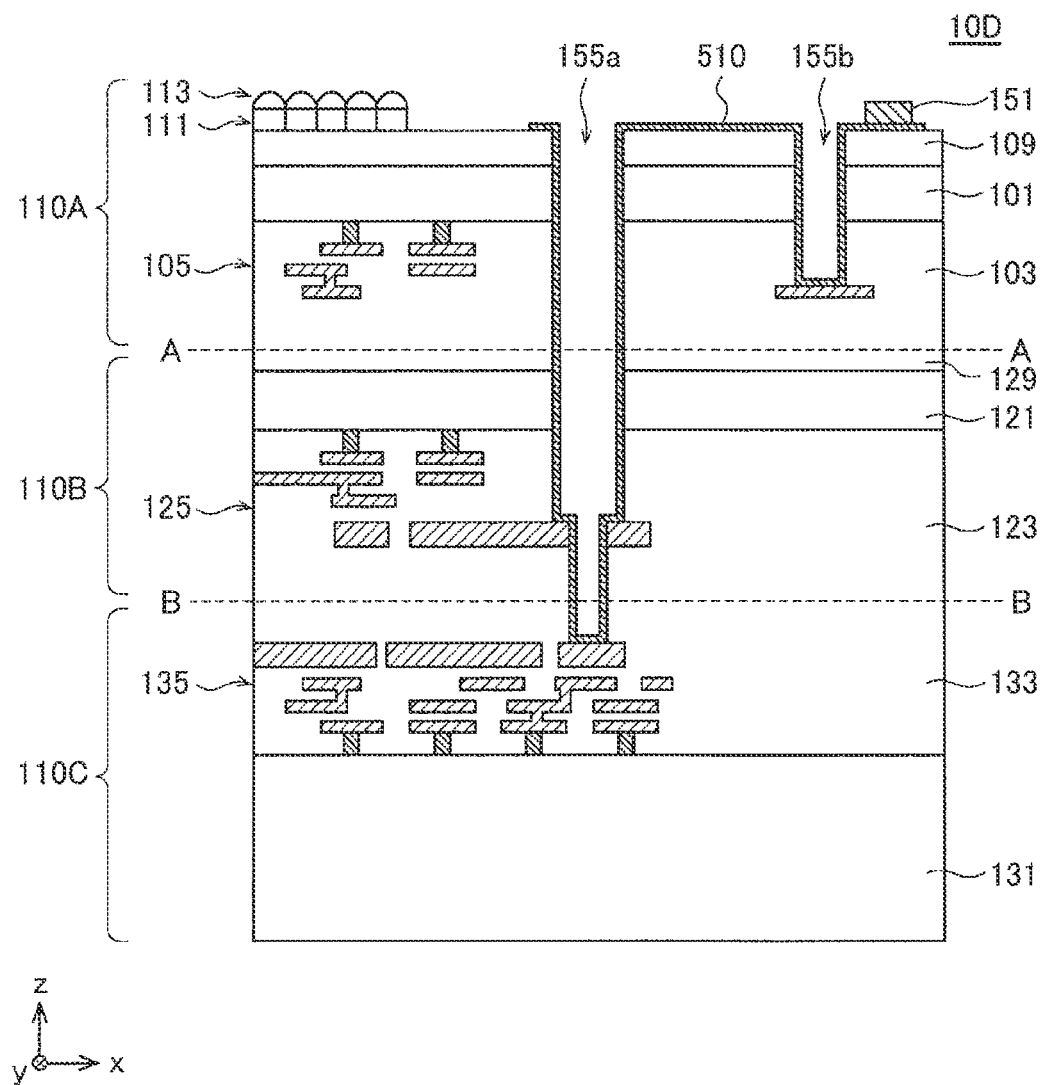

[FIG. 10E]
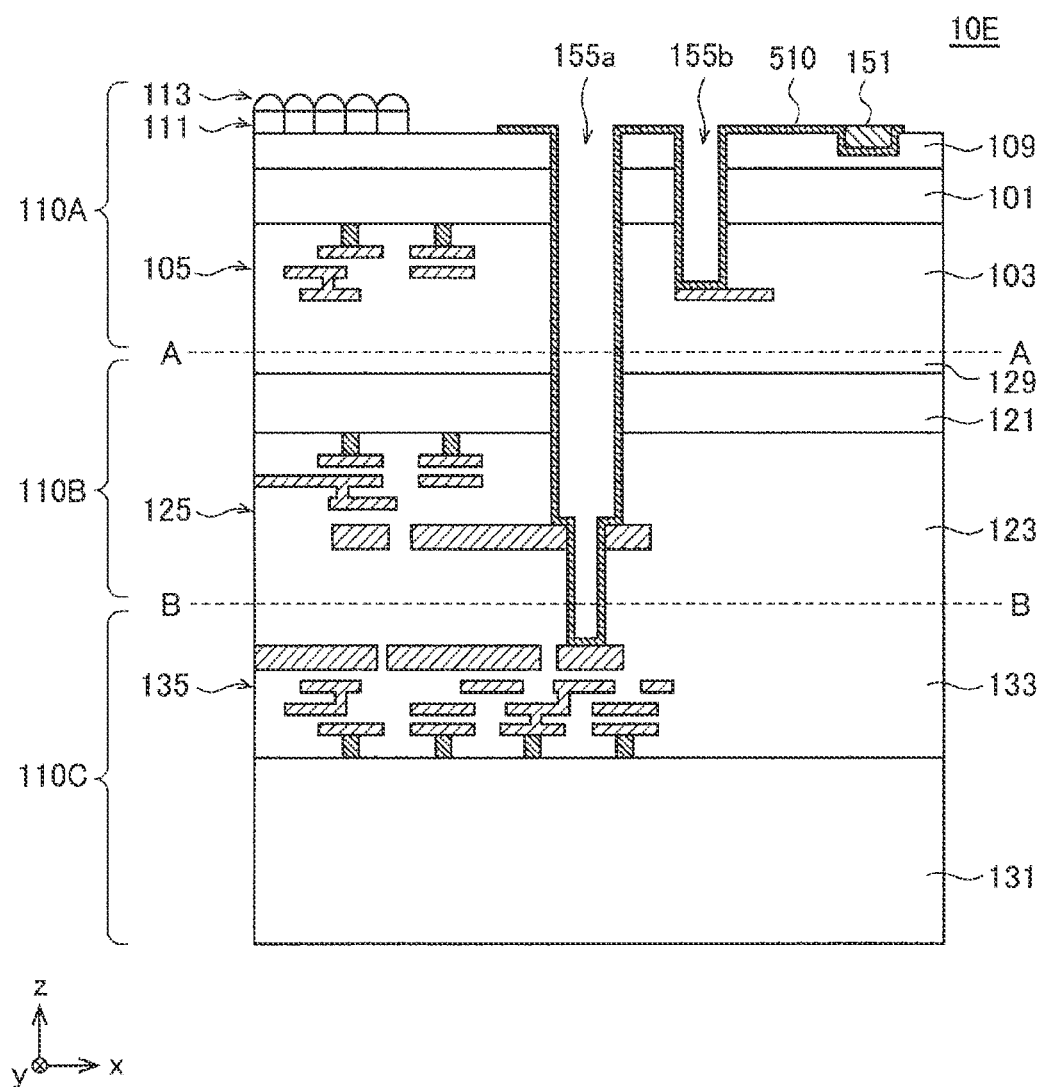

[FIG. 11A]
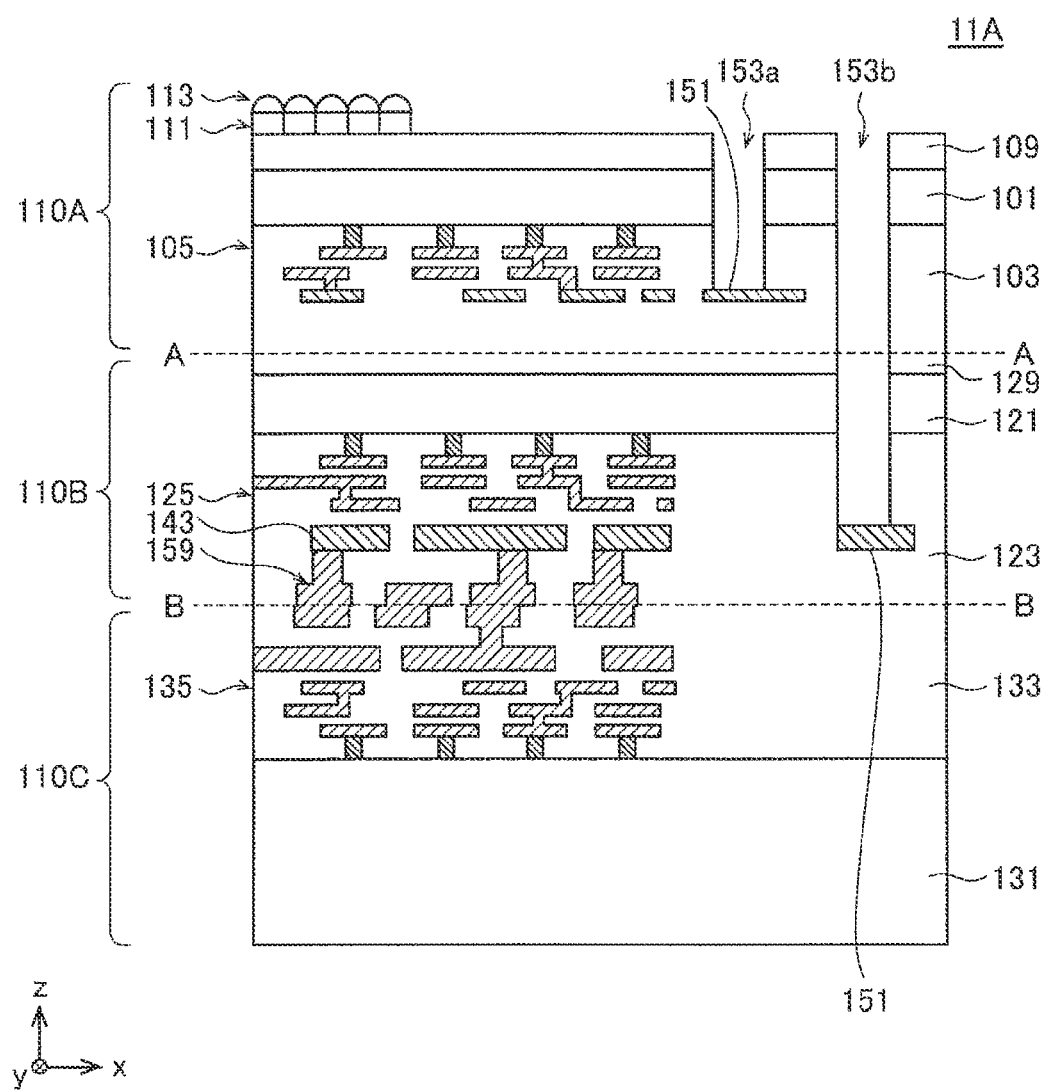

[FIG. 11B]
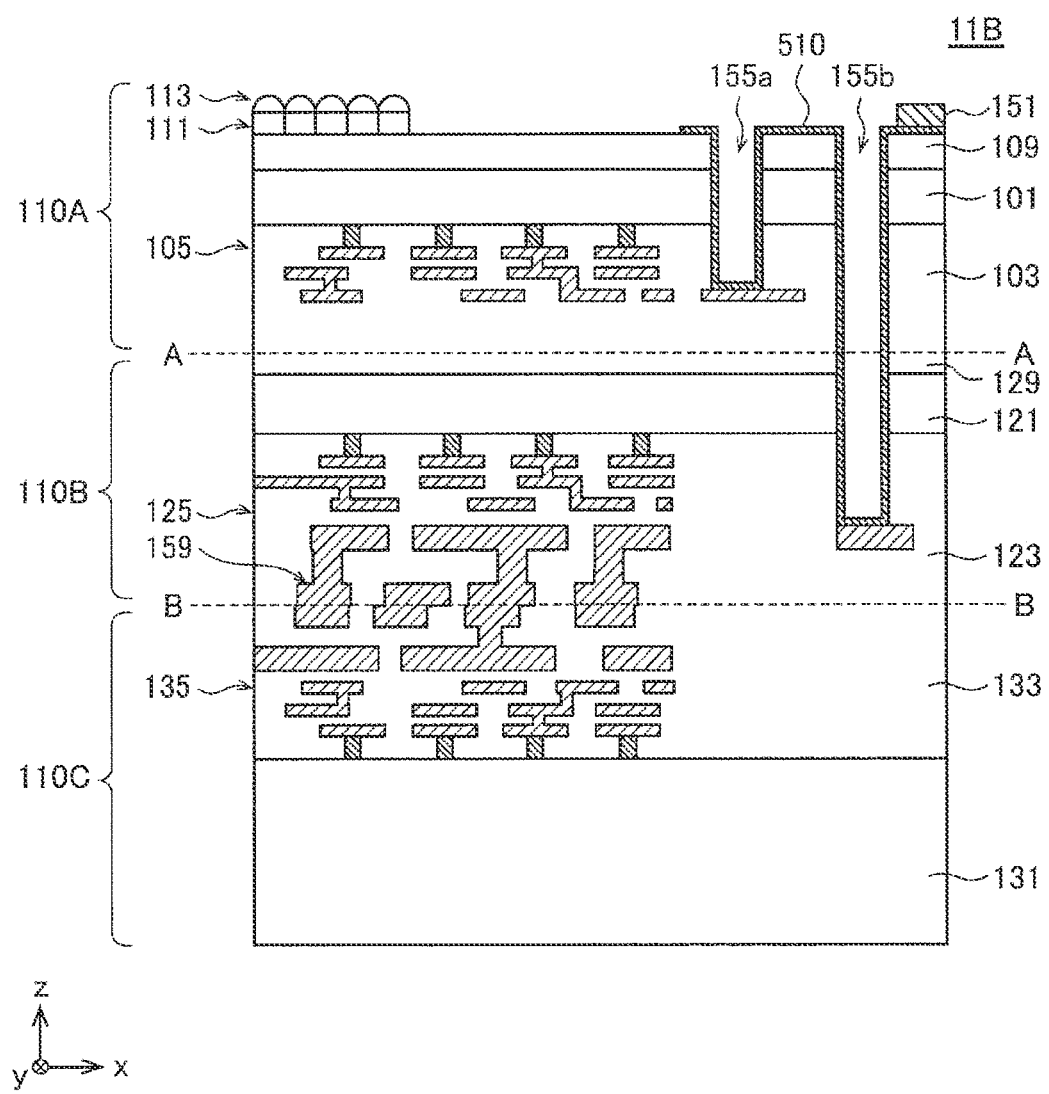

[FIG. 11C]
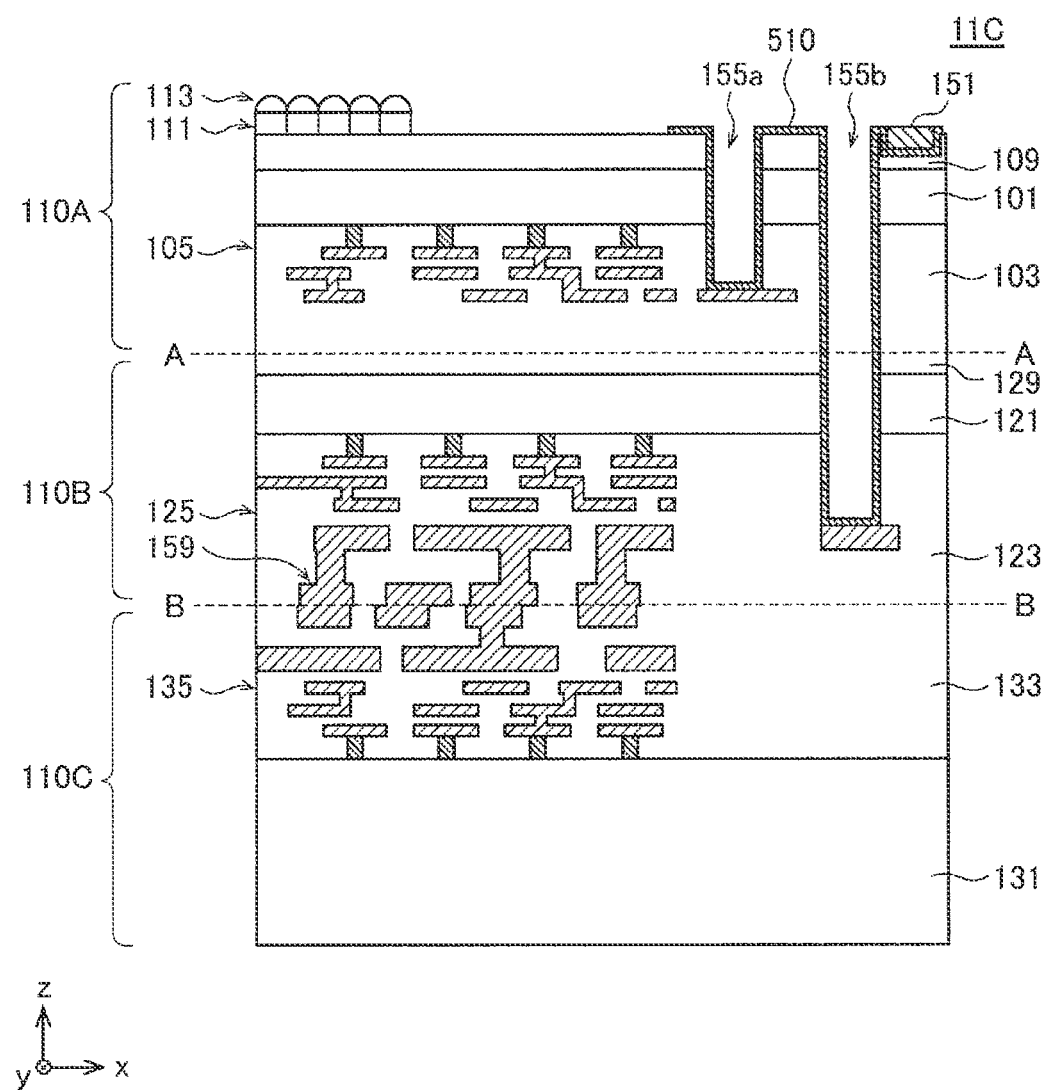

[FIG. 12A]
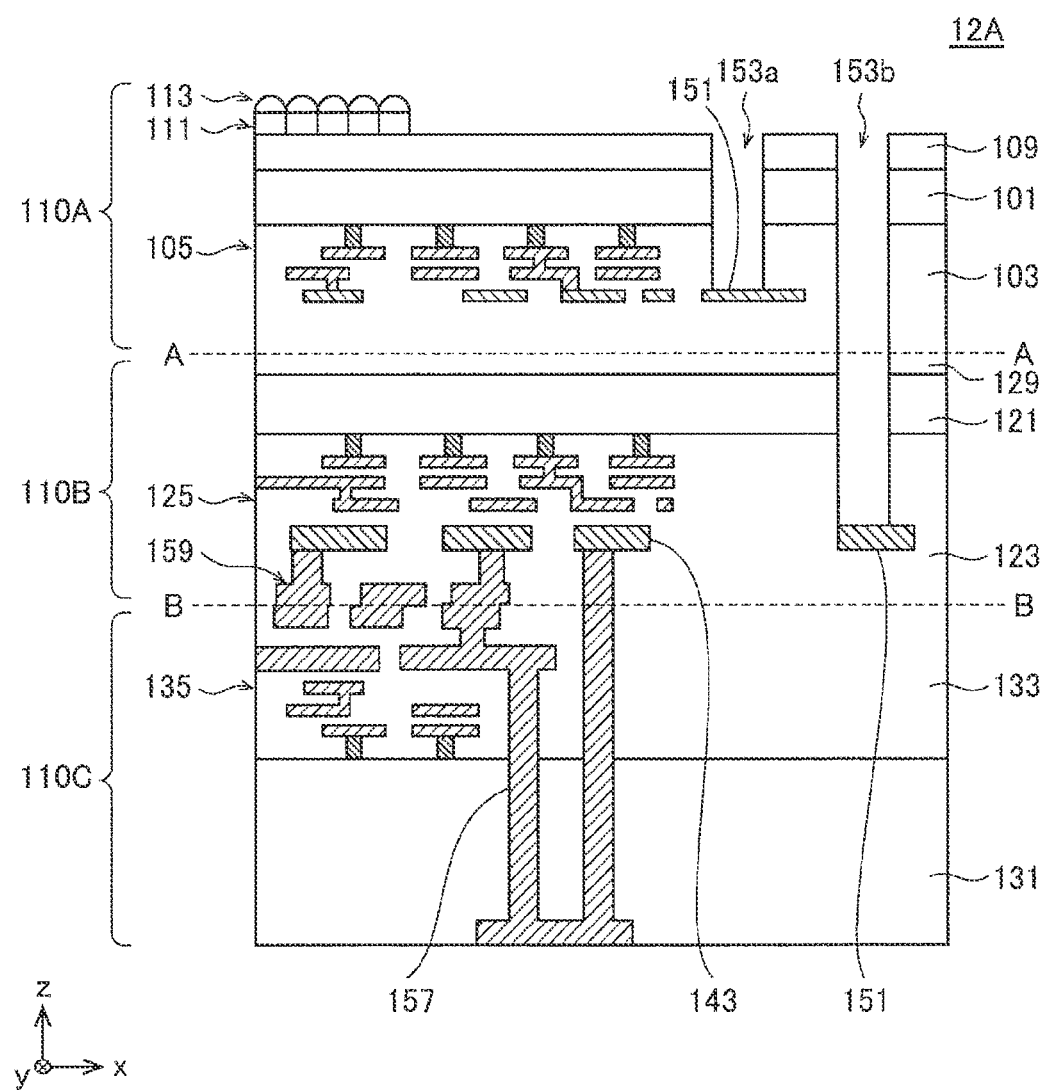

[FIG. 12B]
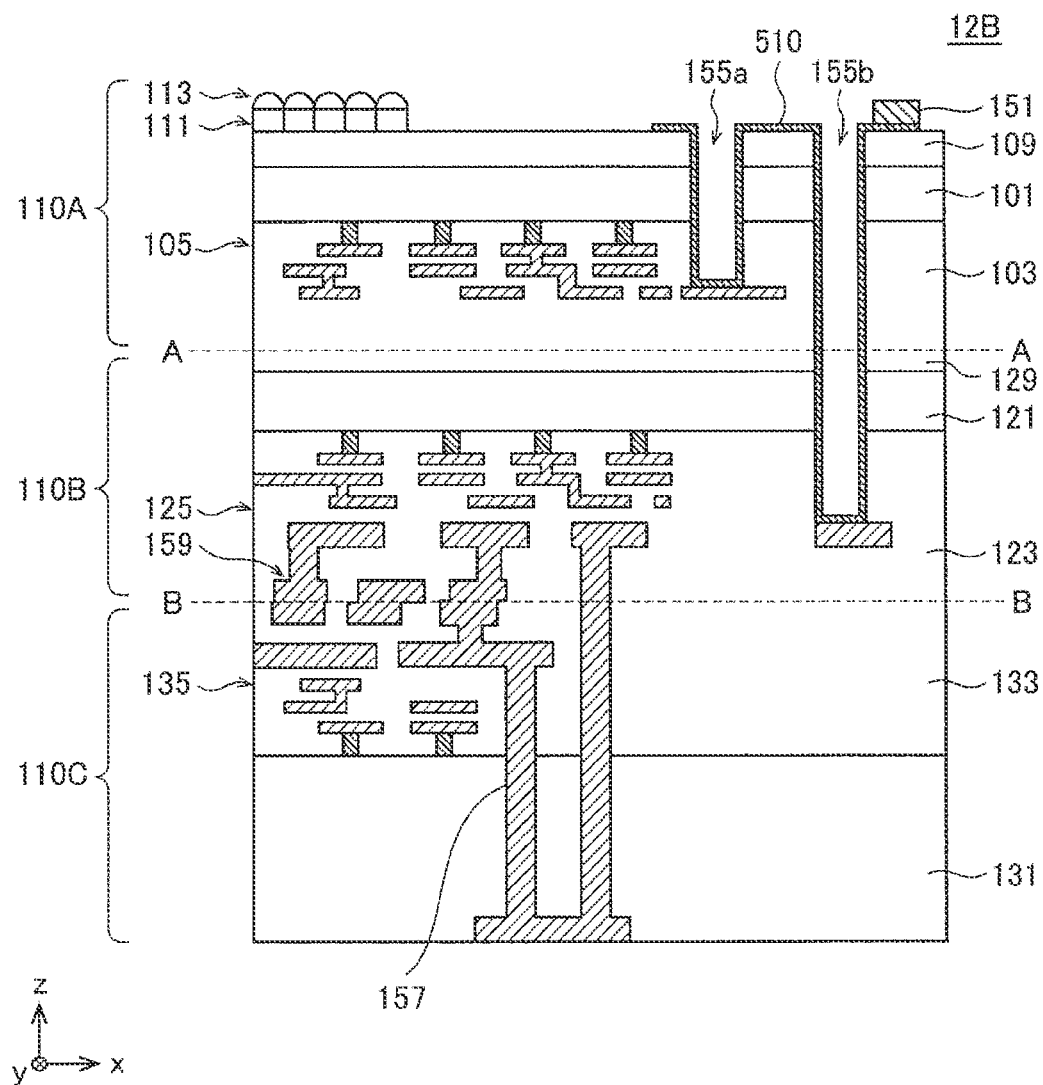

[FIG. 12C]
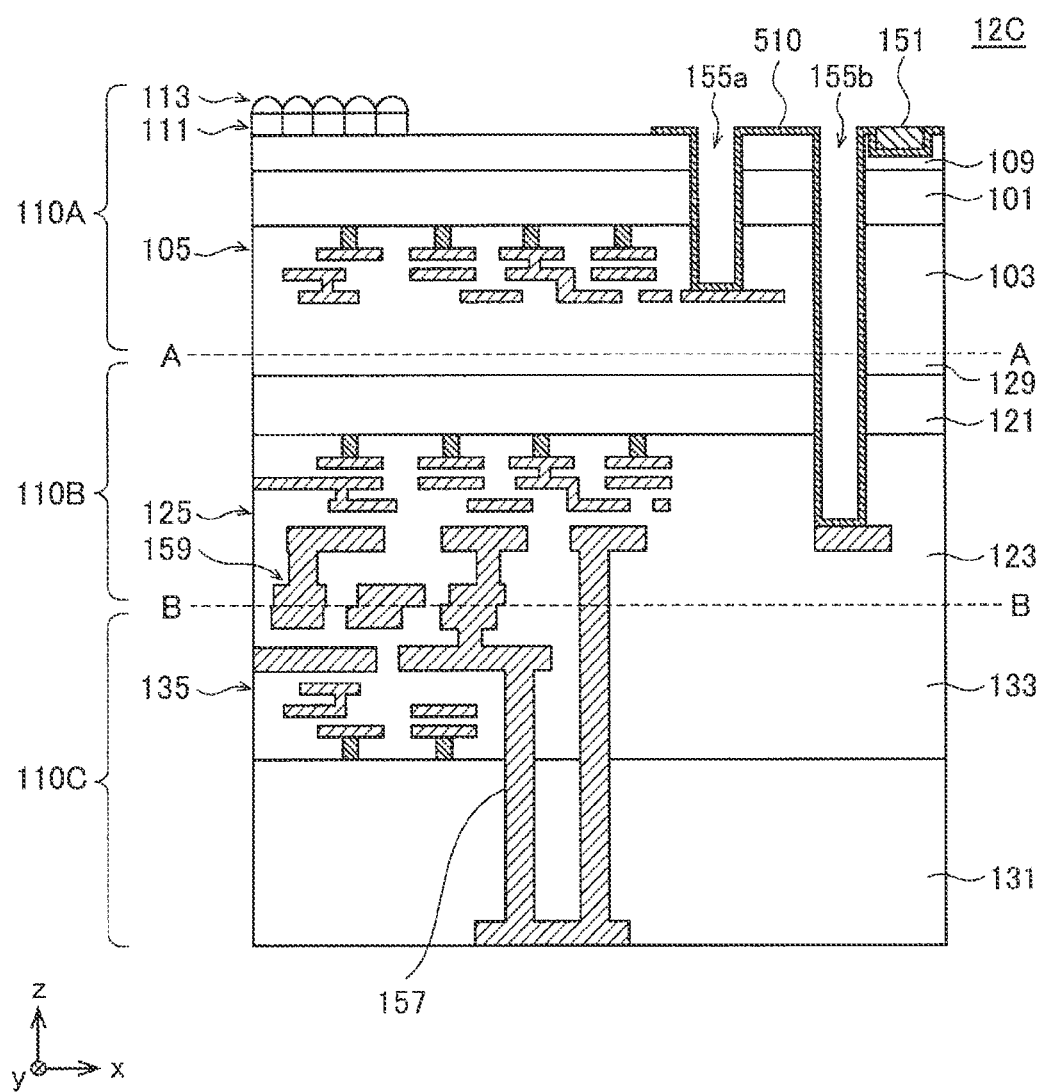

[FIG. 12D]
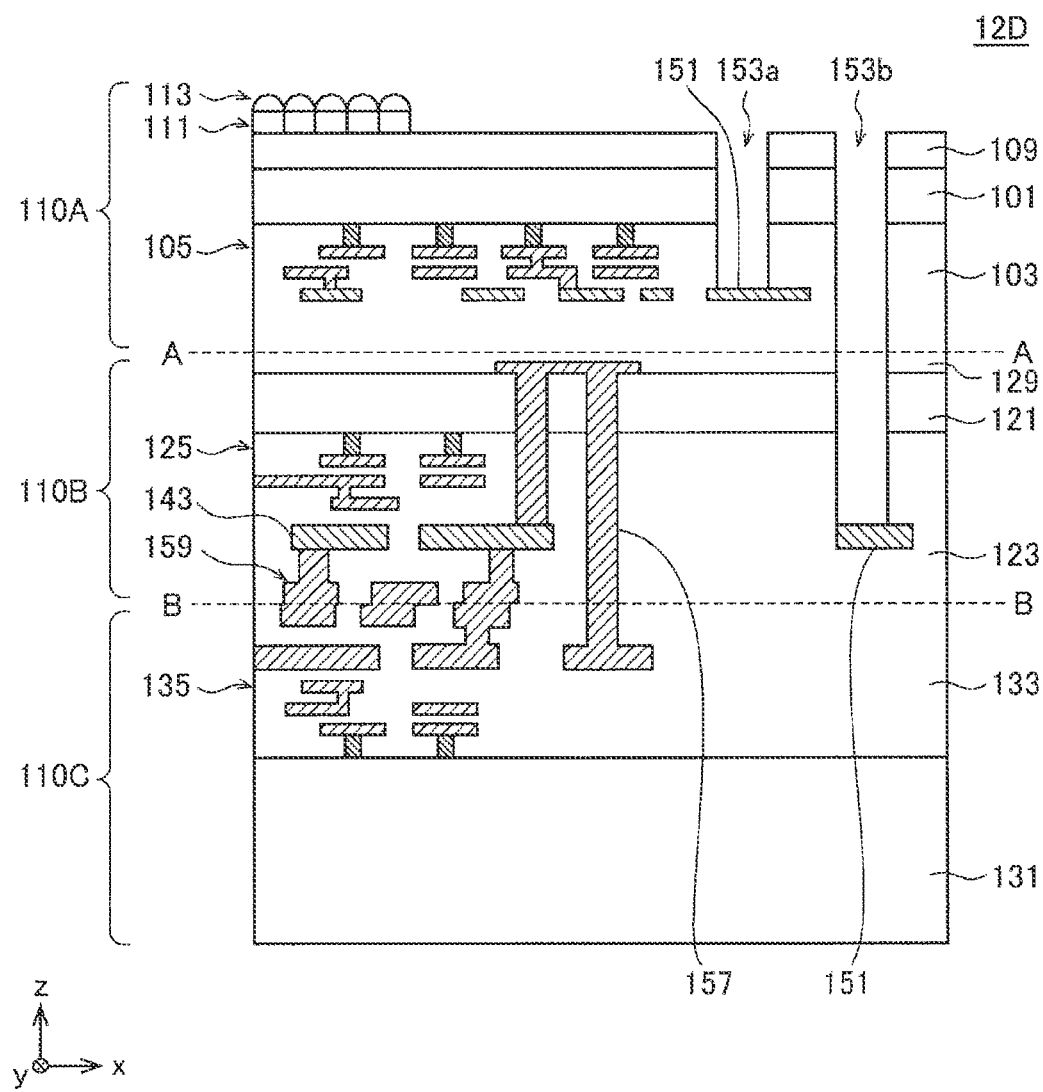

[FIG. 12E]
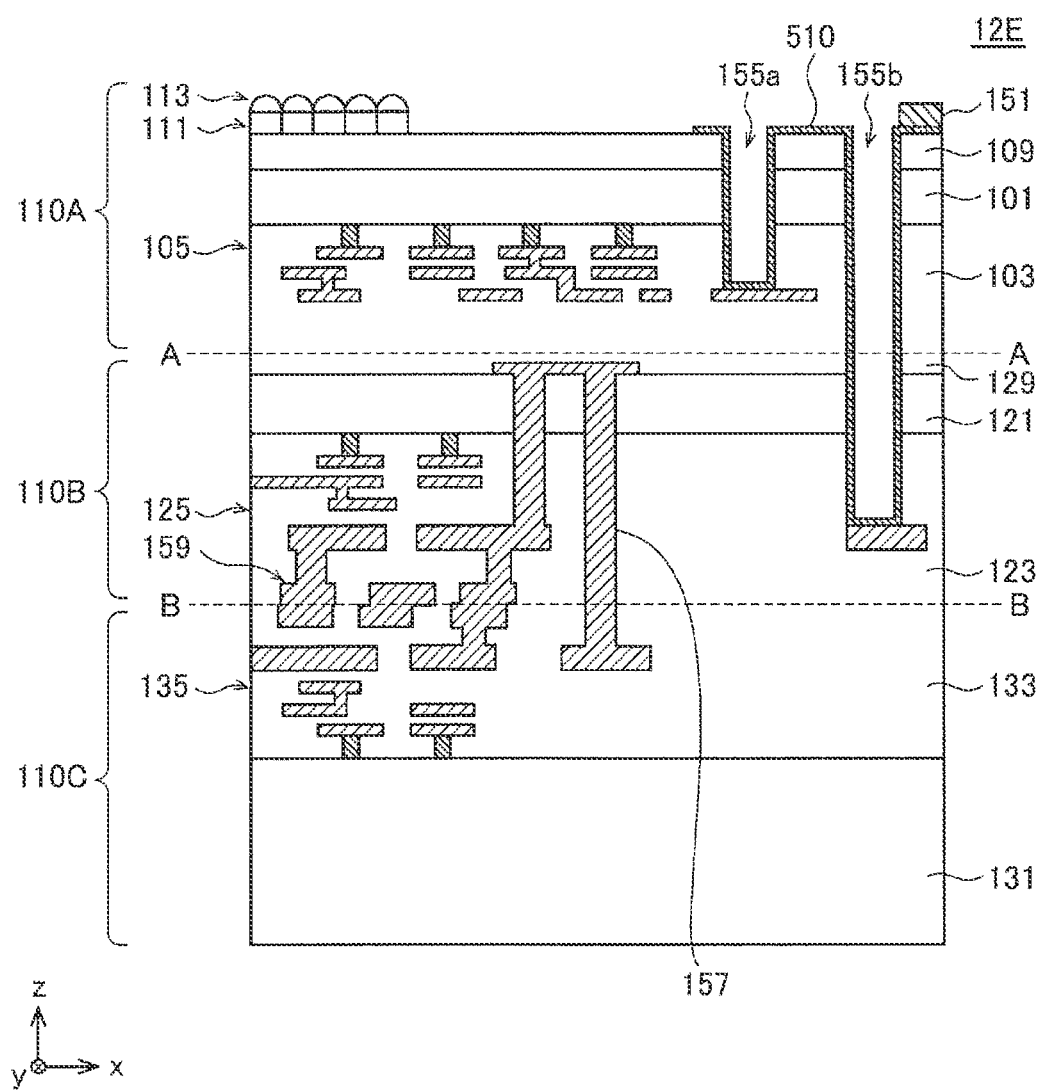

[FIG. 12F]
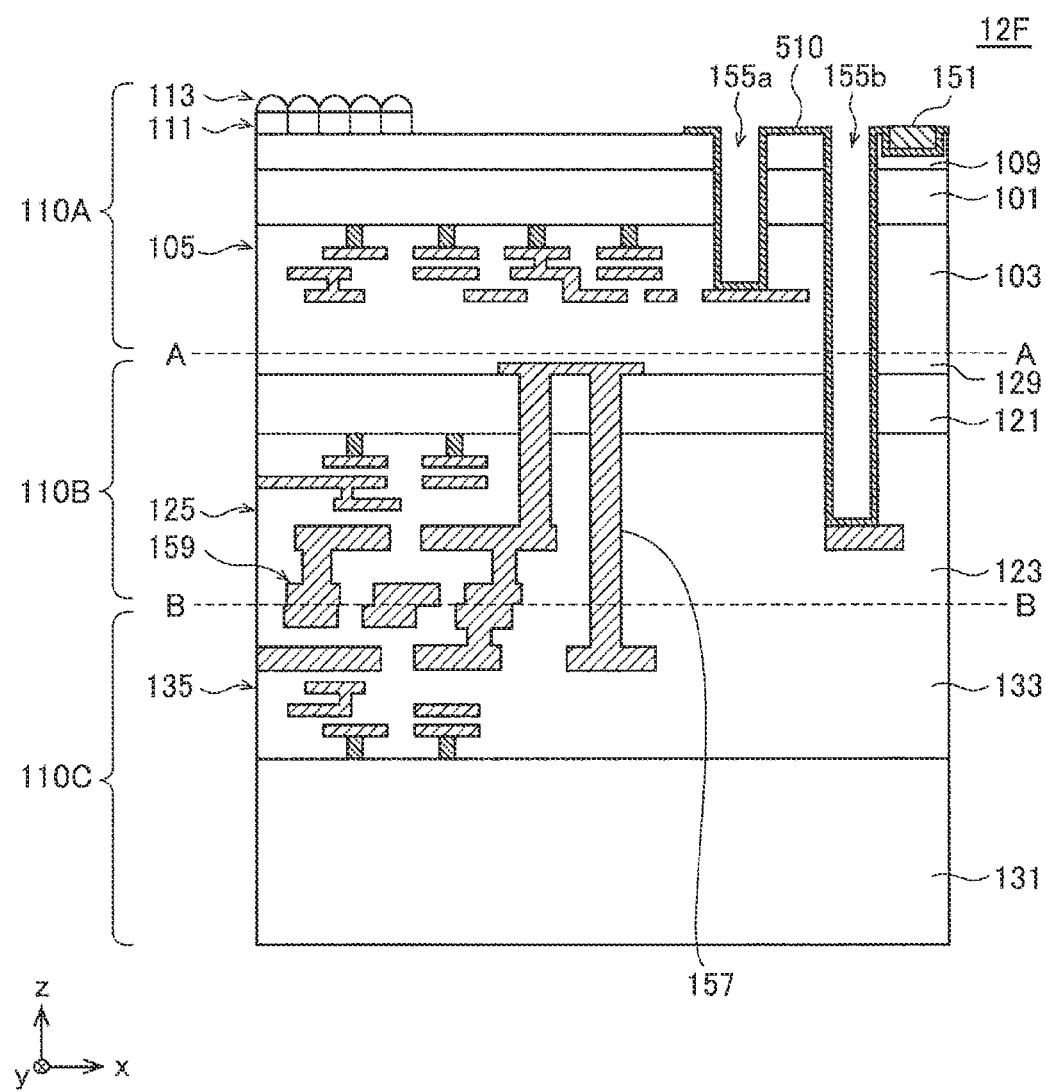

[FIG. 13A]
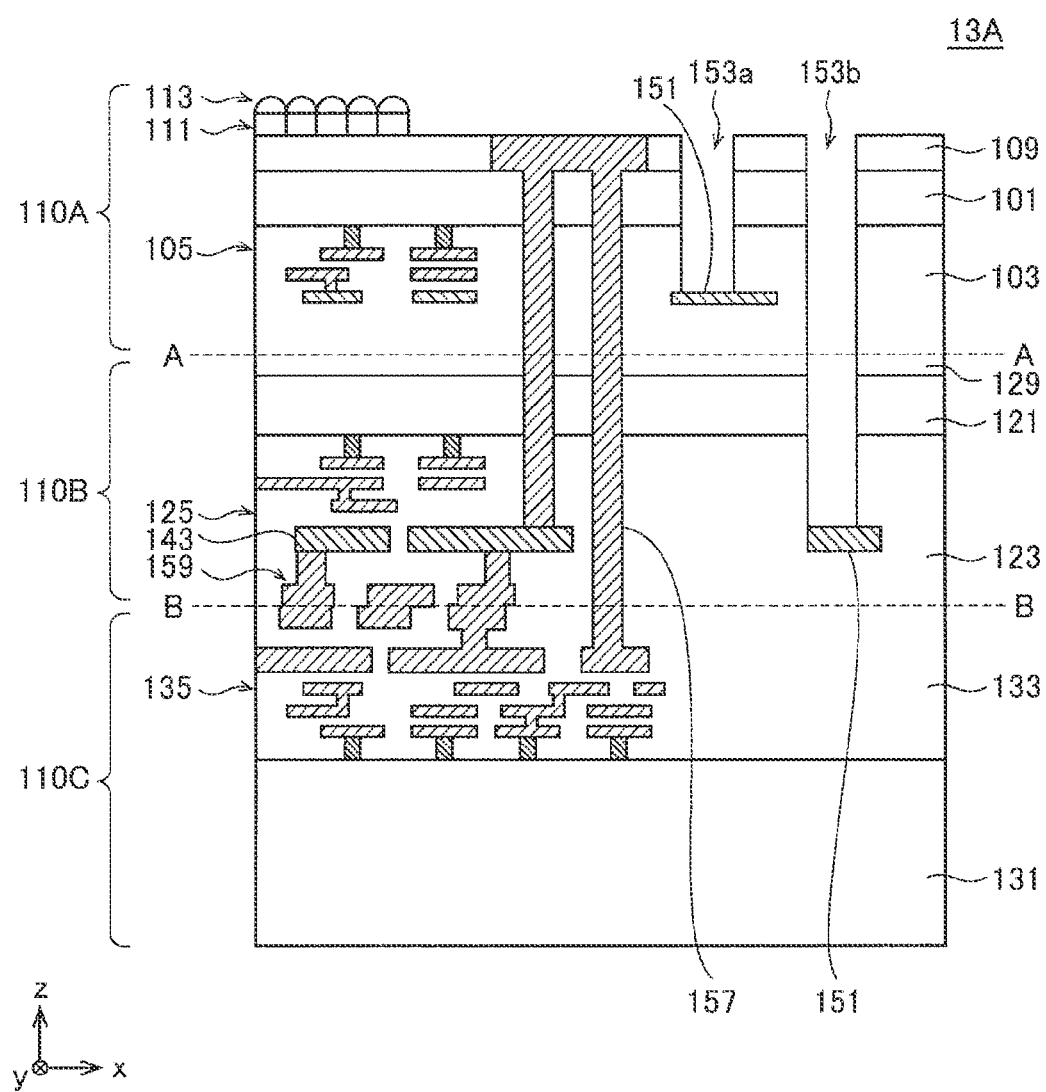

[ FIG. 13B ]
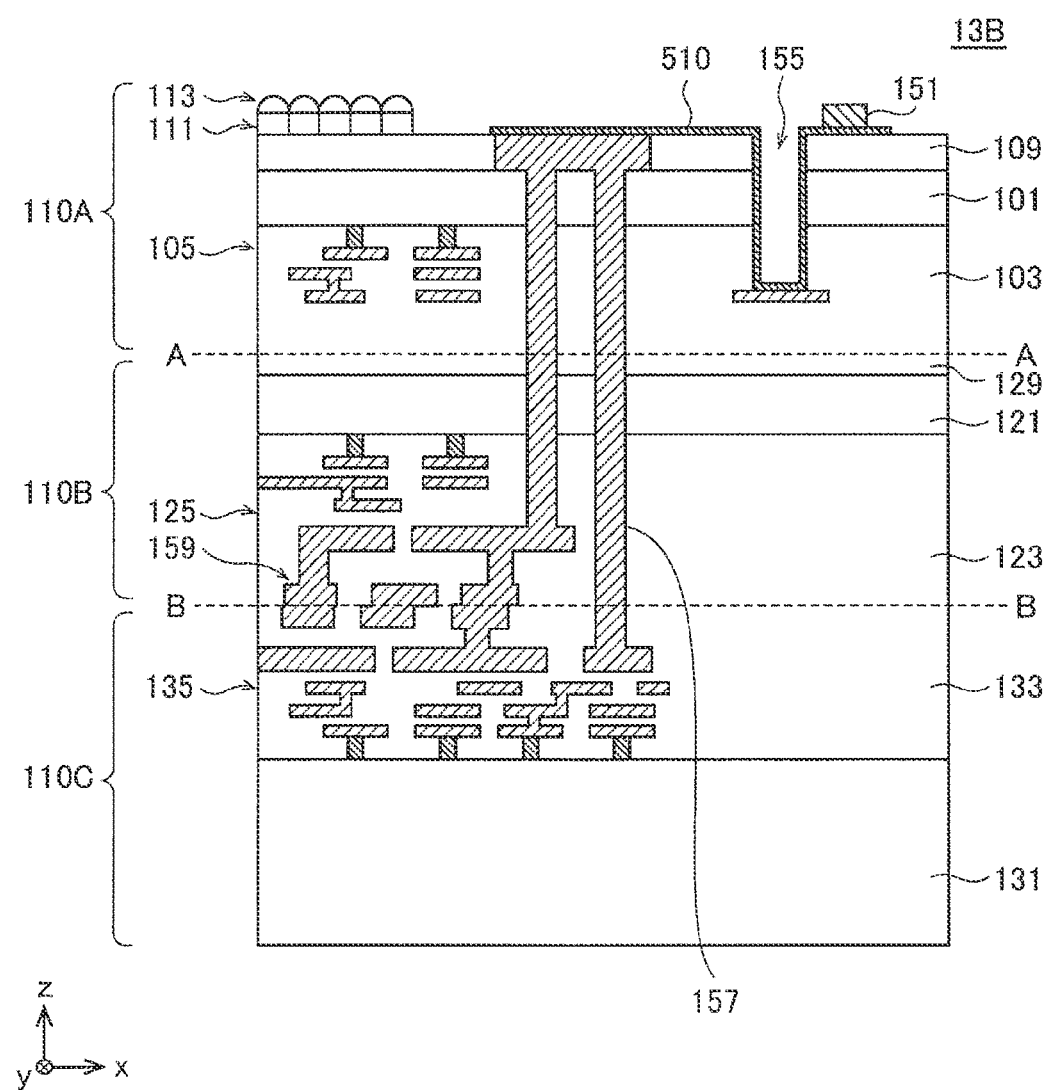

[FIG. 13C]
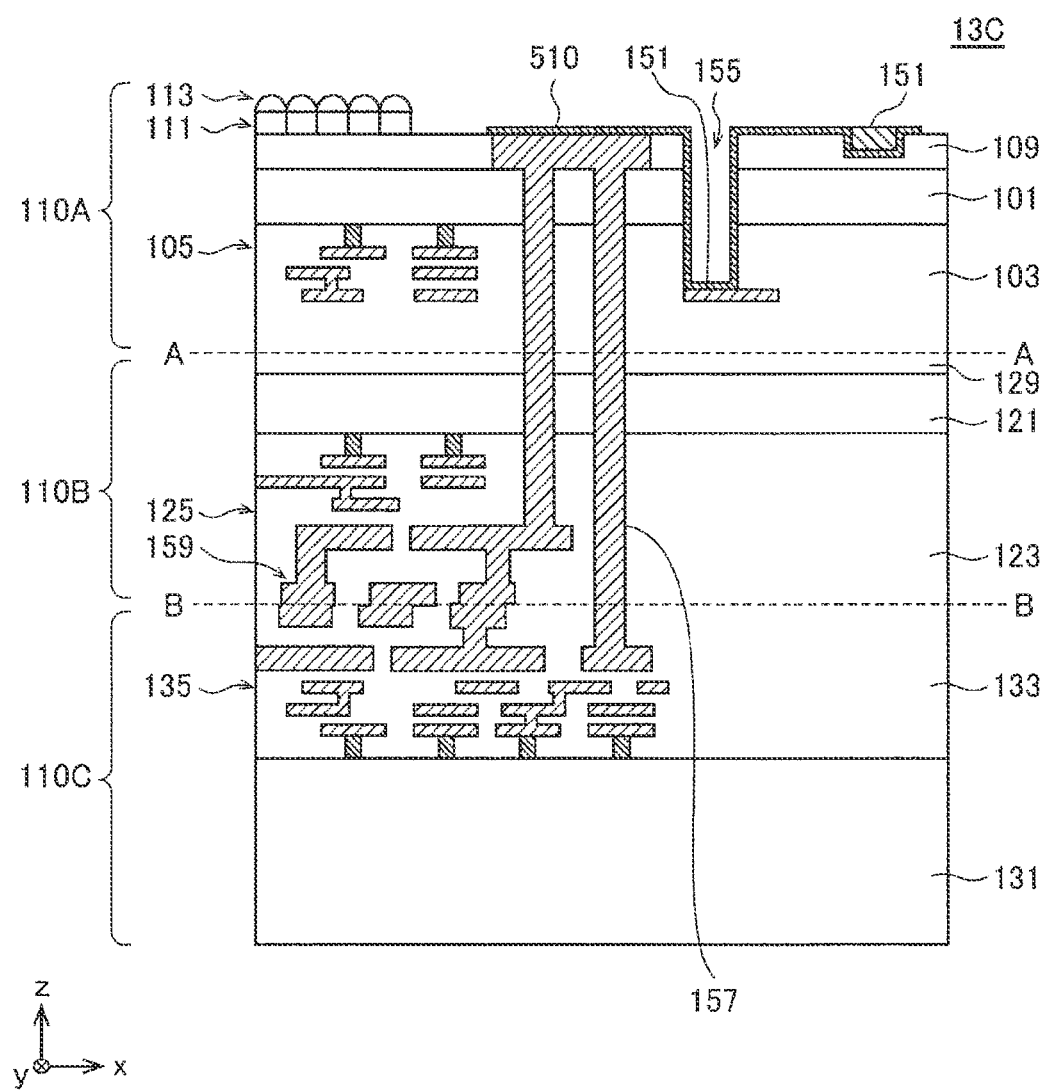

[ FIG. 13D ]
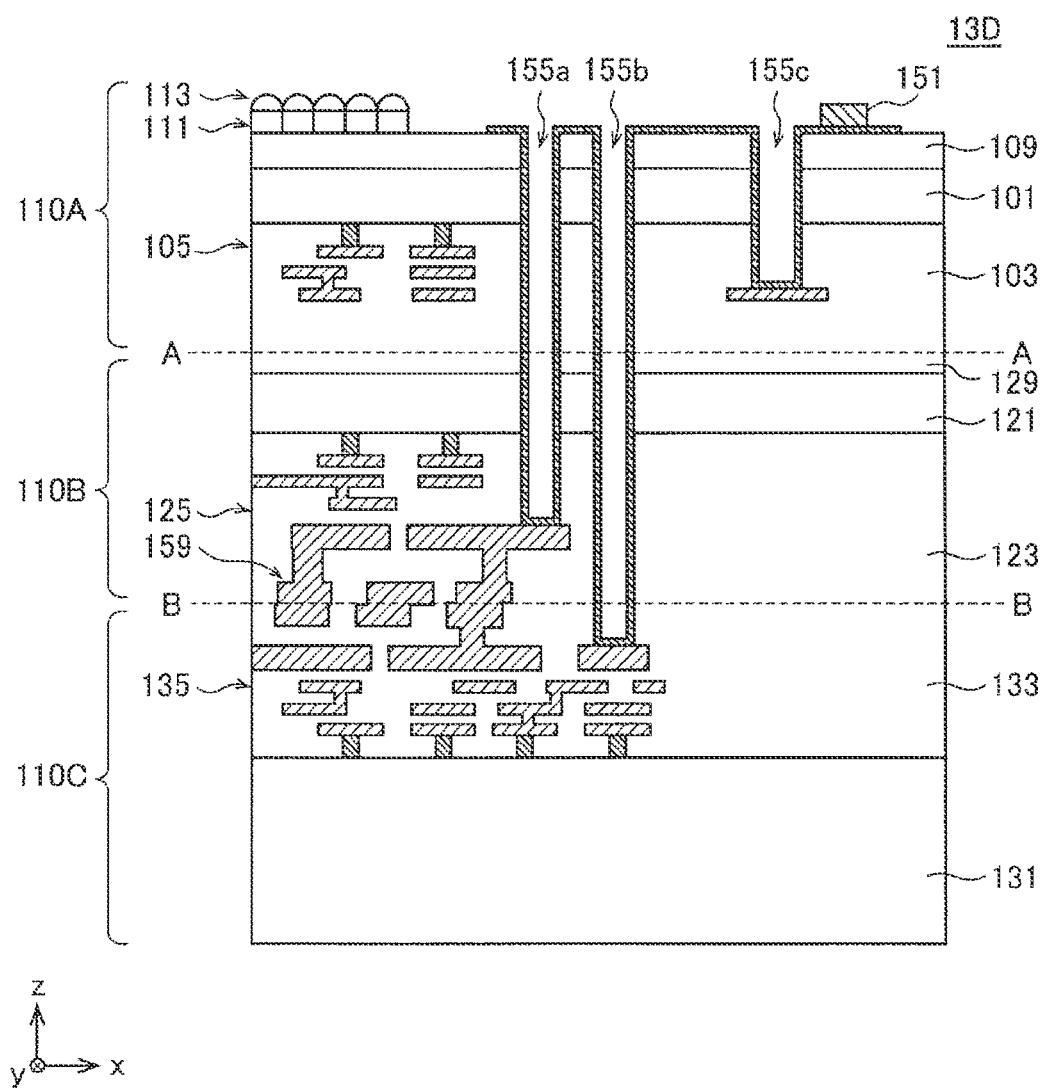

[FIG. 13E]
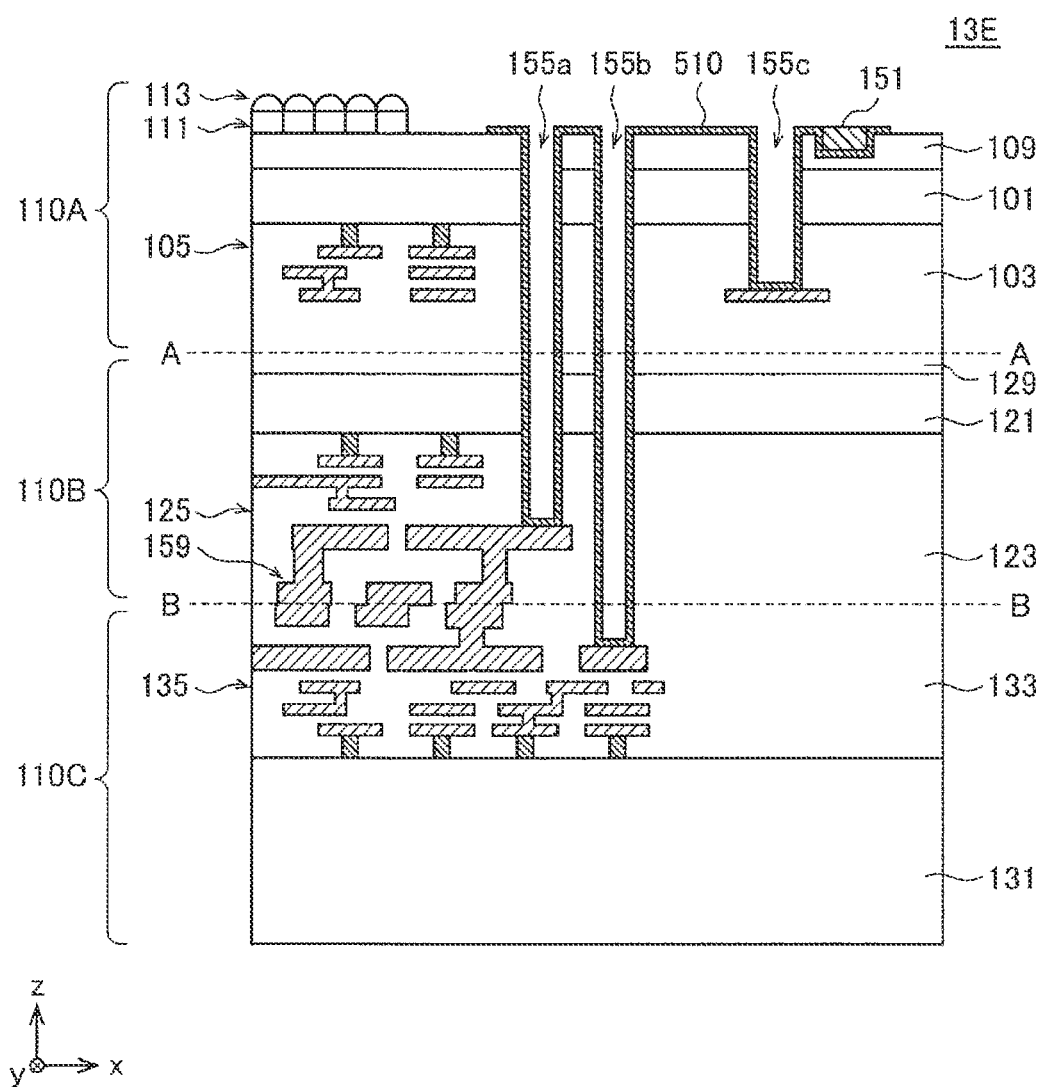

[FIG. 14A]
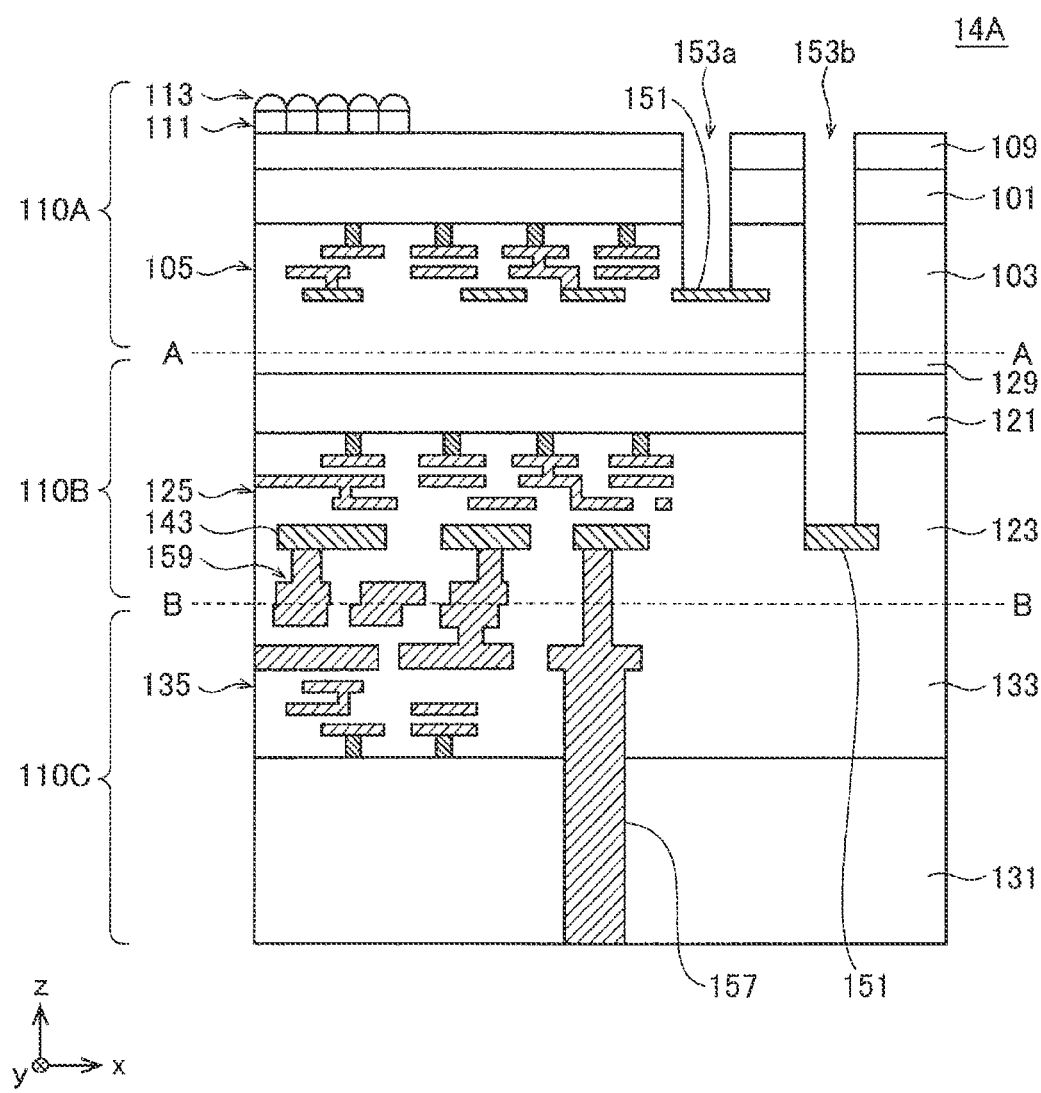

[FIG. 14B]
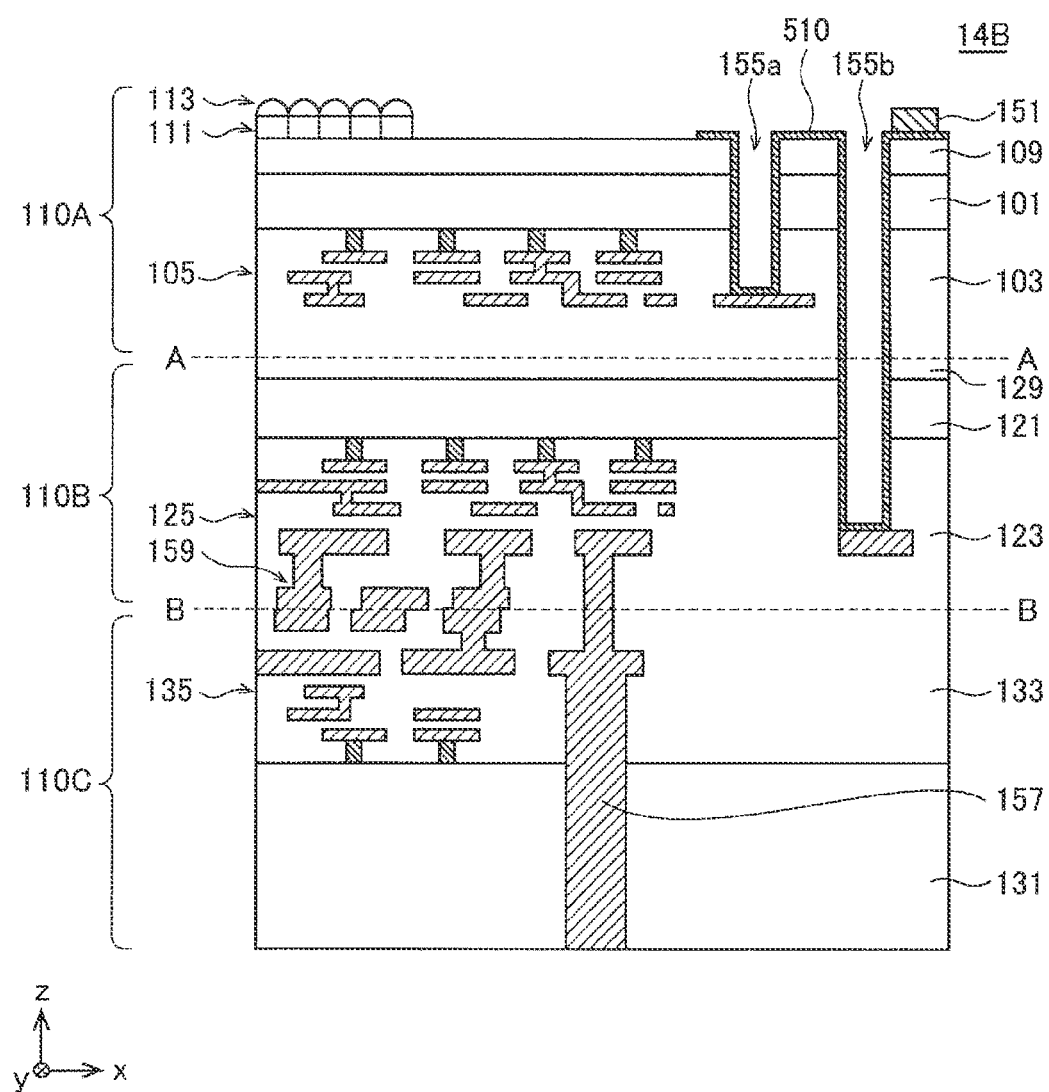

[FIG. 14C]
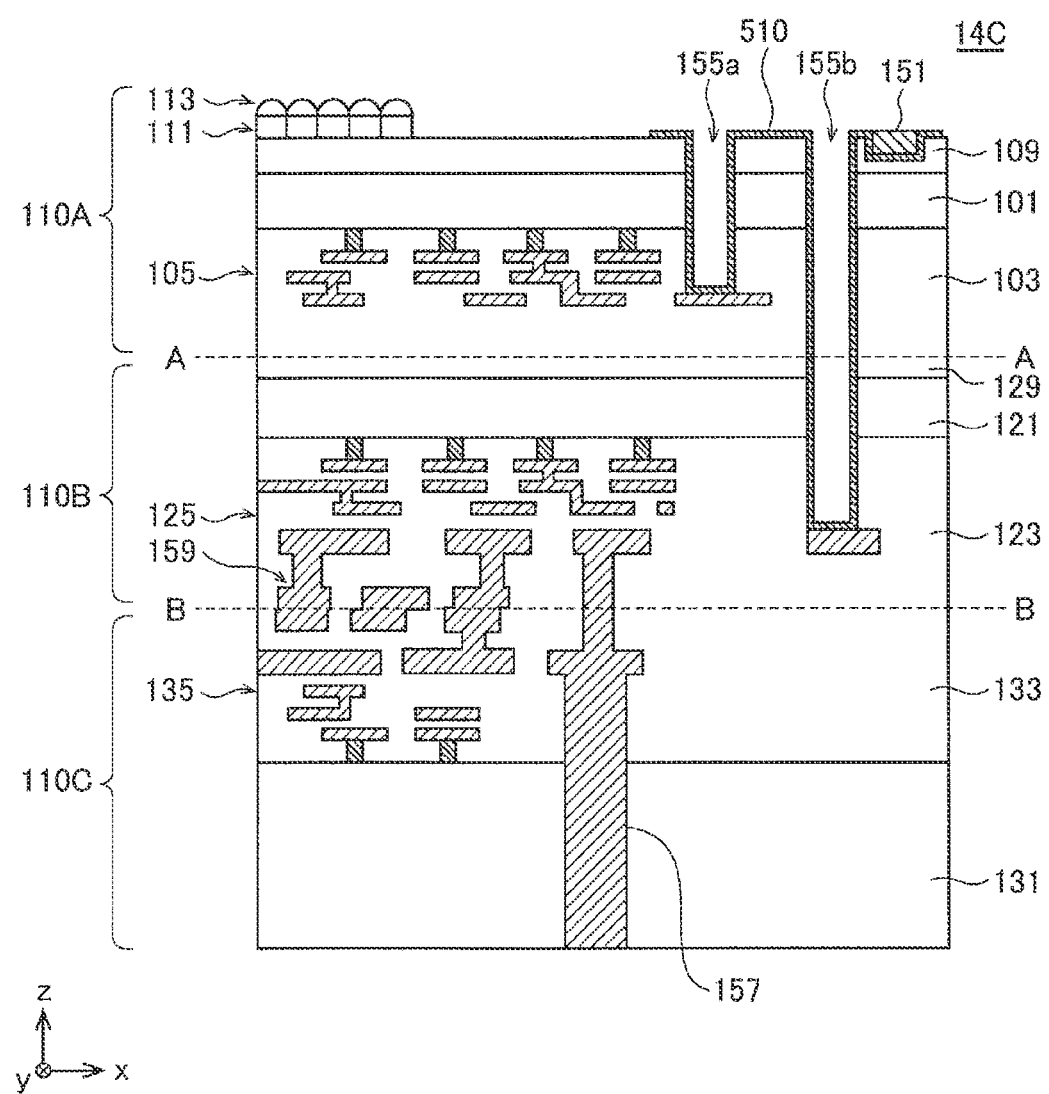

[FIG. 14D]
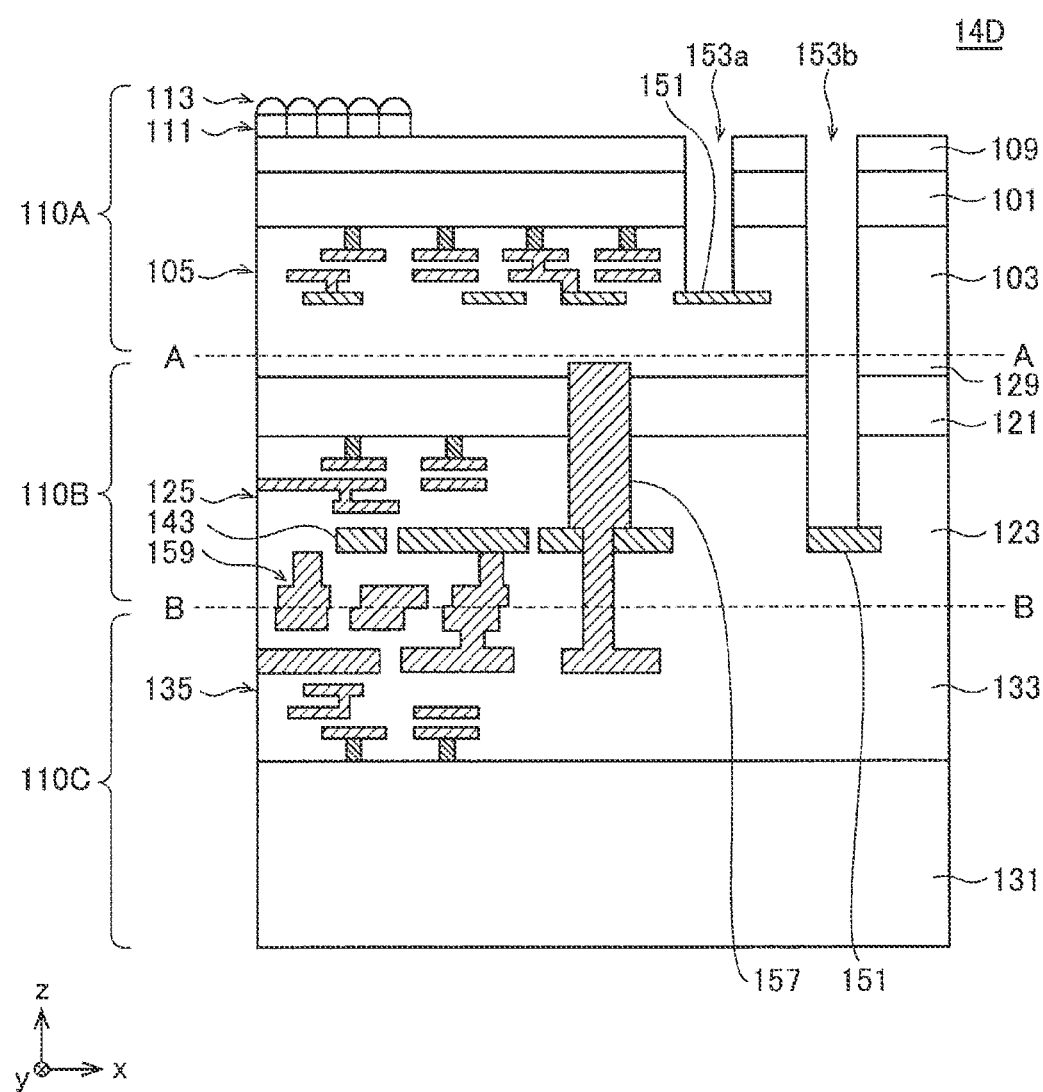

[ FIG. 14E ]
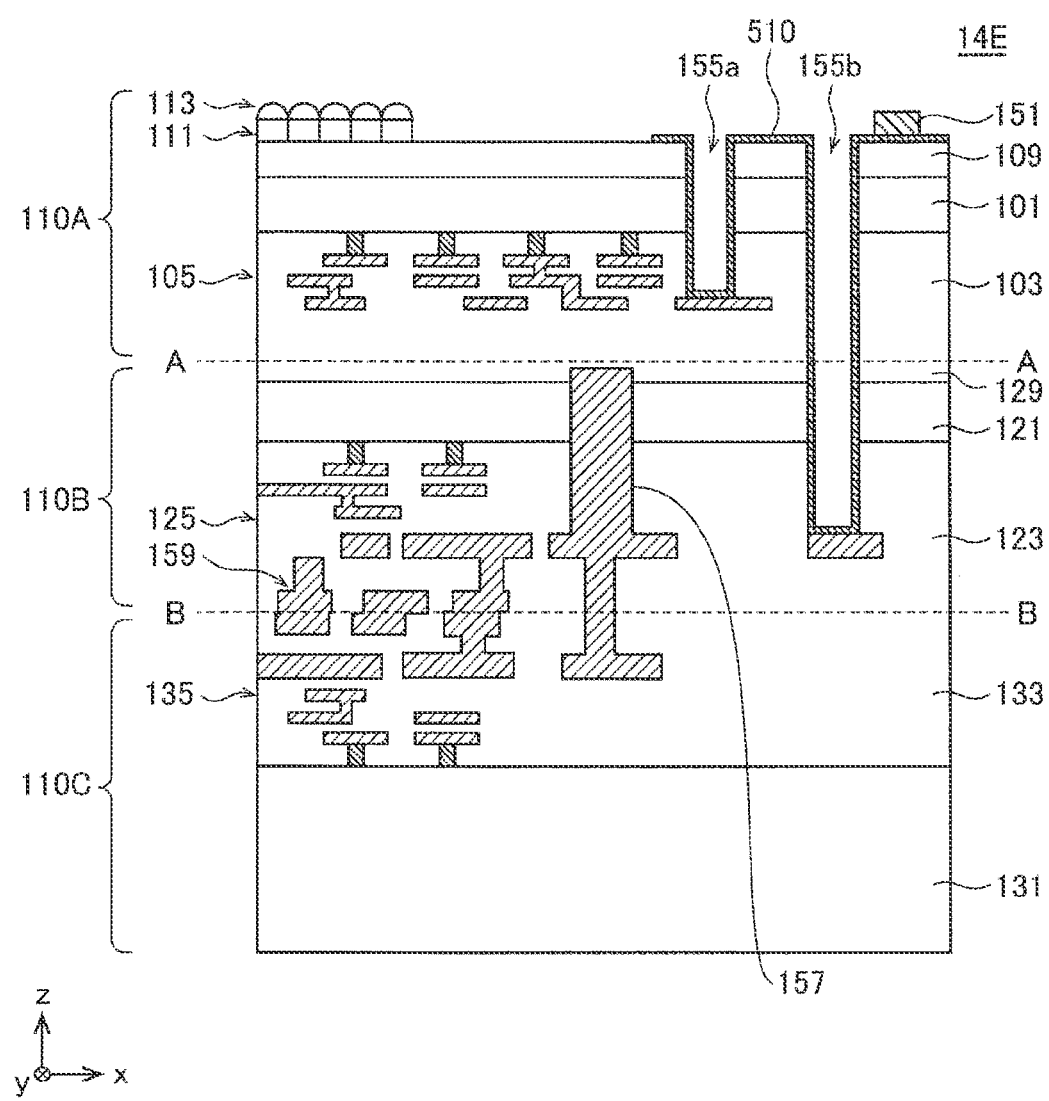

[FIG. 14F]
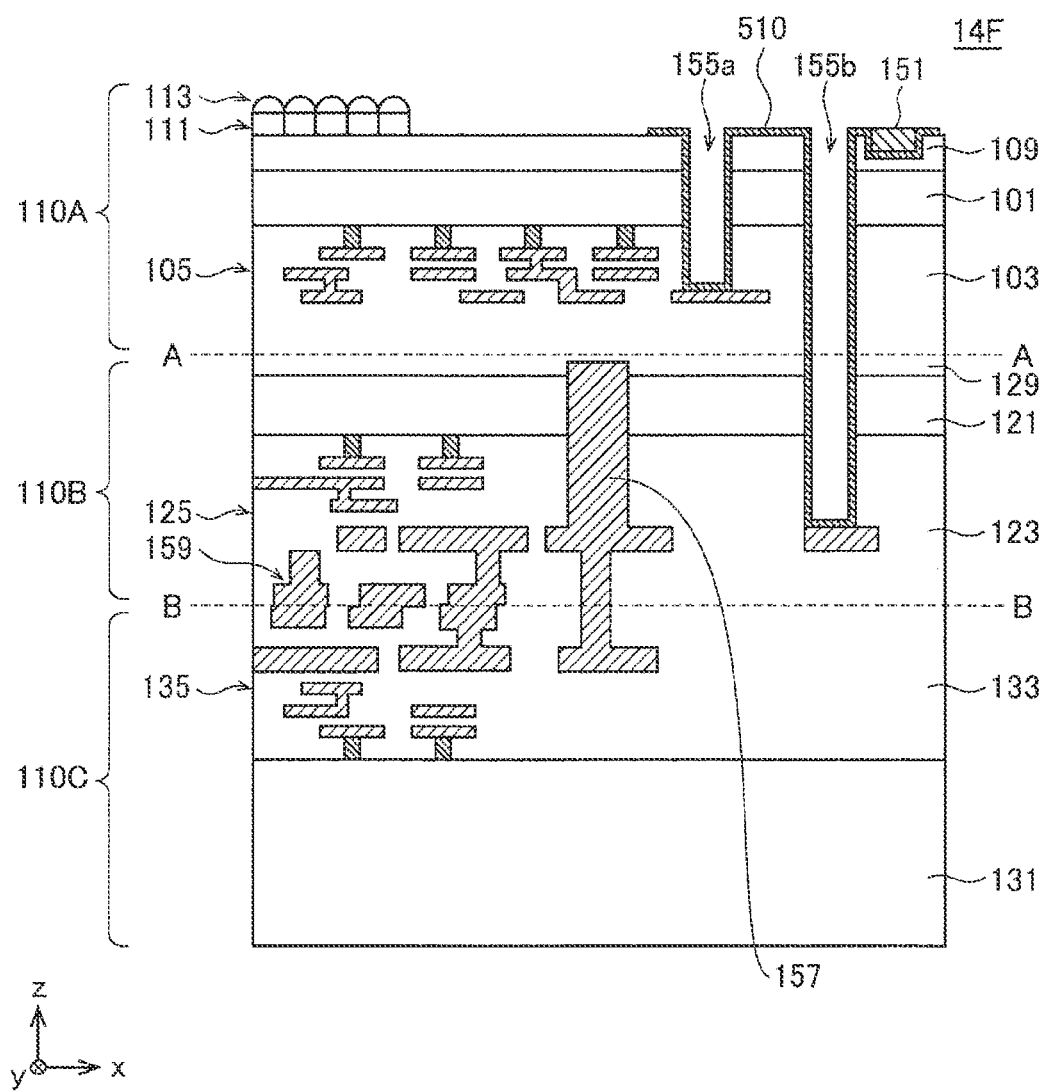

[FIG. 15A]
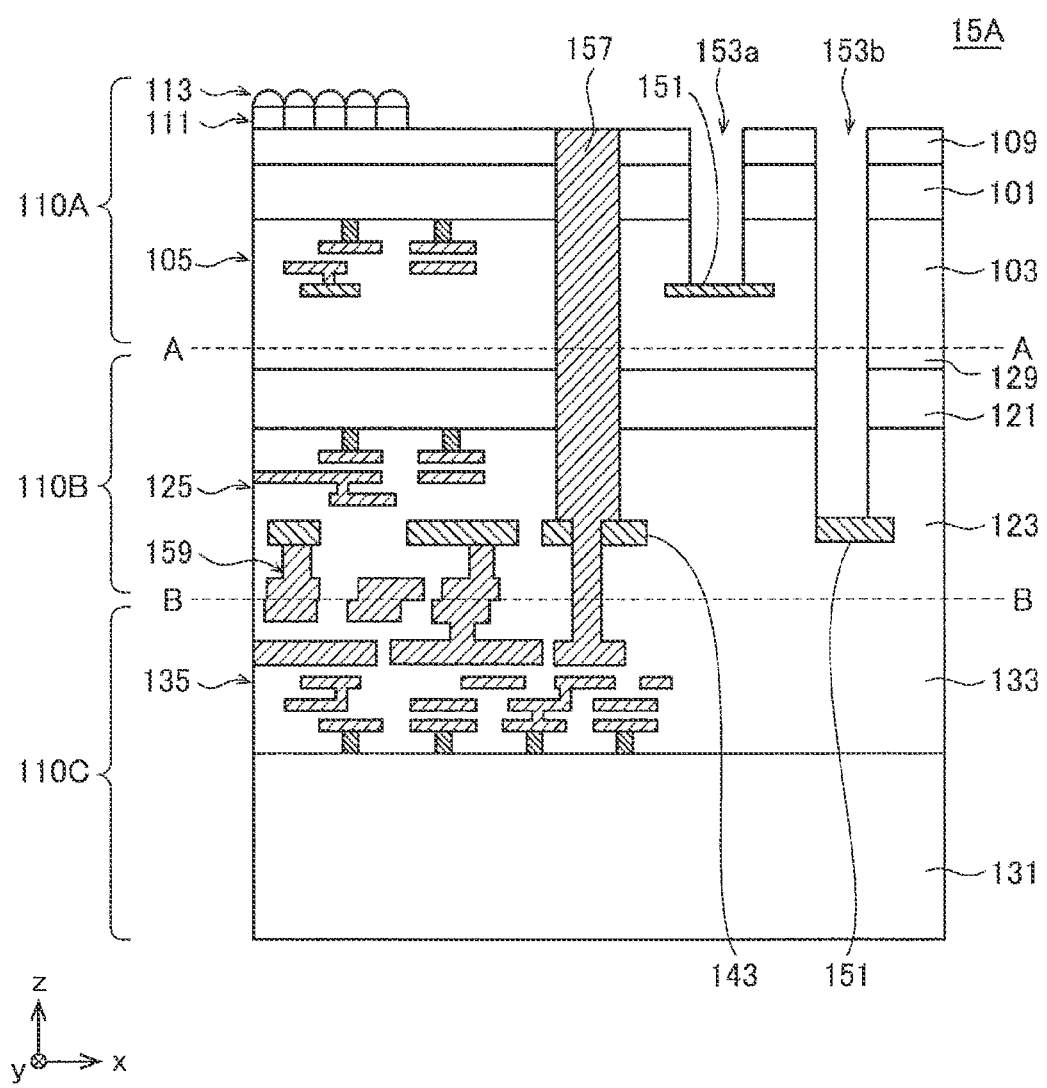

[FIG. 15B]
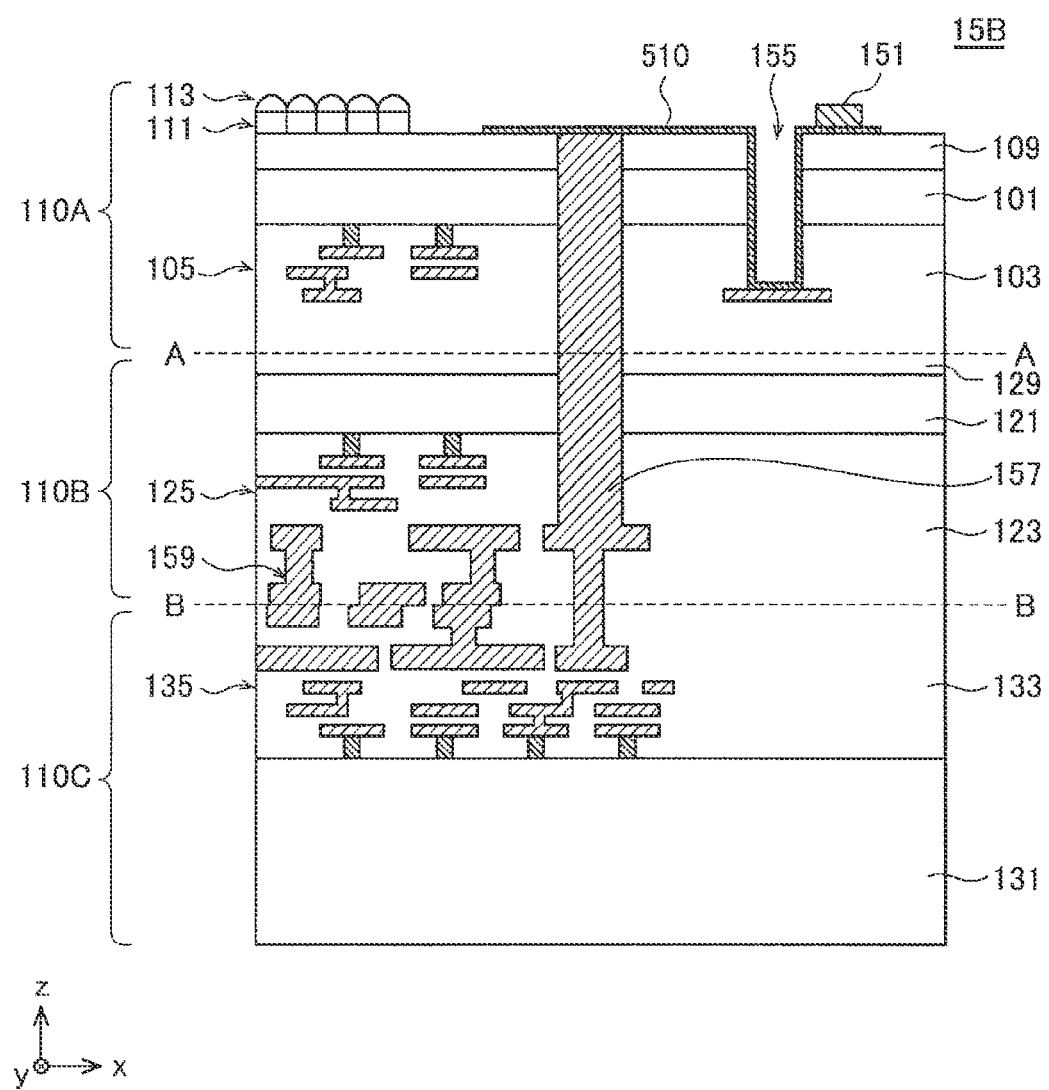

[FIG. 15C]
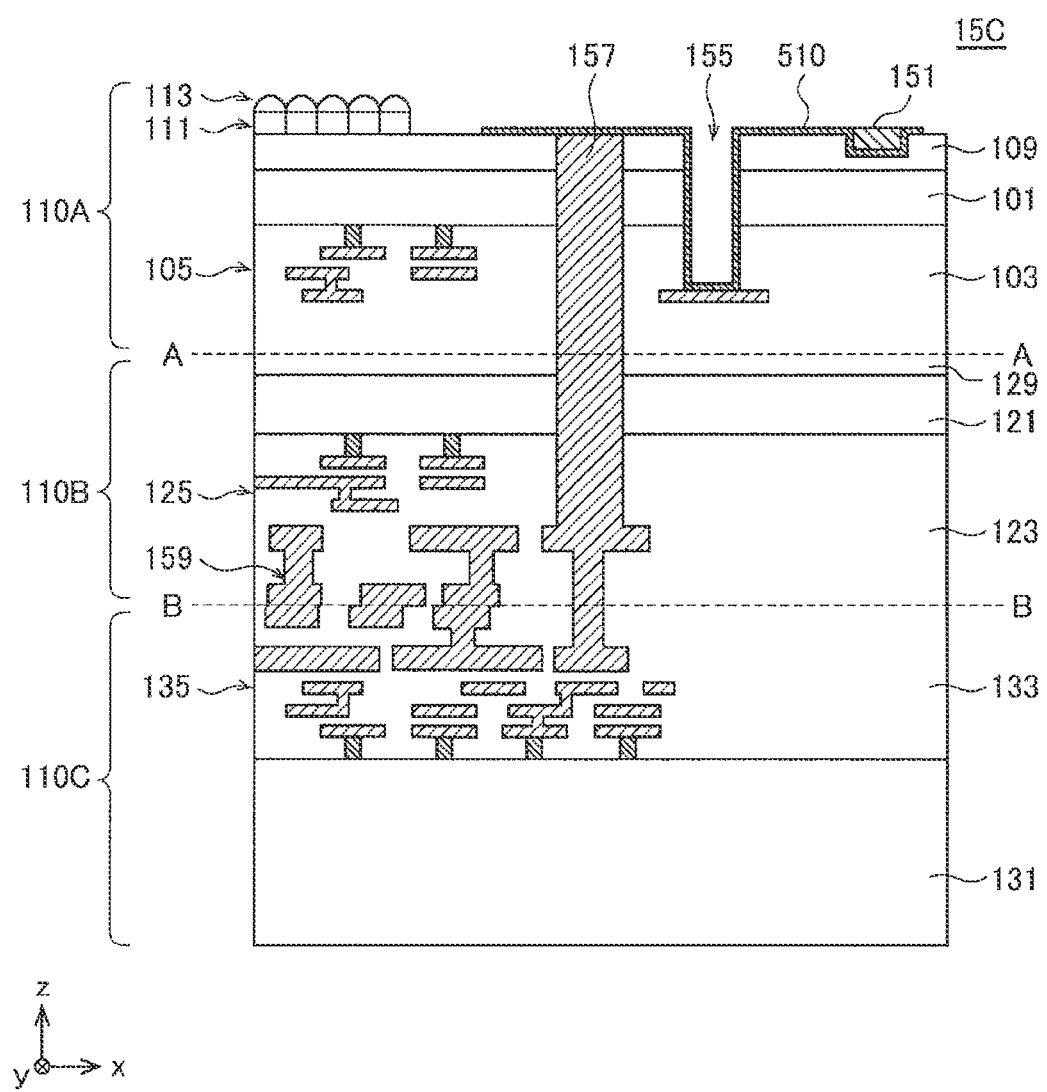

[FIG. 15D]
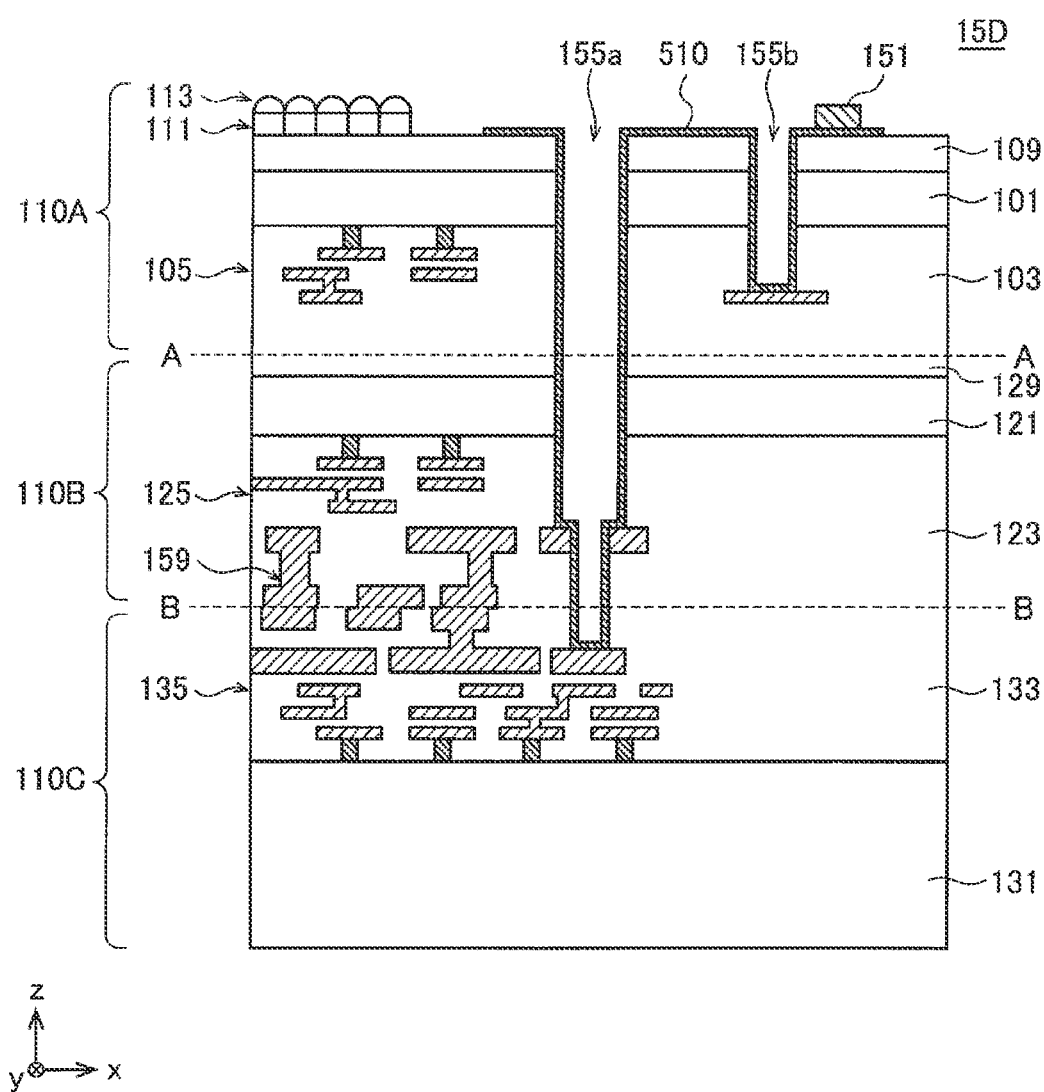

[FIG. 15E]
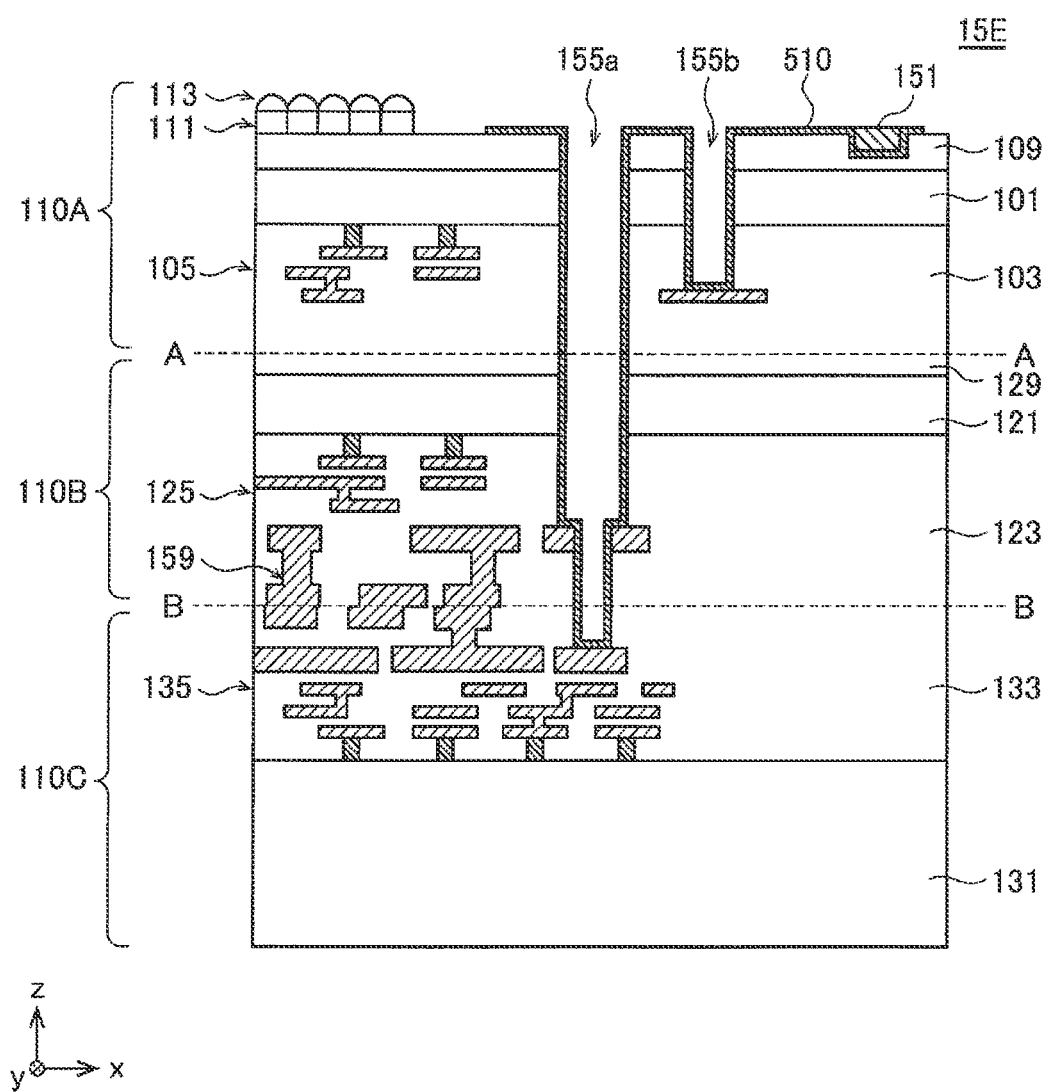

[FIG. 16A]
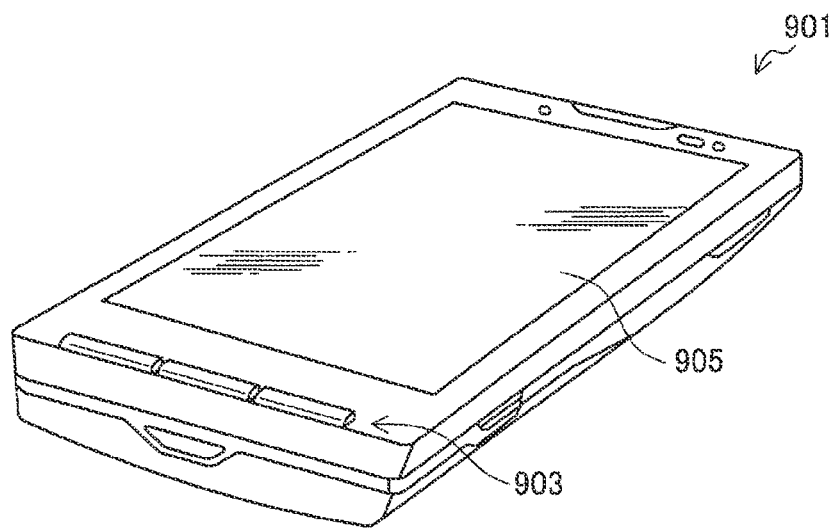
[FIG. 16B]
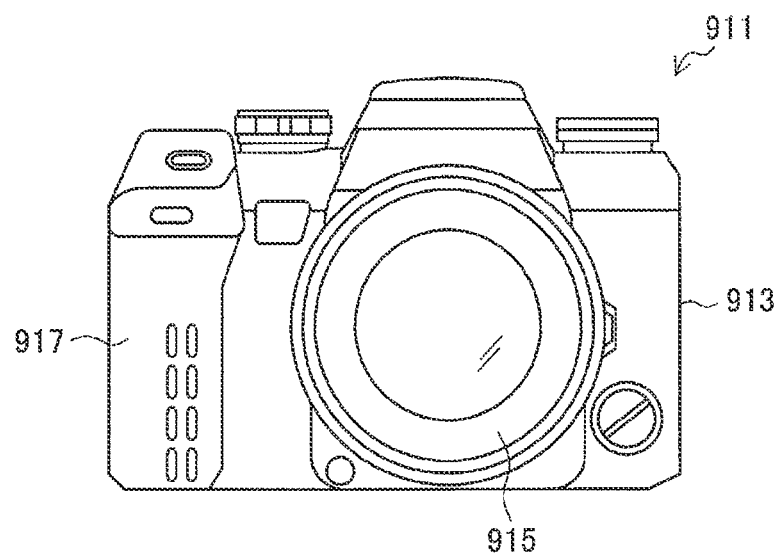

[FIG. 16C]
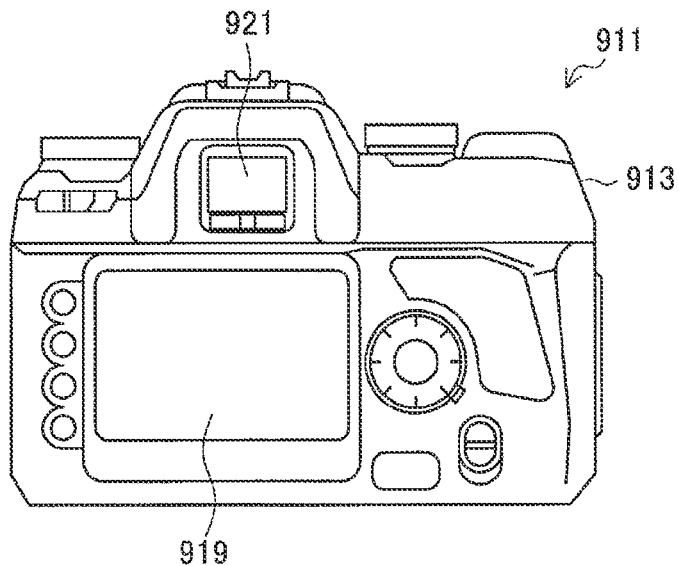
[FIG. 17A]
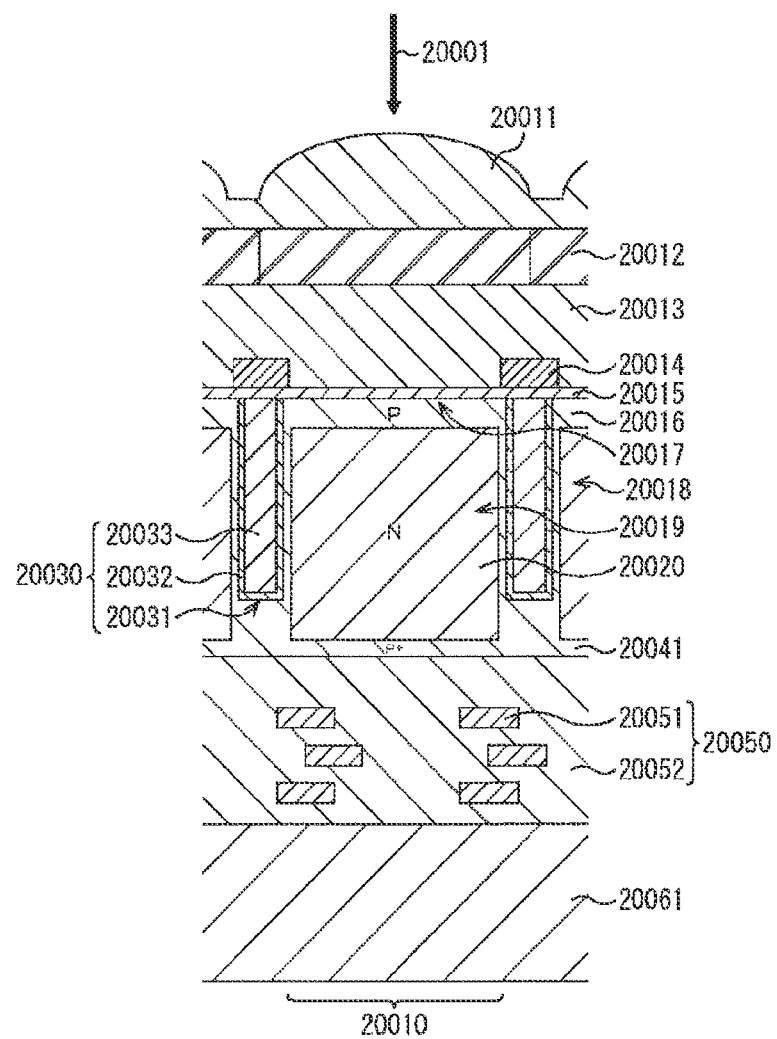

[FIG. 17B]
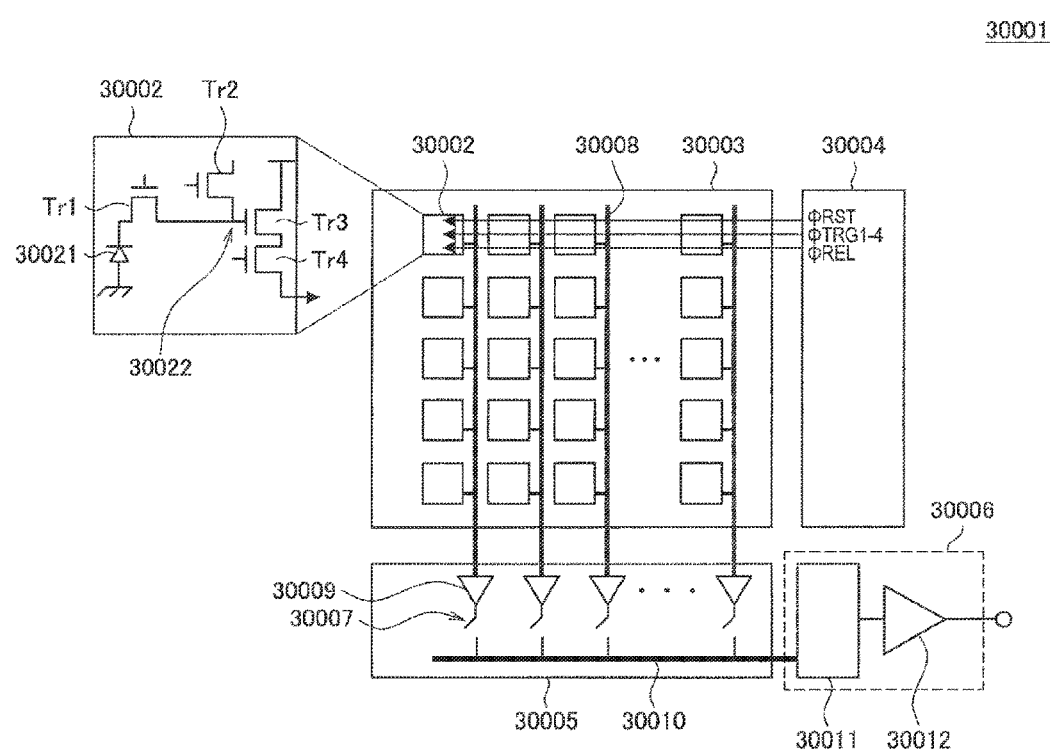

[ FIG. 17C ]
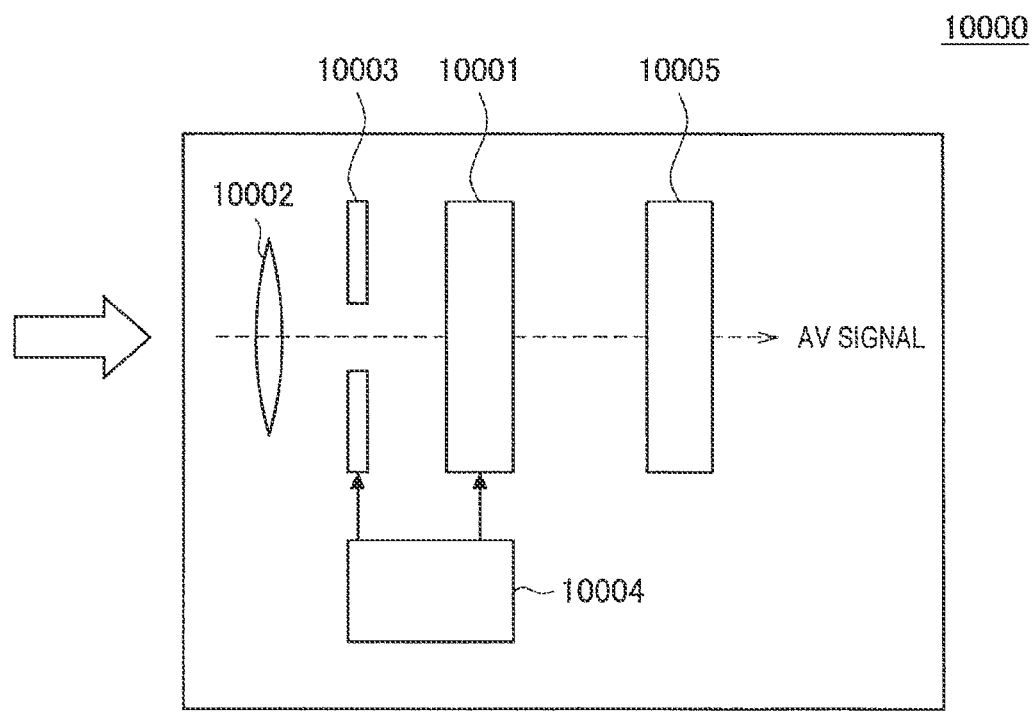

[FIG. 17D]
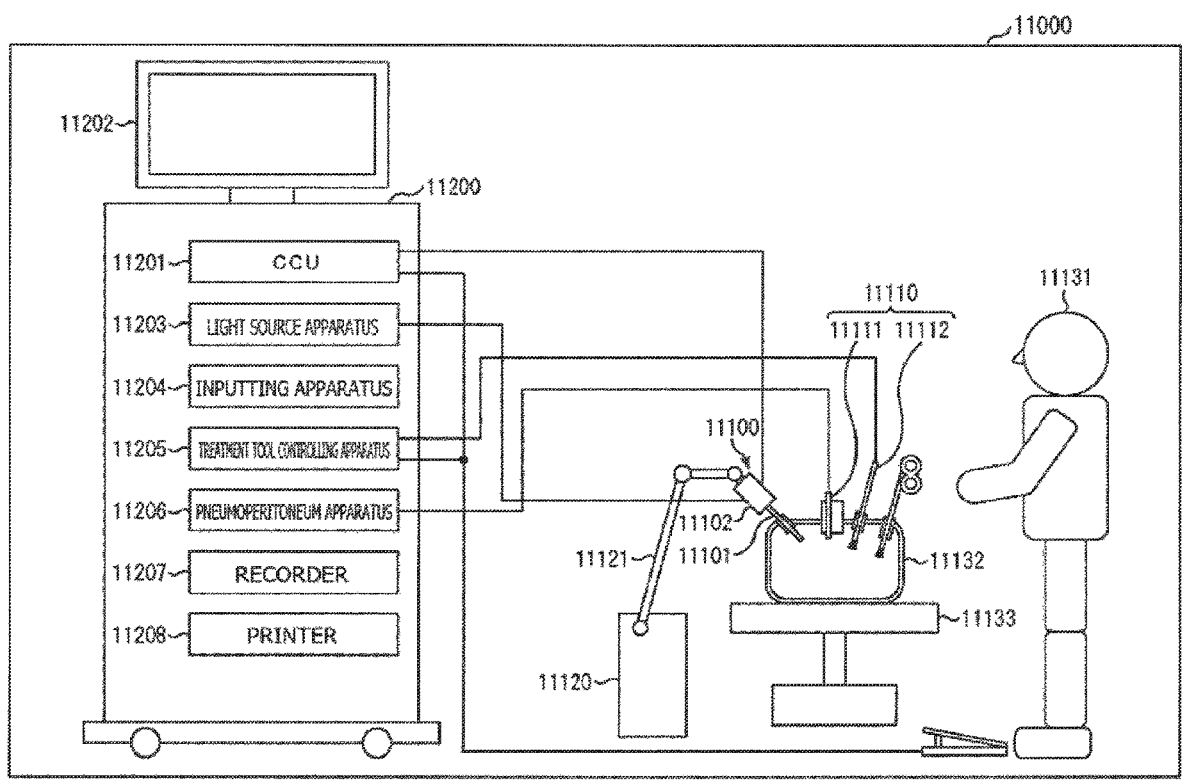

[ FIG. 17E ]
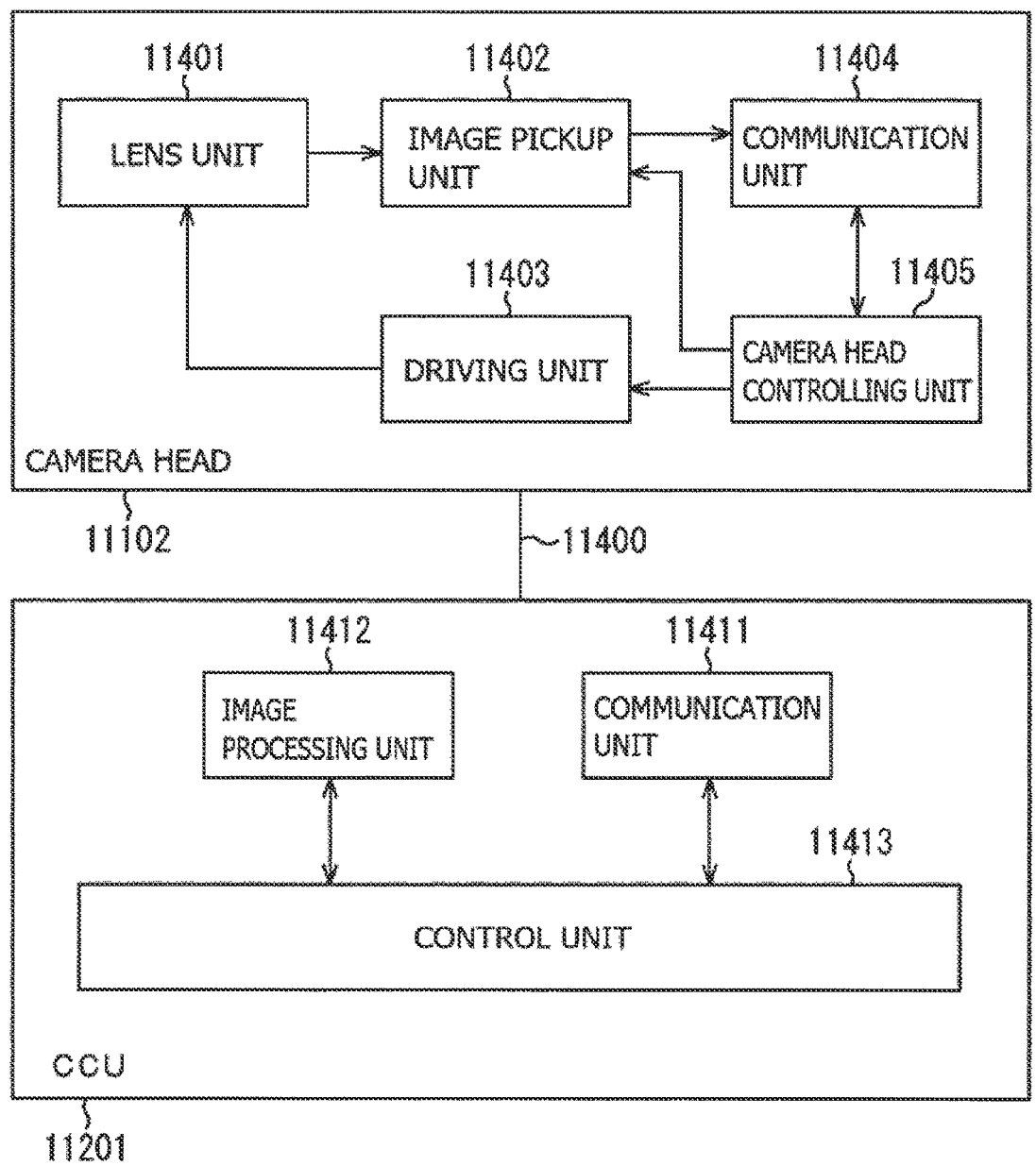

[ FIG. 17F ]
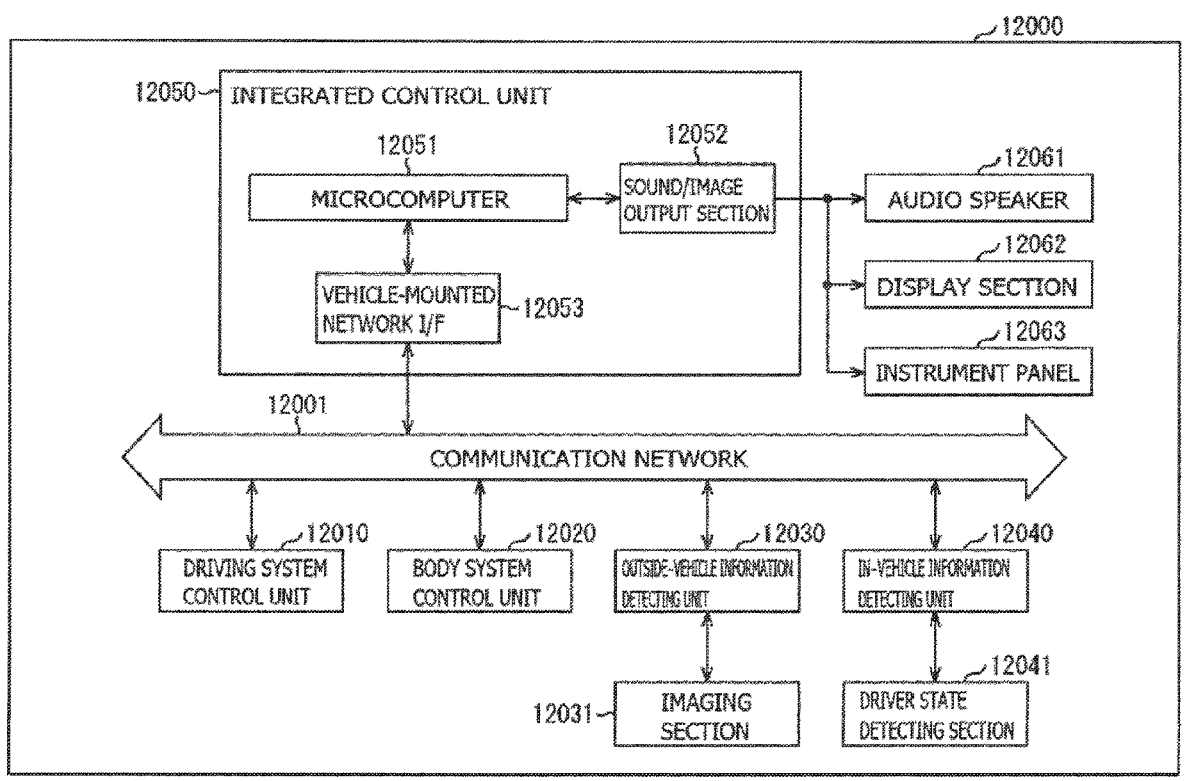

[ FIG. 17G ]
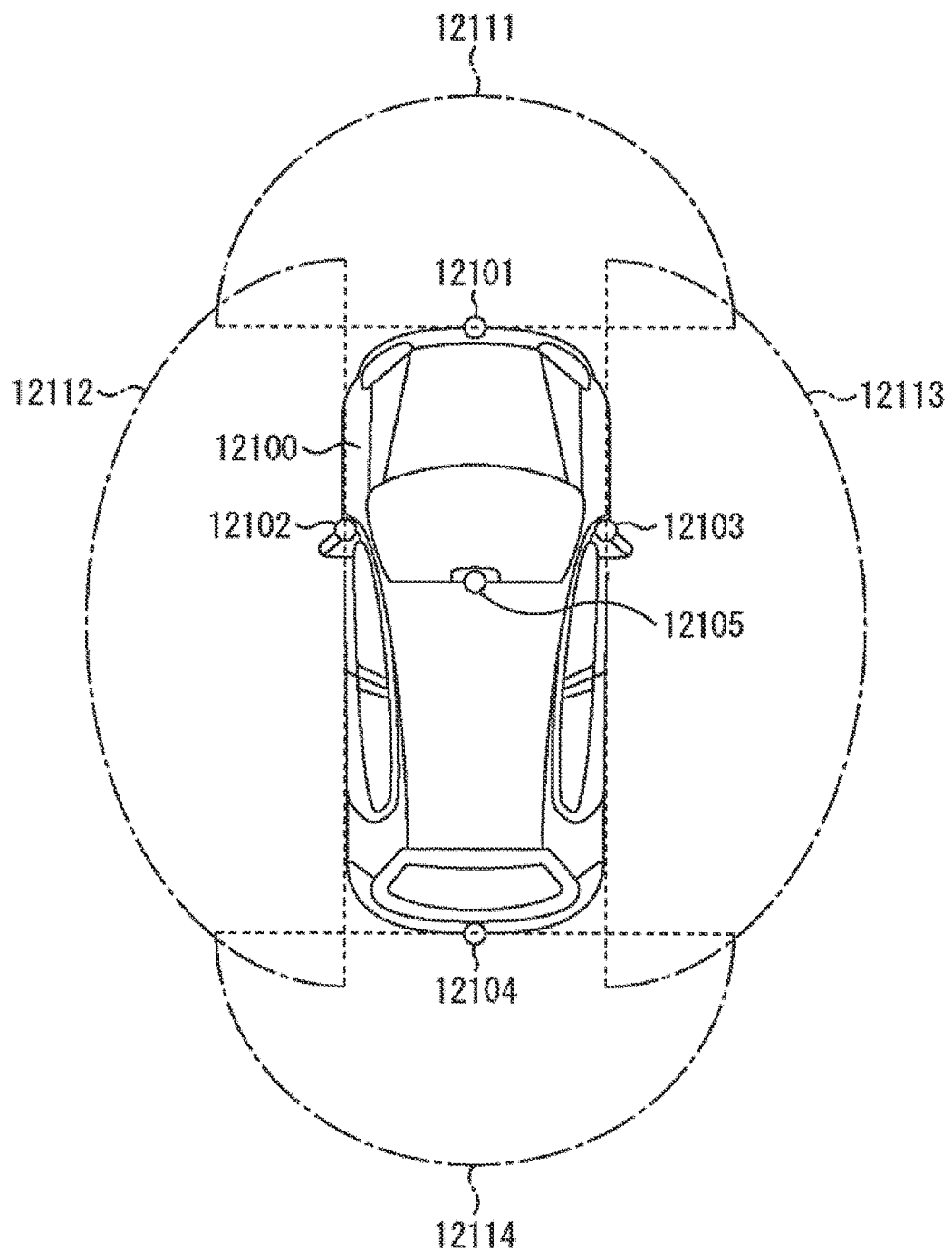

SOLID-STATE IMAGING DEVICE AND ELECTRONIC DEVICE INCLUDING COUPLING STRUCTURES FOR ELECTRICALLY INTERCONNECTING STACKED SEMICONDUCTOR SUBSTRATES

CROSS REFERENCE TO RELATED APPLICATIONS

This application is a continuation application of U.S. patent application Ser. No. 17/869,659, filed on Jul. 20, 2022, which is a continuation application of U.S. patent application Ser. No. 16/497,497, filed on Sep. 25, 2019, now U.S. Pat. No. 11,411,037, which is a U.S. National Stage Entry of International Patent Application No. PCT/JP2018/011569 filed on Mar. 23, 2018, which claims priority benefit of Japanese Patent Application No. JP 2017-156586 filed in the Japan Patent Office on Aug. 14, 2017 and also claims priority benefit of Japanese Patent Application No. JP 2017-074806 filed in the Japan Patent Office on Apr. 4, 2017. Each of the above-referenced applications is hereby incorporated herein by reference in its entirety.

TECHNICAL FIELD

The present disclosure relates to a solid-state imaging device and an electronic apparatus.

BACKGROUND ART

Solid-state imaging devices have been developed each of which has a structure in which a pixel chip provided with a pixel unit, a logic chip mounted with a logic circuit, and the like are stacked. The logic circuit executes various kinds of signal processing related to the operation of the solid-state imaging device. For example, PTL 1 discloses a three-layer stacked solid-state imaging device in which a pixel chip, a logic chip, and a memory chip mounted with a memory circuit are stacked. The memory circuit holds a pixel signal acquired bFigy a pixel unit of the pixel chip.

Note that, when describing the structure of a solid-state imaging device, this specification also refers, as "substrates," to components each including, in combination, a semiconductor substrate having a pixel chip, a logic chip, or a memory chip formed thereon, and a multi-layered wiring layer formed on the semiconductor substrate. The "substrates" are then referred to as "first substrate," "second substrate," "third substrate," ... in order from the upper side (side from which observation light comes) to the lower side of the stack structure to distinguish the substrates from each other. Note that the stacked solid-state imaging device is manufactured by stacking the respective substrates in the wafer state, and then dicing the stacked substrates into a plurality of stacked solid-state imaging devices (i.e., stacked solid-state imaging device chips). This specification assumes for the sake of convenience that the "substrates" may mean the wafer state before dicing, or the chip state after dicing.

CITATION LIST

Patent Literature

PTL 1: Japanese Unexamined Patent Application Publication No. 2014-99582

SUMMARY OF THE INVENTION

Problem to be Solved by the Invention

Several methods have been devised of electrically coupling the respective signal lines included in the upper and lower substrates to each other and electrically coupling the respective power supply lines included in the upper and lower substrates to each other in a stacked solid-state imaging device as described in PTL 1. Examples of the methods include a method of coupling signal lines to each other and coupling power supply lines to each other outside chips through a pad, a method of coupling signal lines to each other and coupling power supply lines to each other inside chips with a TSV (Through-Silicon Via), and the like. It is not necessarily the case that variations of the methods of electrically coupling the signal lines included in the substrates to each other and electrically coupling the power supply lines included in the substrates to each other have been examined in detail so far. Detailed examination of such variations may possibly provide an insight into the appropriate structures to obtain a solid-state imaging device that exhibits higher performance.

Accordingly, the present disclosure proposes a novel and improved solid-state imaging device and electronic apparatus that allow performance to be further improved.

Means for Solving the Problem

According to the present disclosure, there is provided a solid-state imaging device including: a first substrate; a second substrate; and a third substrate that are stacked in this order. The first substrate includes a first semiconductor substrate and a first multi-layered wiring layer stacked on the first semiconductor substrate. The first semiconductor substrate has a pixel unit formed thereon. The pixel unit has pixels arranged thereon. The second substrate includes a second semiconductor substrate and a second multi-layered wiring layer stacked on the second semiconductor substrate. The second semiconductor substrate has a circuit formed thereon. The circuit has a predetermined function. The third substrate includes a third semiconductor substrate and a third multi-layered wiring layer stacked on the third semiconductor substrate. The third semiconductor substrate has a circuit formed thereon. The circuit has a predetermined function. The first substrate and the second substrate are bonded together in a manner that the first multi-layered wiring layer and the second semiconductor substrate are opposed to each other. A first coupling structure for electrically coupling a circuit of the first substrate and the circuit of the second substrate to each other does not include a coupling structure formed from the first substrate as a base over bonding surfaces of the first substrate and the second substrate. Alternatively, the first coupling structure does not exist.

In addition, according to the present disclosure, there is provided an electronic apparatus including a solid-state imaging device that electronically shoots an image of an object to be observed. The solid-state imaging device includes a first substrate, a second substrate, and a third substrate that are stacked in this order. The first substrate includes a first semiconductor substrate and a first multi-layered wiring layer stacked on the first semiconductor substrate. The first semiconductor substrate has a pixel unit formed thereon. The pixel unit has pixels arranged thereon. The second substrate includes a second semiconductor substrate and a second multi-layered wiring layer stacked on the second semiconductor substrate. The second semiconductor substrate has a circuit formed thereon. The circuit has a predetermined function. The third substrate includes a third semiconductor substrate and a third multi-layered wiring layer stacked on the third semiconductor substrate. The third semiconductor substrate has a circuit formed thereon. The circuit has a predetermined function. The first substrate and the second substrate are bonded together in a manner that the first multi-layered wiring layer and the second semiconductor substrate are opposed to each other. A first coupling structure for electrically coupling a circuit of the first substrate and the circuit of the second substrate to each other does not include a coupling structure formed from the first substrate as a base over bonding surfaces of the first substrate and the second substrate. Alternatively, the first coupling structure does not exist.

According to the present disclosure, it is possible to couple the signal lines included in respective stacked substrates to each other and couple the power supply lines included in respective stacked substrates to each other by a more appropriate electrical coupling method.

Effects of the Invention

As described above, according to the present disclosure, it is possible to further improve the performance of the solid-state imaging device. Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 1 is a vertical cross-sectional view of a schematic configuration of a solid-state imaging device according to an embodiment of the present disclosure.

FIG. 2A is a diagram for describing an example of disposition of coupling structures of the solid-state imaging device in a horizontal plane.

FIG. 2B is a diagram for describing an example of the disposition of the coupling structures of the solid-state imaging device in the horizontal plane.

FIG. 2C is a diagram for describing another example of the disposition of the coupling structures of the solid-state imaging device in the horizontal plane.

FIG. 2D is a diagram for describing another example of the disposition of the coupling structures of the solid-state imaging device in the horizontal plane.

FIG. 2E is a diagram for describing still another example of the disposition of the coupling structures of the solid-state imaging device in the horizontal plane.

FIG. 2F is a diagram for describing still another example of the disposition of the coupling structures of the solid-state imaging device in the horizontal plane.

FIG. 3A is a vertical cross-sectional view of a schematic configuration of the solid-state imaging device in which a first substrate and a second substrate are bonded together F-to-F.

FIG. 3B is a vertical cross-sectional view of a schematic configuration of the solid-state imaging device in which the first substrate and the second substrate are bonded together F-to-B.

FIG. 4A is a diagram for describing parasitic capacitance between a PWELL and a power supply wiring line in the solid-state imaging device illustrated in FIG. 3A.

FIG. 4B is a diagram for describing parasitic capacitance between a PWELL and a power supply wiring line in the solid-state imaging device illustrated in FIG. 3B.

FIG. 5A is a diagram schematically illustrating disposition of power supply wiring lines and GND wiring lines in the solid-state imaging device illustrated in FIG. 3A.

FIG. 5B is a diagram schematically illustrating disposition of power supply wiring lines and GND wiring lines in the solid-state imaging device illustrated in FIG. 3B.

FIG. 5C is a diagram illustrating a configuration example of the solid-state imaging device illustrated in FIG. 5A for decreasing impedance.

FIG. 6A is a vertical cross-sectional view of an example of a solid-state imaging device according to a first configuration example.

FIG. 6B is a vertical cross-sectional view of another example of the solid-state imaging device according to the first configuration example.

FIG. 7A is a vertical cross-sectional view of an example of a solid-state imaging device according to a second configuration example.

FIG. 7B is a vertical cross-sectional view of another example of the solid-state imaging device according to the second configuration example.

FIG. 7C is a vertical cross-sectional view of another example of the solid-state imaging device according to the second configuration example.

FIG. 7D is a vertical cross-sectional view of another example of the solid-state imaging device according to the second configuration example.

FIG. 7E is a vertical cross-sectional view of another example of the solid-state imaging device according to the second configuration example.

FIG. 8A is a vertical cross-sectional view of an example of a solid-state imaging device according to a third configuration example.

FIG. 8B is a vertical cross-sectional view of another example of the solid-state imaging device according to the third configuration example.

FIG. 8C is a vertical cross-sectional view of another example of the solid-state imaging device according to the third configuration example.

FIG. 8D is a vertical cross-sectional view of another example of the solid-state imaging device according to the third configuration example.

FIG. 8E is a vertical cross-sectional view of another example of the solid-state imaging device according to the third configuration example.

FIG. 8F is a vertical cross-sectional view of another example of the solid-state imaging device according to the third configuration example.

FIG. 8G is a vertical cross-sectional view of another example of the solid-state imaging device according to the third configuration example.

FIG. 9A is a vertical cross-sectional view of an example of a solid-state imaging device according to a fourth configuration example.

FIG. 9B is a vertical cross-sectional view of another example of the solid-state imaging device according to the fourth configuration example.

FIG. 9C is a vertical cross-sectional view of another example of the solid-state imaging device according to the fourth configuration example.

FIG. 9D is a vertical cross-sectional view of another example of the solid-state imaging device according to the fourth configuration example.

FIG. 9E is a vertical cross-sectional view of another example of the solid-state imaging device according to the fourth configuration example.

FIG. 9F is a vertical cross-sectional view of another example of the solid-state imaging device according to the fourth configuration example.

FIG. 10A is a vertical cross-sectional view of an example of a solid-state imaging device according to a fifth configuration example.

FIG. 10B is a vertical cross-sectional view of another example of the solid-state imaging device according to the fifth configuration example.

FIG. 10C is a vertical cross-sectional view of another example of the solid-state imaging device according to the fifth configuration example.

FIG. 10D is a vertical cross-sectional view of another example of the solid-state imaging device according to the fifth configuration example.

FIG. 10E is a vertical cross-sectional view of another example of the solid-state imaging device according to the fifth configuration example.

FIG. 11A is a vertical cross-sectional view of an example of a solid-state imaging device according to a sixth configuration example.

FIG. 11B is a vertical cross-sectional view of another example of the solid-state imaging device according to the sixth configuration example.

FIG. 11C is a vertical cross-sectional view of another example of the solid-state imaging device according to the sixth configuration example.

FIG. 12A is a vertical cross-sectional view of an example of a solid-state imaging device according to a seventh configuration example.

FIG. 12B is a vertical cross-sectional view of another example of the solid-state imaging device according to the seventh configuration example.

FIG. 12C is a vertical cross-sectional view of another example of the solid-state imaging device according to the seventh configuration example.

FIG. 12D is a vertical cross-sectional view of another example of the solid-state imaging device according to the seventh configuration example.

FIG. 12E is a vertical cross-sectional view of another example of the solid-state imaging device according to the seventh configuration example.

FIG. 12F is a vertical cross-sectional view of another example of the solid-state imaging device according to the seventh configuration example.

FIG. 13A is a vertical cross-sectional view of an example of a solid-state imaging device according to an eighth configuration example.

FIG. 13B is a vertical cross-sectional view of another example of the solid-state imaging device according to the eighth configuration example.

FIG. 13C is a vertical cross-sectional view of another example of the solid-state imaging device according to the eighth configuration example.

FIG. 13D is a vertical cross-sectional view of another example of the solid-state imaging device according to the eighth configuration example.

FIG. 13E is a vertical cross-sectional view of another example of the solid-state imaging device according to the eighth configuration example.

FIG. 14A is a vertical cross-sectional view of an example of a solid-state imaging device according to a ninth configuration example.

FIG. 14B is a vertical cross-sectional view of another example of the solid-state imaging device according to the ninth configuration example.

FIG. 14C is a vertical cross-sectional view of another example of the solid-state imaging device according to the ninth configuration example.

FIG. 14D is a vertical cross-sectional view of another example of the solid-state imaging device according to the ninth configuration example.

FIG. 14E is a vertical cross-sectional view of another example of the solid-state imaging device according to the ninth configuration example.

FIG. 14F is a vertical cross-sectional view of another example of the solid-state imaging device according to the ninth configuration example.

FIG. 15A is a vertical cross-sectional view of an example of a solid-state imaging device according to a tenth configuration example.

FIG. 15B is a vertical cross-sectional view of another example of the solid-state imaging device according to the tenth configuration example.

FIG. 15C is a vertical cross-sectional view of another example of the solid-state imaging device according to the tenth configuration example.

FIG. 15D is a vertical cross-sectional view of another example of the solid-state imaging device according to the tenth configuration example.

FIG. 15E is a vertical cross-sectional view of another example of the solid-state imaging device according to the tenth configuration example.

FIG. 16A is a diagram illustrating appearance of a smartphone that is an example of an electronic apparatus to which solid-state imaging devices 1 to 15E according to the present embodiment may be applied.

FIG. 16B is a diagram illustrating appearance of a digital camera that is another example of the electronic apparatus to which the solid-state imaging devices 1 to 15E according to the present embodiment may be applied.

FIG. 16C is a diagram illustrating appearance of a digital camera that is another example of the electronic apparatus to which the solid-state imaging devices 1 to 15E according to the present embodiment may be applied.

FIG. 17A is a cross-sectional view of a configuration example of a solid-state imaging device to which technology according to the present disclosure may be applied.

FIG. 17B is an explanatory diagram illustrating a schematic configuration of the solid-state imaging device to which the technology according to the present disclosure may be applied.

FIG. 17C is an explanatory diagram illustrating a configuration example of a video camera to which the technology according to the present disclosure may be applied.

FIG. 17D is a view depicting an example of a schematic configuration of an endoscopic surgery system.

FIG. 17E is a block diagram depicting an example of a functional configuration of a camera head and a camera control unit (CCU).

FIG. 17F is a block diagram depicting an example of schematic configuration of a vehicle control system.

FIG. 17G is a diagram of assistance in explaining an example of installation positions of an outside-vehicle information detecting section and an imaging section.

MODES FOR CARRYING OUT THE INVENTION

Hereinafter, (a) preferred embodiment(s) of the present disclosure is described in detail with reference to the appended drawings. It is to be noted that, in this specification and the appended drawings, components that have substantially the same function and configuration are denoted with the same reference numerals, thereby refraining from repeatedly describing these components.

Note that the description proceeds in the following order.
1. Overall Configuration of Solid-state Imaging Device
2. Disposition of Coupling Structures
3. Direction of Second Substrate
3-1. Consideration Based on PWELL Area
3-2. Consideration Based on Power Consumption and Disposition of GND Wiring Lines
4. Variations of Coupling Structures
4-1. First Configuration Example
4-2. Second Configuration Example
4-3. Third Configuration Example
4-4. Fourth Configuration Example
4-5. Fifth Configuration Example
4-6. Sixth Configuration Example
4-7. Seventh Configuration Example
4-8. Eighth Configuration Example
4-9. Ninth Configuration Example
4-10. Tenth Configuration Example
5. Application Examples
6. Supplement

1. Overall Configuration of Solid-state Imaging Device

FIG. 1 is a vertical cross-sectional view of a schematic configuration of a solid-state imaging device according to an embodiment of the present disclosure. As illustrated in FIG. 1, a solid-state imaging device 1 according to the present embodiment is a three-layer stacked solid-state imaging device including a first substrate 110A, a second substrate 110B, and a third substrate 110C that are stacked. In the diagram, a broken line A-A indicates the bonding surfaces of the first substrate 110A and the second substrate 110B, and a broken line B-B indicates the bonding surfaces of the second substrate 110B and the third substrate 110C. The first substrate 110A is a pixel substrate provided with a pixel unit. The second substrate 110B and the third substrate 110C are provided with circuits for performing various kinds of signal processing related to the operation of the solid-state imaging device 1. The second substrate 110B and the third substrate 110C are, for example, a logic substrate provided with a logic circuit or a memory substrate provided with a memory circuit. The solid-state imaging device 1 is a back-illuminated CMOS (Complementary Metal-Oxide-Semiconductor) image sensor that photoelectrically converts, in a pixel unit, light coming from the back surface side of the first substrate 110A, which is described below. Note that the following describes, for the explanation of FIG. 1, a case where the second substrate 110B is a logic substrate, and the third substrate 110C is a memory substrate, as an example.

It is possible in the stacked solid-state imaging device 1 to more appropriately configure circuits to adapt to the functions of the respective substrates. It is thus easier to allow the solid-state imaging device 1 to exhibit higher performance. It is possible in the illustrated configuration example to appropriately configure the pixel unit in the first substrate 110A, and the logic circuit or the memory circuit in the second substrate 110B and the third substrate 110C to adapt to the functions of the respective substrates. This makes it possible to achieve the solid-state imaging device 1 that exhibits high performance.

Note that the following also refers to the stacking direction of the first substrate 110A, the second substrate 110B, and the third substrate 110C as z-axis direction. In addition, the direction in which the first substrate 110A is positioned in the z-axis direction is defined as the positive direction of the z axis. Further, two directions orthogonal to each other on the plane (horizontal plane) vertical to the z-axis direction are also referred to as x-axis direction and y-axis direction. In addition, one of the opposed two surfaces of semiconductor substrates 101, 121, and 131 on the respective substrates in the directions of the substrate principal surfaces is provided with functional components such as transistors or is provided with multi-layered wiring layers 105, 125, and 135, and the following also refers to these surfaces as front surfaces (also referred to as front side surfaces). The multi-layered wiring layers 105, 125, and 135 bring the functional components into operation, and are described below. The semiconductor substrates 101, 121, and 131 are described below. The other surfaces opposed to the front surfaces are also referred to as back surfaces (back side surfaces).

The first substrate 110A mainly includes the semiconductor substrate 101 including, for example, silicon (Si), and the multi-layered wiring layer 105 formed on the semiconductor substrate 101. On the semiconductor substrate 101, a pixel unit having pixels arranged in predetermined disposition, and a pixel signal processing circuit that processes a pixel signal are mainly formed. Each pixel mainly includes a photodiode (PD) that receives light (observation light) from an observation target and performs photoelectric conversion, and a drive circuit including a transistor or the like for reading out an electric signal (pixel signal) corresponding to the observation light acquired by the PD. In the pixel signal processing circuit, for example, various kinds of signal processing such as analog-to-digital conversion (AD conversion) are executed on pixel signals. Note that it is also possible to use, instead of the semiconductor substrate 101, a substrate formed using a material other than a semiconductor for the first substrate 110A. For example, the first substrate 110A may have a mode in which a pixel is formed by forming a film (e.g., general organic photoelectric conversion film) for performing photoelectric conversion on a sapphire substrate, which is a substrate including a material other than a semiconductor.

An insulating film 103 is stacked on the front surface side of the semiconductor substrate 101 on which the pixel unit and the pixel signal processing circuit are formed. The multi-layered wiring layer 105 for transmitting various signals such as a pixel signal and a drive signal for driving a transistor of a drive circuit is formed inside the insulating film 103. The multi-layered wiring layer 105 further includes a power supply wiring line, a ground wiring line (GND wiring line), and the like. The lowermost wiring line of the multi-layered wiring layer 105 may be electrically coupled to the pixel unit or the pixel signal processing circuit by a contact 107 in which an electrically-conductive material such as tungsten (W) is embedded, for example. Note that a wiring layer including a plurality of layers may be actually formed by repeating the formation of an interlayer insulating film having a predetermined thickness and the formation and patterning of a metallic film, but FIG. 1 collectively refers to these interlayer insulating films in the plurality of layers as insulating film 103, and collectively refers to the wiring layers in the plurality of layers as multi-layered wiring layer 105 for the sake of simplicity.

Note that the pad 151 may be formed in the multi-layered wiring layer 105. The pad 151 functions as an external input/output unit (I/O unit) for exchanging various signals with the outside. The pad 151 may be provided along the outer periphery of the chip.

The second substrate 110B is, for example, a logic substrate. The second substrate 110B mainly includes the semiconductor substrate 121 including, for example, Si, and the multi-layered wiring layer 125 formed on the semiconductor substrate 121. A logic circuit is formed on the semiconductor substrate 121. In the logic circuit, various kinds of signal processing related to the operation of the solid-state imaging device 1 are executed. For example, the logic circuit may control a drive signal for driving the pixel unit of the first substrate 110A (i.e., drive control of the pixel unit) or control an exchange of a signal with the outside. Note that it is also possible to use, instead of the semiconductor substrate 121, a substrate formed using a material other than a semiconductor for the second substrate 110B. For example, the second substrate 110B may have a mode in which a circuit is formed by forming, on a sapphire substrate, a semiconductor film (such as a silicon film, for example) on which it is possible to form a circuit element. The sapphire substrate is a substrate including a material other than a semiconductor.

An insulating film 123 is stacked on the front surface side of the semiconductor substrate 121 on which the logic circuit is formed. The multi-layered wiring layer 125 for transmitting various signals related to the operation of the logic circuit is formed inside the insulating film 123. The multi-layered wiring layer 125 further includes a power supply wiring line, a GND wiring line, and the like. The lowermost wiring line of the multi-layered wiring layer 125 may be electrically coupled to the logic circuit by a contact 127 in which an electrically-conductive material such as W is embedded, for example. Note that, similarly to the insulating film 103 and the multi-layered wiring layer 105 of the first substrate 110A, the insulating film 123 of the second substrate 110B may also be a collective term of interlayer insulating films in a plurality of layers, and the multi-layered wiring layer 125 may be a collective term of wiring layers in a plurality of layers.

Note that an insulating film 129 having a predetermined thickness is formed on the back surface side of the semiconductor substrate 121. In addition, the pad 151 may be formed in the multi-layered wiring layer 125. The pad 151 functions as an external input/output unit (I/O unit) for exchanging various signals with the outside. The pad 151 may be provided along the outer periphery of the chip.

The third substrate 110C is, for example, a memory substrate. The third substrate 110C mainly includes the semiconductor substrate 131 including, for example, Si, and the multi-layered wiring layer 135 formed on the semiconductor substrate 131. A memory circuit is formed on the semiconductor substrate 131. The memory circuit temporarily holds a pixel signal acquired by the pixel unit of the first substrate 110A and subjected to AD conversion by the pixel signal processing circuit. Temporarily holding a pixel signal in the memory circuit enables a global shutter, and allows the pixel signal to be read out from the solid-state imaging device 1 to the outside at higher speed. Therefore, even at the time of high-speed shooting, it is possible to shoot an image of higher quality in which distortion is suppressed. Note that it is also possible to use, instead of the semiconductor substrate 131, a substrate formed using a material other than a semiconductor for the third substrate 110C. For example, the third substrate 110C may have a mode in which a circuit is formed by forming, on a sapphire substrate, a film (such as a phase-change material film, for example) on which it is possible to form a memory element. The sapphire substrate is a substrate including a material other than a semiconductor.

An insulating film 133 is stacked on the front surface side of the semiconductor substrate 131 on which the memory circuit is formed. The multi-layered wiring layer 135 for transmitting various signals related to the operation of the memory circuit is formed inside the insulating film 133. The multi-layered wiring layer 135 further includes a power supply wiring line, a GND wiring line, and the like. The lowermost wiring line of the multi-layered wiring layer 135 may be electrically coupled to the memory circuit by a contact 137 in which an electrically-conductive material such as W is embedded, for example. Note that, similarly to the insulating film 103 and the multi-layered wiring layer 105 of the first substrate 110A, the insulating film 133 of the third substrate 110C may also be a collective term of interlayer insulating films in a plurality of layers, and the multi-layered wiring layer 135 may be a collective term of wiring layers in a plurality of layers.

Note that the pad 151 may be formed in the multi-layered wiring layer 135. The pad 151 functions as an I/O unit for exchanging various signals with the outside. The pad 151 may be provided along the outer periphery of the chip.

The first substrate 110A, the second substrate 110B, and the third substrate 110C are each fabricated in the wafer state. Thereafter, these are bonded together, and the respective processes are performed for electrically coupling the respective signal lines included in the first substrate 110A, the second substrate 110B, and the third substrate 110C to each other and electrically coupling the respective power supply lines included in the first substrate 110A, the second substrate 110B, and the third substrate 110C to each other.

Specifically, the second substrate 110B and the third substrate 110C are first bonded together in a manner that the front surface (surface provided with the multi-layered wiring layer 125) of the second substrate 110B in the wafer state and the front surface (surface provided with the multi-layered wiring layer 135) of the third substrate 110C in the wafer state are opposed to each other. Next, after the back surface (surface opposed to the surface provided with the multi-layered wiring layer 125) of the second substrate 110B is thinned, an insulating film 129 having a predetermined thickness is formed on the back surface of the bonded second substrate 110B. The following also refers to such a state in which two substrates are bonded together with the front surfaces opposed to each other as Face to Face (F-to-F).

Next, the stack of the second substrate 110B and the third substrate 110C, and the first substrate 110A in the wafer state are further bonded together in a manner that the back surface (surface opposed to the surface provided with the multi-layered wiring layer 125) of the second substrate 110B and the front surface (surface provided with the multi-layered wiring layer 105) of the first substrate 110A are opposed to each other. The following also refers to such a state in which two substrates are bonded together with the front surface and the back surface opposed to each other as Face to Back (F-to-B).

For the stack structure of the first substrate 110A, the second substrate 110B, and the third substrate 110C formed as described above, a color filter layer 111 (CF layer 111) and a microlens array 113 (ML array 113) are formed on the back surface side of the semiconductor substrate 101 of the first substrate 110A with an insulating film 109 interposed therebetween.

The CF layer 111 includes a plurality of CFs arranged in association with the pixels. The ML array 113 includes a plurality of MLs arranged in association with the pixels. The CF layer 111 and the ML array 113 are formed directly above the pixel unit, and one CF and one ML are provided to the PD of one pixel.

Each CF of the CF layer 111 has, for example, any of red, green, and blue colors. The observation light that has passed through the CF enters the PD of the pixel, and a pixel signal is acquired. This allows a pixel signal of the color component of the color filter to be acquired for an observation target (i.e., this allows for color imaging). Actually, one pixel corresponding to one CF functions as a sub-pixel, and one pixel may include a plurality of sub-pixels. For example, in the solid-state imaging device 1, one pixel may include sub-pixels of four respective colors: a pixel provided with a red CF (i.e., red pixel); a pixel provided with a green CF (i.e., green pixel); a pixel provided with a blue CF (i.e., blue pixel); and a pixel provided with no CF (i.e., white pixel). This specification, however, also refers to a component corresponding to one sub-pixel simply as pixel without distinguishing a sub-pixel from a pixel for the convenience of explanation. Note that a method of arranging CFs is not particularly limited, but any type of arrangement may be adopted such as delta arrangement, stripe arrangement, or diagonal arrangement, or rectangle arrangement.

The ML array 113 is formed to position MLs directly above the respective CFs. Providing the ML array 113 allows the observation light collected by an ML to enter the PD of the pixel via the CF. This makes it possible to obtain the effects of improving the efficiency of collecting the observation light and the sensitivity of the solid-state imaging device 1.

Pad openings 153a, 153b, and 153c are then formed to expose the coupling surfaces of the pads 151 for external inputs. The pads 151 are provided in the multi-layered wiring layer 105 of the first substrate 110A, the multi-layered wiring layer 125 of the second substrate 110B, and the multi-layered wiring layer 135 of the third substrate 110C. The pad opening 153a is formed to penetrate the semiconductor substrate 101 from the back surface side of the first substrate 110A, and reach the coupling surface of the pad 151 provided in the multi-layered wiring layer 105 of the first substrate 110A. The pad opening 153b is formed to penetrate the first substrate 110A from the back surface side of the first substrate 110A, and reach the coupling surface of the pad 151 provided in the multi-layered wiring layer 125 of the second substrate 110B. The pad opening 153c is formed to penetrate the first substrate 110A and the second substrate 110B from the back surface side of the first substrate 110A, and reach the coupling surface of the pad 151 provided in the multi-layered wiring layer 135 of the third substrate 110C. The pads 151 and external circuits are electrically coupled to each other through the pad openings 153a, 153b, and 153c by, for example, wire bonding. That is, various wiring lines in the first substrate 110A, various wiring lines in the second substrate 110B, and various wiring lines in the third substrate 110C may be electrically coupled to each other through the external circuits.

In this way, in the solid-state imaging device 1, various wiring lines in the first substrate 110A, various wiring lines in the second substrate 110B, and various wiring lines in the third substrate 110C may be electrically coupled to each other through the pad 151, and the pad openings 153a, 153b, and 153c. Specifically, in the solid-state imaging device 1, by coupling the pad 151 through an electrical coupling means such as a wiring line or a substrate provided outside the solid-state imaging device 1, the respective signal wiring lines included in the first substrate 110A, the second substrate 110B, and the third substrate 110C for transmitting signals may be electrically coupled to each other over a plurality of substrates. Similarly, the respective power supply wiring lines (further, the GND wiring lines grounded to the ground (GND)) included in the first substrate 110A, the second substrate 110B, and the third substrate 110C for supplying power may be electrically coupled to each other over a plurality of substrates.

Note that the following may also sometimes refer to various wiring lines such as signal wiring lines, power supply wiring lines, and GND wiring lines simply as "wiring lines" for the sake of simplification. Note that this specification also collectively refers, as coupling structures, to structures such as the pads 151, and the pad openings 153a, 153b, and 153c illustrated in FIG. 1 that electrically couple various wiring lines included in the substrates to each other. Although not used in the configuration illustrated in FIG. 1, a TSV (via provided by penetrating at least one of the semiconductor substrate 101, 121, or 131 from one surface of any of the first substrate 110A, the second substrate 110B, and the third substrate 110C) and an electrode junction structure (structure in which the electrodes formed on the respective bonding surfaces of the first substrate 110A and the second substrate 110B, or the respective bonding surfaces of the second substrate 110B and the third substrate 110C are joined in direct contact with each other) described below are also included in the coupling structures. However, as described above, in the present embodiment, it is also possible to use a material other than a semiconductor such as silicon for the semiconductor substrates 101, 121, and 131. Accordingly, the TSV in this specification represents what is provided by penetrating a substrate, and a material of a substrate is not particularly limited.

A TSV is a structure that is provided by penetrating at least one or more of the semiconductor substrate 101, 121, or 131 from one surface side of any of the first substrate 110A, the second substrate 110B, and the third substrate 110C, and contacts wiring lines (e.g., signal lines and power supply lines) included in the respective substrates to electrically couple these respective wiring lines to each other. TSVs are divided into, for example, a twin contact structure in which the TSVs are each formed by exposing wiring lines in multi-layered wiring layers different from each other by using two respective through holes, and embedding electrically-conductive materials in the two through holes, and a shared contact structure in which the TSVs are each formed by exposing side surfaces and upper surfaces of wiring lines in a plurality of respective multi-layered wiring layers by using one through hole, and embedding an electrically-conductive material in the one through hole. In addition, the electrode junction structure is a structure formed, for example, by performing heat treatment in the state in which an electrode formed in the uppermost layer of the multi-layered wiring layer of one of the substrates and an electrode formed in the uppermost layer of the multi-layered wiring layer of the other substrate are in direct contact with each other, and joining the electrodes to each other. Electrode junction structures electrically couple the respective signal lines included in the substrates having electrode junction structures formed on the bonding surfaces to each other and electrically couple the respective power supply lines included in the substrates to each other.

However, in the solid-state imaging device 1 according to the present embodiment, a coupling structure for electrically coupling the respective signal lines of the first substrate 110A and the second substrate 110B to each other and electrically coupling the respective power supply lines of the first substrate 110A and the second substrate 110B to each other does not include a coupling structure (e.g., TSV and electrode junction structures described below) over the bonding surfaces of the first substrate 110A and the second substrate 110B. That is, in the solid-state imaging device 1, the respective signal lines of the first substrate 110A and the second substrate 110B may be electrically coupled to each other and the respective power supply lines of the first substrate 110A and the second substrate 110B may be electrically coupled to each other through the pad 151, the pad openings 153a, 153b, and 153c, and another external circuit coupled by wire bonding or the like. In addition, in the solid-state imaging device 1, there may be even a case where no coupling structure exists for electrically coupling the respective signal lines of the first substrate 110A and the second substrate 110B to each other and electrically coupling the respective power supply lines of the first substrate 110A and the second substrate 110B to each other. In such a case, the solid-state imaging device 1 is provided with a coupling structure that electrically couples the respective signal lines of the second substrate 110B and the third substrate 110C to each other and electrically couples the respective power supply lines of the second substrate 110B and the third substrate 110C to each other, and a coupling structure that electrically couples the respective signal lines of the first substrate 110A and the third substrate 110C to each other and electrically couples the respective power supply lines of the first substrate 110A and the third substrate 110C to each other, thereby allowing the respective signal lines of the first substrate 110A, the second substrate 110B, and the third substrate 110C to be electrically coupled to each other and allowing the respective power supply lines of the first substrate 110A, the second substrate 110B, and the third substrate 110C to be electrically coupled to each other.

Note that the multi-layered wiring layer 105 of the first substrate 110A, the multi-layered wiring layer 125 of the second substrate 110B, and the multi-layered wiring layer 135 of the third substrate 110C include a plurality of stacked first metal wiring layers 141 each including a first metal having relatively low resistance. The first metal is, for example, copper (Cu). The use of a Cu wiring line makes it possible to exchange signals at higher speed. However, the pads 151 may each include a second metal that is different from the first metal, from the perspective of the adhesiveness and the like to wires for wire bonding. Accordingly, the multi-layered wiring layer 105 of the first substrate 110A, the multi-layered wiring layer 125 of the second substrate 110B, and the multi-layered wiring layer 135 of the third substrate 110C may each include, in the same layer as that of the pad 151, a second metal wiring layer 143 including the second metal. The second metal is, for example, aluminum (Al). In addition to the pad 151, an Al wiring line may be used, for example, as a power supply wiring line or a ground wiring line that is generally formed as a wide wiring line. In addition, the contacts 107, 127, and 137 may each include a third metal different from the first metal and the second metal in consideration of fillability or the like at the time of film formation. The third metal is, for example, tungsten (W). A W via may be formed as a via having a smaller opening because of high fillability at the time of film formation. The use of a W via makes it possible to easily form fine pitch vias provided in finer size and at finer intervals, for example.

Note that the first metal, the second metal, and the third metal are not limited to Cu, Al, or W exemplified above. As the first metal, the second metal, and the third metal, various metals may be used. Alternatively, the respective wiring layers included in the multi-layered wiring layers 105, 125, and 135 may each include an electrically-conductive material other than metal. It is sufficient if these wiring layers each include an electrically-conductive material. The materials thereof are not limited. Alternatively, instead of using two types of electrically-conductive materials, all the wiring layers including the pads 151 of the multi-layered wiring layers 115, 125, and 135 may include the same electrically-conductive material.

Note that, in the present embodiment, a TSV described below, and an electrode and a via included in an electrode junction structure may each include the first metal (e.g., Cu). For example, in a case where the first metal is Cu, these structures may be formed by a single damascene method or a dual damascene method. The present embodiment is not, however, limited to the example. A portion or all of these structures may include another metal different from both the first metal and the second metal, or another non-metallic electrically-conductive material.

Although not illustrated in FIG. 1 or some of the respective subsequent diagrams, the solid-state imaging device 1 includes insulating materials for electrically insulating the first metal, the second metal, and the like from the semiconductor substrates 101, 121, and 131 in portions where electrically-conductive materials such as the first metal and the second metal are in contact with the semiconductor substrates 101, 121, and 131. The insulating materials may include various known materials such as $SiO_2$ or SiN, for example. The insulating materials may be interposed between the electrically-conductive materials and the semiconductor substrates 101, 121, and 131, or may exist inside the semiconductor substrates 101, 121, and 131 away from the portions where the electrically-conductive materials are in contact with the semiconductor substrates 101, 121, and 131. For example, with respect to the TSV 157 described below, insulating materials may exist between the inner walls of through holes provided in the semiconductor substrates 101, 121, and 131 and electrically-conductive materials embedded in the through holes (i.e., films including the insulating materials may be formed on the inner walls of the through holes). Alternatively, with respect to the TSV 157 described below, insulating materials may exist at portions inside the semiconductor substrates 101, 121, and 131, and away from through holes provided in the semiconductor substrates 101, 121, and 131 by predetermined distances in the direction of the horizontal plane.

After being stacked in the wafer state in this way, the processed stack structure is diced for each solid-state imaging device 1, thereby completing the solid-state imaging device 1.

The schematic configuration of the solid-state imaging device 1 has been described above. Note that the specific configurations of the respective components (pixel unit and pixel signal processing circuit provided to the first substrate 110A, logic circuit provided to the second substrate 110B, and memory circuit provided to the third substrate 110C), the multi-layered wiring layers 105, 125, and 135, and the insulating films 103, 109, 123, 129, and 133 that are formed on the semiconductor substrates 101, 121, and 131 of the respective substrates, and formation methods thereof may be similar to various known configurations and methods. The specific configurations and formation methods are not thus described here in detail.

For example, it is sufficient if the insulating films 103, 109, 123, 129, and 133 include materials having insulating properties. The materials thereof are not limited. The insulating films 103, 109, 123, 129, and 133 may include, for example, silicon oxide (SiO$_2$), silicon nitride (SiN), or the like. In addition, each of the insulating films 103, 109, 123, 129, and 133 does not have to include one type of insulating material, but may include a plurality of types of stacked insulating materials. In addition, for example, to transmit signals at higher speed, Low-k materials having insulating properties and low dielectric constants may be used for the insulating films 103, 123, and 133. The use of Low-k materials allows the parasitic capacitance between wiring lines to be decreased, which makes it possible to further contribute to signal transmission at higher speed.

As the other specific configurations of the respective components formed on the semiconductor substrates 101, 121, and 131 of the respective substrates, the multi-layered wiring layers 105, 125, and 135, and the insulating films 103, 109, 123, 129, and 133, and the other formation methods thereof, it is possible to apply, as appropriate, what is described, for example, in PTL 1. PTL1 is a prior application filed by the applicant of the present application.

In addition, in the configuration example described above, a pixel signal processing circuit that performs signal processing such as AD conversion on a pixel signal is mounted on the first substrate 110A, but the present embodiment is not limited to the example. A portion or all of the functions of the pixel signal processing circuit may be provided to the second substrate 110B. This case may achieve a solid-state imaging device that performs so-called pixel-by-pixel analog-to-digital conversion (pixel ADC). In the pixel ADC, a pixel signal acquired by a PD provided to each pixel is transmitted to the pixel signal processing circuit of the second substrate 110B for each pixel, and AD conversion is performed for each pixel, for example, in a pixel array in which a plurality of pixels is arrayed in both a column direction and a row direction. This allows pixel signals to be subjected to AD conversion and read out at higher speed as compared with a solid-state imaging device that includes one AD conversion circuit for each column of the pixel array, and performs general column-by-column analog/digital conversion (column ADC). In the column ADC, a plurality of pixels included in a column is sequentially subjected to AD conversion. Note that, in a case where the solid-state imaging device 1 is configured to be able to execute the pixel ADC, each pixel is provided with an electrode junction structure that electrically couples the respective signal lines of the first substrate 110A and the second substrate 110B to each other, and electrically couples the respective power supply lines of the first substrate 110A and the second substrate 110B to each other.

In addition, in the configuration example described above, a case where the second substrate 110B is a logic substrate, and the third substrate 110C is a memory substrate has been described. The present embodiment is not, however, limited to the example. It is sufficient if the second substrate 110B and the third substrate 110C are substrates having functions other than that of the pixel substrate, and the functions may be optionally determined. For example, the solid-state imaging device 1 does not have to include any memory circuit. In this case, for example, both the second substrate 110B and the third substrate 110C may function as logic substrates. Alternatively, a logic circuit and a memory circuit may be distributed in the second substrate 110B and the third substrate 110C, and these substrates may cooperate to achieve the functions of a logic substrate and a memory substrate. Alternatively, the second substrate 110B may be a memory substrate, and the third substrate 110C may be a logic substrate.

In addition, in the configuration example described above, Si substrates are used as the semiconductor substrates 101, 121, and 131 on the respective substrates, but the present embodiment is not limited to the example. As the semiconductor substrates 101, 121, and 131, other types of semiconductor substrates may be used such as gallium arsenide (GaAs) substrates or silicon carbide (SiC) substrates, for example. Further, instead of the semiconductor substrates 101, 121, and 131, substrates may be used such as sapphire substrates each including a non-semiconductor material.

2. Disposition of Coupling Structures

As described with reference to FIG. 1, in the solid-state imaging device 1, the pads 151 provided in any of the first substrate 110A, the second substrate 110B, and the third substrate 110C serve as coupling structures to be coupled to each other by electrical coupling means such as wiring lines or substrates provided outside the solid-state imaging device 1. Accordingly, the respective signal lines included in the first substrate 110A, the second substrate 110B, and the third substrate 110C may be electrically coupled to each other and the respective power supply lines included in the first substrate 110A, the second substrate 110B, and the third substrate 110C may be electrically coupled to each other over a plurality of substrates through these coupling structures. The disposition of these coupling structures in the horizontal plane may be determined as appropriate to improve the performance of the entire solid-state imaging device 1 by considering the configuration, performance, and the like of each of the substrates (chips). Several variations of the disposition of the coupling structures of the solid-state imaging device 1 in the horizontal plane are now described.

Each of FIGS. 2A and 2B are diagrams for describing an example of the disposition of the coupling structures of the solid-state imaging device 1 in the horizontal plane. FIGS. 2A and 2B each illustrate the disposition of the coupling structures in the solid-state imaging device 1 in a case where a pixel signal processing circuit that performs processing such as AD conversion on a pixel signal is mounted on the first substrate 110A, for example.

FIG. 2A schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line in a simulated manner, and electrical coupling between the lower surface (surface opposed to the third substrate 110C) of the second substrate 110B and the upper surface (surface opposed to the second substrate 1101B) of the third substrate 110C through coupling structures is indicated by a solid line in a simulated manner.

On the upper surface of the first substrate 110A, the positions of a pixel unit 206 and a coupling structure 201 are illustrated. The coupling structure 201 functions as an external input/output unit (I/O unit) for exchanging various signals such as a power supply signal and a GND signal with the outside. Specifically, the coupling structure 201 may be the pad 151 provided to the upper surface of the first substrate 110A. Alternatively, as illustrated in FIG. 1, in a case where the pad 151 is embedded in the multi-layered wiring layer 105 of the first substrate 110A, the multi-layered wiring layer 125 of the second substrate 1101B, or the multi-layered wiring layer 135 of the third substrate 110C, the coupling structure 201 may be a pad opening 153 provided to expose the coupling surface of the pad 151 for an external input. As illustrated in FIG. 2A, the first substrate 110A is provided with the pixel unit 206 in the middle of the chip, and the coupling structures 201 included in the I/O unit are disposed around the pixel unit 206 (i.e., along the outer periphery of the chip). In addition, although not illustrated, pixel signal processing circuits may also be disposed around the pixel unit 206.

FIG. 2B schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. These coupling structures 202 to 205 may be TSVs or electrode junction structures provided between the substrates. Alternatively, in a case where the pad 151 is embedded in the multi-layered wiring layer 125 of the second substrate 110B or the multi-layered wiring layer 135 of the third substrate 110C, it may be the pad opening 153, out of the coupling structures 202 to 205, that is positioned directly below the coupling structure 201. The pad opening 153 is provided to expose the coupling surface of the pad 151 for an external input. Note that FIG. 2B illustrates the coupling structures 202 to 205 in accordance with the forms of straight lines indicating electrical coupling illustrated in FIG. 2A. That is, the coupling structures 202 on the lower surface of the first substrate 110A and the coupling structures 203 on the upper surface of the second substrate 110B are indicated by broken lines, and the coupling structures 204 on the lower surface of the second substrate 110B and the coupling structures 205 on the upper surface of the third substrate 110C are indicated by solid lines.

As described above, in the illustrated configuration example, pixel signal processing circuits are mounted around the pixel unit 206 of the first substrate 110A. Therefore, pixel signals acquired by the pixel unit 206 are subjected to processing such as AD conversion by the pixel signal processing circuits on the first substrate 110A, and then transmitted to the second substrate 110B. In addition, as described above, the coupling structures 201 included in the I/O unit are also disposed around the pixel unit 206 of the first substrate 110A of the first substrate 110A. Therefore, as illustrated in FIG. 2B, the coupling structures 202 on the lower surface of the first substrate 110A are disposed along the outer periphery of the chip in association with the regions where the pixel signal processing circuits and the I/O units exist in order to electrically couple the pixel signal processing circuits and the I/O units to wiring lines included in the second substrate 110B. In addition, the coupling structures 203 on the upper surface of the second substrate 110B are also disposed accordingly along the outer periphery of the chip.

Meanwhile, a logic circuit or a memory circuit mounted on the second substrate 110B and the third substrate 110C may be formed on the entire surface of the chip. The coupling structures 204 on the lower surface of the second substrate 110B and the coupling structures 205 on the upper surface of the third substrate 110C are thus disposed over the entire surface of the chips in association with the position at which the logic circuit or the memory circuit is mounted, as illustrated in FIG. 2B.

Each of FIGS. 2C and 2D are diagrams for describing another example of the disposition of the coupling structures of the solid-state imaging device 1 in the horizontal plane. FIGS. 2C and 2D each illustrate the disposition of coupling structures in a case where, for example, the solid-state imaging device 1 is configured to be able to execute pixel ADC. In this case, a pixel signal processing circuit is mounted on not the first substrate 110A, but the second substrate 110B.

Similarly to FIG. 2A, FIG. 2C schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line or a dotted line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line in a simulated manner. Among the lines indicating electrical coupling between the lower surface of the first substrate 110A and the upper surface of the second substrate 110B, a broken line indicates electrical coupling related to an I/O unit, for example, which also exists in FIG. 2A, and a dotted line indicates electrical coupling related to pixel ADC, which does not exist in FIG. 2A.

Similarly to FIG. 2B, FIG. 2D schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. Note that FIG. 2D illustrates the coupling structures 202 to 205 in accordance with the forms of straight lines indicating electrical coupling illustrated in FIG. 2C. That is, among the coupling structures 202 on the lower surface of the first substrate 110A or the coupling structures 203 on the upper surface of the second substrate 110B, those that correspond to, for example, electrical coupling related to I/O units, which also exists in FIG. 2A, are indicated by broken lines, and those that may correspond to electrical coupling related to pixel ADC are indicated by dotted lines. In contrast, the coupling structures 204 on the lower surface of the second substrate 110B and the coupling structures 205 on the upper surface of the third substrate 110C are indicated by solid lines.

As described above, in the illustrated configuration example, a pixel signal processing circuit is mounted on the second substrate 110B, and the pixel signal processing circuit is configured to be able to perform pixel ADC. That is, a pixel signal acquired by each pixel of the pixel unit 206 is transmitted to the pixel signal processing circuit mounted on the second substrate 110B directly below for each pixel, and the pixel signal processing circuit performs processing such as AD conversion. As illustrated in FIGS. 2C and 2D, in the configuration example, the coupling structures 202 on the lower surface of the first substrate 110A are thus disposed along the outer periphery of the chip (coupling structures 202 indicated by the broken lines in the diagram) in association with the regions where the I/O units exist in order to transmit signals from the I/O units to the second substrate 110B, and are disposed over the entire region where the pixel unit 206 exists (coupling structures 202 indicated by the dotted lines in the diagram) in order to transmit a pixel signal from each pixel of the pixel unit 206 to the second substrate 110B.

The respective signal lines of the second substrate 110B and the third substrate 110C are electrically coupled to each other, and the respective power supply lines of the second substrate 110B and the third substrate 110C are electrically coupled to each other similarly to the configuration examples illustrated in FIGS. 2A and 2B. As illustrated in FIGS. 2C and 2D, the coupling structures 204 on the lower surface of the second substrate 110B and the coupling structures 205 on the upper surface of the third substrate 110C are thus disposed over the entire surface of the chips.

Each of FIGS. 2E and 2F are diagrams for describing still another example of the disposition of the coupling structures of the solid-state imaging device 1 in the horizontal plane. FIGS. 2E and 2F each illustrate the disposition of coupling structures in a case where, for example, a memory circuit is mounted on the second substrate 110B.

Similarly to FIG. 2A, FIG. 2E schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line or a dotted line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line or a dotted line in a simulated manner. Among the lines indicating electrical coupling between the lower surface of the first substrate 110A and the upper surface of the second substrate 110B, a broken line indicates electrical coupling related to an I/O unit, for example, which also exists in FIG. 2A, and a dotted line indicates electrical coupling related to a memory circuit, which does not exist in FIG. 2A. In addition, among the lines indicating electrical coupling between the lower surface of the second substrate 110B and the upper surface of the third substrate 110C, the solid lines indicate electrical coupling, which also exists in FIG. 2A, related to signals that are not directly related to the operation of a memory circuit, for example, and the dotted lines indicate electrical coupling, which does not exist in FIG. 2A, related to a memory circuit.

Similarly to FIG. 2B, FIG. 2F schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. Note that FIG. 2F illustrates the coupling structures 202 to 205 in accordance with the forms of straight lines indicating electrical coupling illustrated in FIG. 2E. That is, among the coupling structures 202 on the lower surface of the first substrate 110A or the coupling structures 203 on the upper surface of the second substrate 110B, those that correspond to, for example, electrical coupling related to I/O units, which also exists in FIG. 2A, are indicated by broken lines, and those that may correspond to electrical coupling related to a memory circuit are indicated by dotted lines. In addition, among the coupling structures 204 on the lower surface of the second substrate 110B and the coupling structures 205 on the upper surface of the third substrate 110C, those that correspond to electrical coupling, which exists in FIG. 2A, related to signals that are not directly related to the operation of a memory circuit, for example, are indicated by solid lines, and those that may correspond to electrical coupling related to a memory circuit are indicated by dotted lines.

As described above, in the illustrated configuration example, a memory circuit is mounted on the second substrate 110B. In this case, a pixel signal processing circuit is mounted on the first substrate 110A, and a pixel signal acquired by the pixel unit 206 and subjected to AD conversion by the pixel signal processing circuit of the first substrate 110A may be transmitted to the memory circuit of the second substrate 110B and held in the memory circuit. To read out the pixel signal held in the memory circuit of the second substrate 110B, for example, to the outside, signals are then transmitted between the memory circuit of the second substrate 110B and a logic circuit of the third substrate 110C.

Therefore, in the configuration example, as the coupling structures 202 on the lower surface of the first substrate 110A, the coupling structures 202 are disposed along the outer periphery of the chip (coupling structures 202 indicated by the broken lines in the diagram) in association with the regions where I/O units and pixel signal processing circuits are mounted in order to transmit signals from the I/O units and the pixel signal processing circuits to wiring lines included in the second substrate 110B, and the coupling structures 202 are disposed (coupling structures 202 indicated by the dotted lines in the diagram) for transmitting the pixel signals subjected to AD conversion to a memory circuit of the second substrate 110B. At this time, in order to equalize the delay times, it is desirable that the wiring lengths of the transmission paths of the pixel signals from the first substrate 110A to the memory circuit of the second substrate 110B and the wiring lengths of the transmission paths of the signals between the memory circuit of the second substrate 110B and a logic circuit of the third substrate 110C be each equal as much as possible. Thus, for example, as illustrated in FIG. 2F, the coupling structures 202 to 205 for exchanging signals between the first substrate 110A and the memory circuit of the second substrate 110B and between the memory circuit of the second substrate 110B and the third substrate 110C may be provided to concentrate in the vicinity of the middle of the horizontal plane. However, as long as it is possible to make the wiring lengths substantially uniform, the coupling structures 202 to 205 do not necessarily have to be provided in the vicinity of the middle of the horizontal plane as in the illustrated example.

Several examples of the disposition of coupling structures of the solid-state imaging device 1 in the horizontal plane have been described above. Note that the present embodiment is not limited to the examples described above. Components mounted on the respective substrates of the solid-state imaging device 1 may be determined as appropriate, and the disposition of coupling structures of the solid-state imaging device 1 in the horizontal plane may also be determined as appropriate in accordance with the components. As components mounted on each substrate and the corresponding disposition of coupling structures in the horizontal plane, various known components and disposition may be applied. In addition, in the examples illustrated in FIGS. 2A, 2B, 2C, 2D, 2E, and 2F, the coupling structures 201 included in I/O units are disposed along three sides of the outer periphery of the chip, but the present embodiment is not limited to the examples. Various known disposition may also be applied as the disposition of I/O units. For example, the coupling structures 201 included in I/O units may be disposed along one side, two sides, or four sides of the outer periphery of the chip.

3. Direction of Second Substrate

In the configuration example illustrated in FIG. 1, in the solid-state imaging device 1, the first substrate 110A and the second substrate 110B are bonded together F-to-B (i.e., the back surface side of the second substrate 110B is opposed to the front surface side of the first substrate 110A). Meanwhile, the solid-state imaging device 1 may include the first substrate 110A and the second substrate 110B that are bonded together F-to-F (i.e., the front surface side of the second substrate 110B may be opposed to the front surface side of the first substrate 110A).

The direction of the second substrate 110B may be determined as appropriate to improve the performance of the entire solid-state imaging device 1 by considering, for example, the configuration, performance, and the like of each of the substrates (each of the chips). Here, two concepts for determining the direction of the second substrate 110B are described as an example.

(3-1. Consideration Based on PWELL Area)

FIG. 3A is a vertical cross-sectional view of a schematic configuration of a solid-state imaging device 1a in which the first substrate 110A and the second substrate 110B are bonded together F-to-F unlike the configuration illustrated in FIG. 1. FIG. 3B is a vertical cross-sectional view of a schematic configuration of the solid-state imaging device 1 in which the first substrate 110A and the second substrate 110B are bonded together F-to-B, similarly to the configuration illustrated in FIG. 1. The configuration of the solid-state imaging device 1a is similar to that of the solid-state imaging device 1 illustrated in FIG. 1 except that the direction of the second substrate 110B is reversed.

In FIGS. 3A and 3B, the functions (signal wiring lines, GND wiring lines, or power supply wiring lines) of the respective wiring lines included in the multi-layered wiring layers 105, 125, and 135 are represented by hatching illustrated in the legends, and the hatching representing the functions of the respective wiring lines is expressed by being superimposed on the hatching of the wiring lines illustrated in FIG. 1. As illustrated, in the solid-state imaging devices 1 and 1a, terminals (corresponding to the pads 151 described above) for drawing out the signal wiring lines, the GND wiring lines, and the power supply wiring lines to the outside are provided along the outer periphery of the chips. These respective terminals are provided in pairs at positions sandwiching the pixel unit 206 in the horizontal plane. Therefore, inside the solid-state imaging devices 1 and 1a, the signal wiring lines, the GND wiring lines, and the power supply wiring lines extend to couple these terminals to each other, and spread in the horizontal plane.

In FIGS. 3A and 3B, "P" is attached to PWELLs, and "N" is attached to NWELLs provided to the first substrate 110A, the second substrate 110B, and the third substrate 110C. For example, in the illustrated configuration, the photodiodes included in the respective pixels of the pixel unit are photodiodes in which N-type diffused regions are formed in the PWELLs in order to photoelectrically convert incident light and extract electrons. In addition, a transistor included in each pixel is an N-type MOS transistor in order to read out an electron generated in the photodiode. Therefore, the WELLs of the pixel unit are PWELLs. In contrast, a logic circuit and a memory circuit provided to the second substrate 110B and the third substrate 110C include CMOS circuits, and PMOSs and NMOSs may be thus mixed. Accordingly, PWELLs and NWELLs exist that are substantially the same in area, for example. Therefore, in the illustrated configuration example, the first substrate 110A has a larger PWELL area than the second substrate 110B and the third substrate 110C.

Here, in the solid-state imaging devices 1 and 1a, a ground potential may be imparted to a PWELL. Thus, any configuration in which a PWELL and a power supply wiring line are opposed to each other with an insulator interposed therebetween causes parasitic capacitance to be formed therebetween.

The parasitic capacitance formed between a PWELL and a power supply wiring line is described with reference to FIGS. 4A and 4B. FIG. 4A is a diagram for describing the parasitic capacitance between a PWELL and a power supply wiring line in the solid-state imaging device 1a illustrated in FIG. 3A. FIG. 4A simplifies the solid-state imaging device 1a illustrated in FIG. 3A, and illustrates, similarly to FIG. 3A, the functions of the respective wiring lines by hatching superimposed on the hatching of the wiring lines illustrated in FIG. 1. As illustrated in FIG. 4A, in the solid-state imaging device 1a, the first substrate 110A and the second substrate 110B are bonded together F-to-F. The PWELLs of the pixel unit of the first substrate 110A and the power supply wiring lines in the multi-layered wiring layer 125 of the second substrate 110B are therefore opposed to each other with insulators interposed therebetween. The insulators are included in the insulating films 103 and 123. This causes parasitic capacitance to be formed therebetween (FIG. 4A illustrates the parasitic capacitance by a two-dot chain line in a simulated manner).

Meanwhile, FIG. 4B is a diagram for describing the parasitic capacitance between a PWELL and a power supply wiring line in the solid-state imaging device 1 illustrated in FIG. 3B. FIG. 4B simplifies the solid-state imaging device 1a illustrated in FIG. 3B, and illustrates, similarly to FIG. 3B, the functions of the respective wiring lines by hatching superimposed on the hatching of the wiring lines illustrated in FIG. 1. As illustrated in FIG. 4B, in the solid-state imaging device 1, the second substrate 110B and the third substrate 110C are bonded together F-to-F. The PWELLs of the logic circuit or memory circuit of the third substrate 110C and the power supply wiring lines in the multi-layered wiring layer 125 of the second substrate 110B are therefore opposed to each other with insulators interposed therebetween. The insulators are included in the insulating films 123 and 133. This causes parasitic capacitance to be formed therebetween (FIG. 4B illustrates the parasitic capacitance by a two-dot chain line in a simulated manner).

The parasitic capacitance described above is considered to increase as the PWELL area increases. This causes larger parasitic capacitance in the configuration illustrated in FIG. 4A in which the first substrate 110A and the second substrate 110B are bonded together F-to-F than in the configuration illustrated in FIG. 4B in which the second substrate 110B and the third substrate 110C are bonded together F-to-F among the configuration examples illustrated in FIGS. 4A and 4B.

If the parasitic capacitance related to the power supply wiring lines in the second substrate 110B is large, the impedance of the current paths between the power supply and the GND in the second substrate 110B is decreased. It is thus possible to further stabilize the power supply system in the second substrate 110B. Specifically, for example, even in a case where the power consumption fluctuates in accordance with fluctuations in the operation of the circuits on the second substrate 110B, fluctuations in the power supply levels caused by the fluctuations in the power consumption may be suppressed. Even in a case where the circuits related to the second substrate 110B are operated at high speed, it is thus possible to further stabilize the operation, and improve the performance of the entire solid-state imaging device 1a.

In this way, when PWELL area is brought into focus, in the configuration examples illustrated in FIGS. 3A, 3B, 4A, and 4B, the solid-state imaging device 1a in which the first substrate 110A and the second substrate 110B are bonded together F-to-F forms larger parasitic capacitance with respect to the power supply wiring lines of the second substrate 110B than the solid-state imaging device 1 in which the first substrate 110A and the second substrate 110B are bonded together F-to-B does, making it possible to achieve higher stability at the time of high-speed operation. That is, it is possible to say that the solid-state imaging device 1a has a more preferable configuration.

Some designs of the respective substrates may, however, cause the third substrate 110C to have a larger PWELL area than that of the first substrate 110A. In this case, the configuration of the solid-state imaging device 1 in which larger parasitic capacitance is formed between the power supply wiring lines of the second substrate 110B and the PWELLs of the third substrate 110C is considered to make it possible to obtain higher stability at the time of high-speed operation than the solid-state imaging device 1a does.

In summary, when considering the direction of the second substrate 110B on the basis of the PWELL area, it is preferable that the solid-state imaging device 1a be configured in a manner that the front surface side of the second substrate 110B is opposed to the front surface side of the first substrate 110A in a case where the PWELL area of the first substrate 110A is larger than the PWELL area of the third substrate 110C. That is, it is preferable that the solid-state imaging device 1a be configured in a manner that the first substrate 110A and the second substrate 110B are bonded together F-to-F. Conversely, it is preferable that the solid-state imaging device 1 be configured in a manner that the front surface side of the second substrate 110B is opposed to the front surface side of the third substrate 110C in a case where the PWELL area of the third substrate 110C is larger than the PWELL area of the first substrate 110A. That is, it is preferable that the solid-state imaging device 1 be configured in a manner that the first substrate 110A and the second substrate 110B are bonded together F-to-B.

In the present embodiment, the direction of the second substrate 110B may be determined from such a viewpoint based on PWELL area. The solid-state imaging devices 1 to 15E according to the present embodiment illustrated in FIGS. 1, 6A, 6B, 7A, 7B, 7C, 7D, 7E, 8A, 8B, 8C, 8D, 8E, 8F, 8G, 9A, 9B, 9C, 9D, 9E, 9F, 10A, 10B, 10C, 10D, 10E, 11A, 11B, 11C, 12A, 12B, 12C, 12D, 12E, 12F, 13A, 13B, 13C, 13D, 13E, 14A, 14B, 14C, 14D, 14E, 14F, 15A, 15B, 15C, 15D, and 15E described below are each configured, for example, to have the PWELL area of the first substrate 110A smaller than the PWELL area of the third substrate 110C, and have the first substrate 110A and the second substrate 110B accordingly bonded together F-to-B. The solid-state imaging devices 1 to 15E thus make it possible to obtain high operation stability even at the time of high-speed operation.

Note that examples of a case where the PWELL area of the first substrate 110A is larger than the PWELL area of the third substrate 110C include a case where only a pixel unit including, in a PWELL, a photodiode that photoelectrically converts incident light and extracts an electron and an NMOS transistor for reading out an electron from the photodiode is mounted on the first substrate 110A, and various circuits (such as a pixel signal processing circuit, a logic circuit, and a memory circuit) are mounted on the second substrate 110B and the third substrate 110C. Meanwhile, examples of a case in which the PWELL area of the third substrate 110C is larger than the PWELL area of the first substrate 110A include a case in which a pixel unit and various circuits are mounted together on the first substrate 110A and the area of the first substrate 110A occupied by the various circuits is relatively large.

(3-2. Consideration Based on Power Consumption and Disposition of GND Wiring Lines)

The above focuses on PWELL area for the solid-state imaging device 1a illustrated in FIG. 3A and the solid-state imaging device 1 illustrated in FIG. 3B, but power consumption and the disposition of GND wiring lines in each substrate are now brought into focus.

FIG. 5A is a diagram schematically illustrating the disposition of power supply wiring lines and GND wiring lines in the solid-state imaging device 1a illustrated in FIG. 3A. FIG. 5B is a diagram schematically illustrating the disposition of power supply wiring lines and GND wiring lines in the solid-state imaging device 1 illustrated in FIG. 3B. FIGS. 5A and 5B simply illustrate the structures of the solid-state imaging devices 1 and 1a, and represent the schematic disposition of power supply wiring lines and GND wiring lines by illustrating the power supply wiring lines by two-dot chain lines and illustrating the GND wiring lines by one-dot chain lines. In addition, the size of the arrows in the diagrams represents the amount of currents flowing through the power supply wiring lines and the GND wiring lines in a simulated manner.

It is possible as illustrated in FIGS. 5A and 5B to consider that the power supply wiring lines mainly include vertical power supply wiring lines 303 extending in the z-axis direction from power supply terminals (VCCs) provided to the upper surface of the first substrate 110A (i.e., upper surfaces of the solid-state imaging devices 1 and 1a), and horizontal power supply wiring lines 304 extending in the horizontal direction in the multi-layered wiring layer 105 of the first substrate 110A, the multi-layered wiring layer 125 of the second substrate 110B, and the multi-layered wiring layer 135 of the third substrate 110C. The following also refers collectively to the vertical power supply wiring lines 303 and the horizontal power supply wiring lines 304 as power supply wiring lines 303 and 304. Note that the horizontal power supply wiring lines 304 may also exist actually in the multi-layered wiring layer 105 of the first substrate 110A and the multi-layered wiring layer 125 of the second substrate 110B, but are not illustrated in FIGS. 5A and 5B for the sake of simplicity. FIGS. 5A and 5B each illustrate only the horizontal power supply wiring line 304 in the multi-layered wiring layer 135 of the third substrate 110C.

In addition, it is possible to consider that the GND wiring lines mainly include vertical GND wiring lines 305 extending in the z-axis direction from GND terminals provided to the upper surface of the first substrate 110A, and horizontal GND wirings 306 extending in the horizontal direction in the multi-layered wiring layer 105 of the first substrate 110A, the multi-layered wiring layer 125 of the second substrate 110B, and the multi-layered wiring layer 135 of the third substrate 110C. The following also refers collectively to the vertical GND wiring lines 305 and the horizontal GND wiring lines 306 as GND wiring lines 305 and 306. Note that the horizontal GND wiring line 306 of the first substrate 110A is also referred to as horizontal GND wiring line 306a, the horizontal GND wiring line 306 of the second substrate 110B is also referred to as horizontal GND wiring line 306b, and the horizontal GND wiring line 306 of the third substrate 110C is also referred to as horizontal GND wiring line 306c to distinguish them.

Here, a case where the power consumption of the third substrate 110C is greater than the power consumption of the first substrate 110A is examined as an example. For example, it is assumed that the third substrate 110C is a logic substrate. The logic circuit is divided into a plurality of circuit blocks, and the circuit blocks that operate may change depending on processing content. That is, during a series of operations in the solid-state imaging devices 1 and 1a, the locations of the logic circuit that mainly operate may change. Therefore, the locations of the logic circuit through which the power supply currents flow are biased (e.g., the power supply currents are generated due to the charging and discharging of the transistor gate capacitance and the wiring capacitance associated with the operation of the circuit), and moreover the locations may change.

As illustrated in FIGS. 5A and 5B, two circuit blocks 301 and 302 in the logic circuit of the third substrate 110C are now brought into focus. When these two circuit blocks 301 and 302 operate, the current path is formed that passes by the power supply terminal, the power supply wiring lines 303 and 304, the circuit blocks 301 and 302, the GND wiring lines 305 and 306, and the GND terminal.

Here, it is assumed that the power consumption of the circuit block 301 at certain timing is greater than that of the circuit block 302. In this case, as illustrated in FIGS. 5A and 5B, more currents are supplied at this timing from the power supply wiring lines 303 and 304 to the circuit block 301 than to the circuit block 302. This difference in power consumption causes the vertical GND wiring line 305 (that is also referred to as vertical GND wiring line 305a to distinguish the vertical GND wiring lines 305) near the circuit block 301 to have a larger amount of currents flowing to the vertical GND wiring line 305 through the circuit blocks 301 and 302 than that of the vertical GND wiring line 305 (that is also referred to as vertical GND wiring 305b to distinguish the vertical GND wiring lines 305) near the circuit block 302.

The first substrate 110A and the second substrate 110B include the horizontal GND wiring lines 306a and 306b, and the imbalance of the amount of currents between the vertical GND wiring lines 305a and 305b is thus corrected by the horizontal GND wiring lines 306a and 306b of the first substrate 110A and the second substrate 110B on the way to the GND terminals on the upper surface of the first substrate 110A. That is, currents flow to the horizontal GND wiring lines 306a and 306b of the first substrate 110A and the second substrate 110B to correct the imbalance of the amount of currents between the vertical GND wiring lines 305a and 305b. Accordingly, as illustrated by the solid-line arrows in each of FIGS. 5A and 5B, a loop-shaped current path passing by the horizontal power supply wiring line 304, the circuit blocks 301 and 302, the horizontal GND wiring line 306c, the vertical GND wiring line 305a, and the horizontal GND wiring lines 306a and 306b is formed in each of the solid-state imaging devices 1 and 1a.

At this time, as illustrated in FIG. 5A, in the solid-state imaging device 1a in which the first substrate 110A and the second substrate 110B are bonded together F-to-F, the horizontal GND wiring lines 306a and 306b of the first substrate 110A and the second substrate 110B are both disposed relatively far from the horizontal power supply wiring line 304 of the third substrate 110C. Therefore, in the loop-shaped current path described above, the opening width of the loop is increased. This increases the inductance of the loop-shaped current path. That is, the impedance becomes high. The stability of the power supply currents may be thus decreased, and the performance of the entire solid-state imaging device 1a may be decreased.

Meanwhile, as illustrated in FIG. 5B, in the solid-state imaging device 1 in which the first substrate 110A and the second substrate 110B are bonded together F-to-B, the horizontal GND wiring line 306a of the first substrate 110A is disposed relatively far from the horizontal power supply wiring line 304 of the third substrate 110C, but the horizontal GND wiring line 306b of the second substrate 110B is disposed relatively close to the horizontal power supply wiring line 304 of the third substrate 110C. Therefore, in the loop-shaped current path described above, the opening width of the loop is decreased. This decreases the inductance of the loop-shaped current path. That is, the impedance becomes low. It is thus possible to further stabilize the power supply currents, and further improve the performance of the entire solid-state imaging device 1.

In this way, when the power consumption and the disposition of GND wiring lines are brought into focus, the solid-state imaging device 1 in which the first substrate 110A and the second substrate 110B are bonded together F-to-B is considered to achieve a more stable operation than the solid-state imaging device 1a in which the first substrate 110A and the second substrate 110B are bonded together F-to-F does in a case where the power consumption of the third substrate 110C is greater than the power consumption of the first substrate 110A. The solid-state imaging device 1 allows the horizontal GND wiring line 306b of the second substrate 110B to be disposed closer to the horizontal power supply wiring line 304 of the third substrate 110C. That is, it is possible to say that the solid-state imaging device 1 has a more preferable configuration.

Some designs of the respective substrates may, however, cause the first substrate 110A to consume more power than the third substrate 110C does. In this case, a more stable operation is considered expectable from the configuration of the solid-state imaging device 1a that allows the distance to be decreased between the horizontal power supply wiring line of the first substrate 110A and the horizontal ground wiring line 306b of the second substrate 110B rather than the solid-state imaging device 1.

In summary, when considering the direction of the second substrate 110B on the basis of the power consumption and the disposition of the GND wiring lines, it is preferable that the solid-state imaging device 1a be configured in a manner that the front surface side of the second substrate 110B is opposed to the front surface side of the first substrate 110A in a case where the power consumption of the first substrate 110A is greater than the power consumption of the third substrate 110C. That is, it is preferable that the solid-state imaging device 1a be configured in a manner that the first substrate 110A and the second substrate 110B are bonded together F-to-F. Conversely, it is preferable that the solid-state imaging device 1 be configured in a manner that the front surface side of the second substrate 110B is opposed to the front surface side of the third substrate 110C in a case where the power consumption of the third substrate 110C is larger than the power consumption of the first substrate 110A. That is, it is preferable that the solid-state imaging device 1 be configured in a manner that the first substrate 110A and the second substrate 110B are bonded together F-to-B.

In the present embodiment, the direction of the second substrate 110B may be determined from such a viewpoint based on the power consumption and the disposition of GND wiring lines. The solid-state imaging devices 1 to 15E according to the present embodiment illustrated in FIGS. 1, 6A, 6B, 7A, 7B, 7C, 7D, 7E, 8A, 8B, 8C, 8D, 8E, 8F, 8G, 9A, 9B, 9C, 9D, 9E, 9F, 10A, 10B, 10C, 10D, 10E, 11A, 11B, 11C, 12A, 12B, 12C, 12D, 12E, 12F, 13A, 13B, 13C, 13D, 13E, 14A, 14B, 14C, 14D, 14E, 14F, 15A, 15B, 15C, 15D, and 15E described below are each configured, for example, to have the power consumption of the first substrate 110A less than the power consumption of the third substrate 110C, and have the first substrate 110A and the second substrate 110B accordingly bonded together F-to-B. The solid-state imaging devices 1 to 15E may thus achieve a more stable operation.

Note that examples of a case where the power consumption of the third substrate 110C is greater than the power consumption of the first substrate 110A include a case where only a pixel unit is mounted on the first substrate 110A and many circuits (such as a pixel signal processing circuit, a logic circuit, and a memory circuit, for example) are mounted on the second substrate 110B and the third substrate 110C. Specific examples of such a configuration include a configuration in which only a pixel unit is mounted on the first substrate 110A, a pixel signal processing circuit and a memory circuit are mounted on the second substrate 110B, and a logic circuit is mounted on the third substrate 110C. At this time, a digital circuit (such as a digital circuit that, for example, generates a reference voltage for AD conversion) in the pixel signal processing circuit may be mounted on the third substrate 110C. Alternatively, in a case where a memory circuit that is more frequently accessed (e.g., memory circuit into or from which pixel signals are written or read out only a plurality of times per frame) is mounted on the third substrate 110C, the third substrate 110C is considered to consume more power.

Meanwhile, examples of a case in which the power consumption of the first substrate 110A is greater than the power consumption of the third substrate 110C include a case in which a pixel unit and various circuits are mounted together on the first substrate 110A and the area of the first substrate 110A occupied by the various circuits is relatively large. Alternatively, in a case where a memory circuit that is less frequently accessed (e.g., memory circuit into or from which pixel signals are written or read out only once per frame) is mounted on the third substrate 110C, the third substrate 110C is considered to consume less power and the first substrate 110A is considered to relatively consume more power.

Note that, when the power consumption of the first substrate 110A and the power consumption of the third substrate 110C are compared with each other, the power consumption itself may be compared, or other indices that may represent the magnitude of the power consumption may be compared. Examples of the other indices include the number of gates (e.g., 100 gates and 1M gates) mounted on the circuits of each substrate, the operating frequencies (e.g., 100 MHz and 1 GHz) of the circuits of each substrate, and the like.

Here, as a method of decreasing impedance in the loop-shaped current path in the solid-state imaging device 1a illustrated in FIG. 5A in which the first substrate 110A and the second substrate 110B are bonded together F-to-F, a method of coupling the horizontal GND wiring line 306a of the first substrate 110A and the horizontal GND wiring line 306b of the second substrate 110B to each other by using a plurality of wiring lines (i.e., vertical GND wiring lines) extending in the z-axis direction is possible as illustrated in FIG. 5C. FIG. 5C is a diagram illustrating a configuration example for decreasing impedance in the solid-state imaging device 1a illustrated in FIG. 5A. Note that a solid-state imaging device 1b illustrated in FIG. 5C corresponds to the solid-state imaging device 1a illustrated in FIG. 5A in which the horizontal GND wiring line 306a of the first substrate 110A and the horizontal GND wiring line 306b of the second substrate 110B are coupled to each other by using a plurality of vertical GND wiring lines, and the other components are similar to those of the solid-state imaging device 1a.

Adopting the configuration illustrated in FIG. 5C strengthens the horizontal GND wiring lines 306a and 306b, and allows the impedance to be decreased in the loop-shaped current path. It is thus considered possible to further improve the performance of the entire solid-state imaging device 1b as compared with that of the solid-state imaging device 1a. Note that FIG. 5C illustrates, as an example, a configuration that may allow the impedance of the loop-shaped current path to be decreased in a case where the power consumption of the third substrate 110C is greater than the power consumption of the first substrate 110A, and the first substrate 110A and the second substrate 110B are bonded together F-to-F. However, it is sufficient if the horizontal GND wiring line 306b of the second substrate 110B and the horizontal GND wiring line 306c of the third substrate 110C are coupled to each other by using a plurality of vertical GND wiring lines in order to decrease the impedance of the loop-shaped current path in a case where the power consumption of the first substrate 110A is greater than the power consumption of the third substrate 110C, and the first substrate 110A and the second substrate 110B are bonded together F-to-B.

However, to achieve the configuration illustrated in FIG. 5C, the multi-layered wiring layer 105 of the first substrate 110A and the multi-layered wiring layer 125 of the second substrate 110B have to be provided with coupling structures for coupling the GND wiring lines thereof to each other. This imposes a constraint that takes into consideration the coupling structures to be provided on the disposition of the GND wiring lines and the disposition of the other wiring lines in the multi-layered wiring layers 105 and 125. Specifically, in the configuration illustrated in FIG. 5C, in the first substrate 110A and the second substrate 110B, the vertical GND wiring lines and the coupling structures for coupling the vertical GND wiring lines between the substrates to each other are distributed not only in the outer peripheral portions of the chips, but also more in the middle portions of the chips in the horizontal plane. The respective wiring lines thus have to be disposed by taking this distribution into consideration. That is, the degree of flexibility in designing the respective wiring lines in the multi-layered wiring layers 105 and 125 is decreased.

In contrast, as described above, in the present embodiment, the impedance of the loop-shaped current path is decreased by adjusting the direction of the second substrate 110B. This makes it possible, unlike the configuration illustrated in FIG. 5C, to dispose vertical GND wiring lines to distribute more vertical GND wiring lines in the outer peripheral portions of the chips in the horizontal plane. It is thus possible to decrease the impedance in the current path without decreasing the degree of flexibility in designing the wiring lines in the multi-layered wiring layers 105 and 125.

That is, it is possible to stabilize the operations of the solid-state imaging devices 1 and 1a.

Note that it is possible to determine the density of the vertical GND wiring lines disposed in the outer peripheral portions of the chips and in the middle portions of the chips in the horizontal plane, for example, as follows. For example, in a case where the number of vertical GND wiring lines existing in the one middle region of nine regions obtained by equally dividing a chip as a 3×3 region in the horizontal plane is larger than the number of vertical GND wiring lines existing in the eight peripheral regions, it is possible to determine that the number of vertical GND wiring lines in the middle portion of the chip is large (i.e., it is possible to determine that the configuration of the solid-state imaging device 1b illustrated in FIG. 5C may be possibly applied). In contrast, in a case where the number of vertical GND wiring lines existing in the one middle region is smaller than the number of vertical GND wiring lines existing in the eight peripheral regions, it is possible to determine that the number of vertical GND wiring lines in the outer peripheral portion of the chip is large (i.e., it is possible to determine that the configurations of the solid-state imaging devices 1 and 1a illustrated in FIGS. 5A and 5B may be possibly applied).

Here, as an example, a case where a chip is equally divided into nine regions in the horizontal plane has been described, but the number of regions obtained by dividing a chip is not limited to the example. The number of regions obtained by dividing a chip may be changed as appropriate into the 16 regions of a 4×4 region, the 25 regions of a 5×5 region, or the like. It is sufficient if, for example, in a case where a chip is divided into 16 regions as a 4×4 region, the density is determined from the number of vertical GND wiring lines in the four middle regions and the 12 peripheral regions. Alternatively, it is sufficient if, in a case where a chip is divided into 25 regions as a 5×5 region, the density is determined from the number of vertical GND wiring lines in the one middle region and the 24 peripheral regions, or in the nine middle regions and the 16 peripheral regions.

4. Variations of Coupling Structures

The configuration of the solid-state imaging device 1 illustrated in FIG. 1 is an example of a solid-state imaging device according to the present embodiment. The solid-state imaging device according to the present embodiment may include a coupling structure different from a coupling structure illustrated in FIG. 1. The following describes another configuration example of the solid-state imaging device according to the present embodiment in which a different coupling structure is included.

Note that the components of the respective solid-state imaging devices described below correspond to the components of the solid-state imaging device 1 illustrated in FIG. 1 in which a portion of the components is changed. The components that have already been described with reference to FIG. 1 are not thus described in detail. In addition, each of the diagrams illustrating a schematic configuration of each solid-state imaging device described below does not have a portion of the reference numerals attached in FIG. 1 in order to avoid complicating the diagram. In addition, FIG. 1 and each of the subsequent diagrams illustrate that members having the same type of hatching include the same material.

Note that the respective configuration examples described below have it in common that no coupling structure over the bonding surfaces of the first substrate 110A and the second substrate 110B is included as a coupling structure that electrically couples the respective signal lines of the first substrate 110A and the second substrate 110B to each other and electrically couples the respective power supply lines of the first substrate 110A and the second substrate 110B to each other. In addition, in the respective configuration examples described below, in a case where a coupling structure that electrically couples wiring lines of the second substrate 110B and the signal line and power supply line of the third substrate 110C to each other, and a coupling structure that electrically couples the respective signal lines of the first substrate 110A and the third substrate 110C to each other and electrically couples the respective power supply lines of the first substrate 110A and the third substrate 110C to each other are provided, a coupling structure that electrically couples the respective signal lines of the first substrate 110A and the second substrate 110B to each other and electrically couples the respective power supply lines of the first substrate 110A and the second substrate 110B to each other may not be sometimes provided. Here, the coupling structure over the bonding surfaces of the first substrate 110A and the second substrate 110B includes not only electrode junction structures existing on the bonding surfaces of the first substrate 110A and the second substrate 110B, but also a TSV that penetrates the bonding surfaces of the first substrate 110A and the second substrate 110B. The following mainly describes a difference between the respective configuration examples.

4-1. First Configuration Example

First, with reference to FIGS. 6A and 6B, solid-state imaging devices 6A to 6B according to the first configuration example are described. FIGS. 6A and 6B are vertical cross-sectional views of examples of the solid-state imaging devices 6A to 6B according to the first configuration example.

The solid-state imaging devices 6A to 6B according to the first configuration example are each different from the solid-state imaging device 1 illustrated in FIG. 1 in that the pad 151 is provided to the back surface side of the first substrate 110A, and is electrically coupled to wiring lines in the multi-layered wiring layers 105, 125, and 135 through electrically-conductive material layers 510 with which the inner walls of the lead line openings 155a, 155b, and 155c are filmed.

Specifically, as illustrated in FIG. 6A, the lead line opening 155a is formed to penetrate the semiconductor substrate 101 from the back surface side of the first substrate 110A and expose a wiring line in the multi-layered wiring layer 105 of the first substrate 110A. The lead line opening 155b is formed to penetrate the first substrate 110A from the back surface side of the first substrate 110A and expose a wiring line in the multi-layered wiring layer 125 of the second substrate 110B. The lead line opening 155c is formed to penetrate the first substrate 110A and the second substrate 110B from the back surface side of the first substrate 110A, and expose a wiring line in the multi-layered wiring layer 135 of the third substrate 110C.

In addition, the inner walls of the lead line openings 155a, 155b, and 155c are filmed with the electrically-conductive material layers 510 including tungsten (W) or the like, and the electrically-conductive material layers 510 each extend above the insulating film 109 on the back surface side of the first substrate 110A. Further, the pad 151 is provided on the electrically-conductive material layer 510 that extends above the insulating film 109 on the back surface side of the first substrate 110A. As a result, in the solid-state imaging device 6A, the respective wiring lines of the first substrate 110A, the second substrate 110B, and the third substrate 110C are electrically coupled to each other through the pad 151. The structure in which the pad 151 is electrically coupled to wiring lines in the multi-layered wiring layers 105, 125, and 135 through the electrically-conductive material layers 510 like this is also referred to as pad lead structure below. The inner walls of the lead line openings 155a, 155b, and 155c are filmed with the electrically-conductive material layers 510.

In addition, as illustrated in FIG. 6B, the pad 151 may be formed by being embedded inside the insulating film 109.

Note that, in the solid-state imaging devices 6A to 6B illustrated in FIGS. 6A and 6B, the electrically-conductive material layer 510 may be provided to be electrically isolated for each of the lead line openings 155a, 155b, and 155c. In addition, the pad 151 may be provided for each of the lead line openings 155a, 155b, and 155c, or the plurality of pads 151 may be provided for each of the lead line openings 155a, 155b, and 155c.

4-2. Second Configuration Example

Next, with reference to FIGS. 7A, 7B, 7C, 7D, and 7E, solid-state imaging devices 7A to 7E according to the second configuration example are described. FIGS. 7A, 7B, 7C, 7D, and 7E are vertical cross-sectional views of examples of the solid-state imaging devices 7A to 7E according to the second configuration example.

The solid-state imaging devices 7A to 7E according to the second configuration example are each provided with the TSV 157 having the twin contact structure in which electrically-conductive materials are embedded in a first through hole and a second through hole. From the back surface side of the second substrate 110B or the back surface side of the third substrate 110C, the first through hole exposes a wiring line in the multi-layered wiring layer 125 of the second substrate 110B and the second through hole exposes a wiring line in the multi-layered wiring layer 135 of the third substrate 110C.

Specifically, as illustrated in FIG. 7A, the TSV 157 is provided by penetrating the third substrate 110C from the back surface side of the third substrate 110C. For example, the TSV 157 is provided to have a structure in which electrically-conductive γmaterials are embedded in a first through hole that penetrates the third substrate 110C and exposes a wiring line in the multi-layered wiring layer 125 of the second substrate 110B, and a second through hole that penetrates the semiconductor substrate 131 and exposes a wiring line in the multi-layered wiring layer 135 of the third substrate 110C. Note that the TSV 157 may be coupled to a wiring line including the second metal similar to the pad 151. In addition, the solid-state imaging device 7A is provided with the pads 151 inside the multi-layered wiring layer 105 of the first substrate 110A and the multi-layered wiring layer 125 of the second substrate 110B, and the pads 151 are exposed by the pad openings 153a and 153b. As a result, in the solid-state imaging device 7A, the respective signal lines of the first substrate 110A, the second substrate 110B, and the third substrate 110C are electrically coupled to each other and the respective power supply lines of the first substrate 110A, the second substrate 110B, and the third substrate 110C are electrically coupled to each other through the TSVs 157, the pads 151, and the pad openings 153a and 153b.

In addition, as illustrated in FIG. 7B, the pad 151 may be provided to the back surface side of the first substrate 110A, and may be electrically coupled to a wiring line in the multi-layered wiring layer 105 of the first substrate 110A and a wiring line in the multi-layered wiring layer 125 of the second substrate 110B by electrically-conductive material layers 510 with which the inner walls of the lead line openings 155a and 155b are filmed. In addition, the TSV 157 may be coupled to a wiring line including the first metal similar to a normal wiring line.

Specifically, the lead line opening 155a is formed to penetrate the semiconductor substrate 101 from the back surface side of the first substrate 110A and expose a wiring line in the multi-layered wiring layer 105 of the first substrate 110A. The lead line opening 155b is formed to penetrate the first substrate 110A from the back surface side of the first substrate 110A and expose a wiring line in the multi-layered wiring layer 125 of the second substrate 110B. In addition, the inner walls of the lead line openings 155a and 155b are filmed with the electrically-conductive material layers 510 including tungsten (W) or the like, and the electrically-conductive material layers 510 extend above the insulating film 109 on the back surface side of the first substrate 110A. Further, the pad 151 is provided on the electrically-conductive material layer 510 that extends above the insulating film 109 on the back surface side of the first substrate 110A. That is, the pad 151 may be provided on the back surface of the first substrate 110A and electrically coupled to the multi-layered wiring layers 105, 125, and 135 of the respective substrates through the electrically-conductive material layers 510.

Further, as illustrated in FIG. 7C, in contrast to the structure of the solid-state imaging device 7B, the pad 151 may be formed by being embedded inside the insulating film 109.

In addition, as illustrated in FIG. 7D, the TSV 157 may be provided by penetrating the second substrate from the back surface side of the second substrate 110B. Specifically, the TSV 157 may be provided to have a structure in which electrically-conductive materials are embedded in a first through hole that penetrates the semiconductor substrate 121 from the back surface side of the second substrate 110B and exposes a wiring line in the multi-layered wiring layer 125 of the second substrate 110B, and a second through hole that penetrates the third substrate 110C from the back surface side of the second substrate 110B and exposes a wiring line in the multi-layered wiring layer 135 of the third substrate 110C. This also allows the TSV 157 to electrically couple the respective signal lines of the second substrate 110B and the third substrate 110C to each other and electrically couple the respective power supply lines of the second substrate 110B and the third substrate 110C to each other. Accordingly, the respective signal lines of the first substrate 110A, the second substrate 110B and the third substrate 110C may be electrically coupled to each other, and the respective power supply lines of the first substrate 110A, the second substrate 110B and the third substrate 110C may be electrically coupled to each other. In addition, the pads 151 may be provided on the insulating film 109, or may be provided inside the multi-layered wiring layer 105 of the first substrate 110A and the multi-layered wiring layer 125 of the second substrate 110B.

In addition, as illustrated in FIG. 7E, in contrast to the structure of the solid-state imaging device 7D, the pad 151 may be formed by being embedded inside the insulating film 109.

Note that, in each of the solid-state imaging devices 7A to 7E illustrated in FIGS. 7A, 7B, 7C, 7D, and 7E, the pads 151 may be provided inside the multi-layered wiring layer 105 of the first substrate 110A and the multi-layered wiring layer 135 of the third substrate 110C. In addition, the electrically-conductive material layer 510 may be provided to be electrically isolated for each of the lead line openings 155a and 155b. Further, the pad 151 may be provided for each of the lead line openings 155a and 155b, or the plurality of pads 151 may be provided for each of the lead line openings 155a and 155b.

4-3. Third Configuration Example

Then, with reference to FIGS. 8A, 8B, 8C, 8D, 8E, 8F, and 8G, solid-state imaging devices 8A to 8G according to the third configuration example are described. FIGS. 8A, 8B, 8C, 8D, 8E, 8F, and 8G are vertical cross-sectional views of examples of the solid-state imaging devices 8A to 8G according to the third configuration example.

The solid-state imaging devices 8A to 8G according to the third configuration example are each provided with the TSV 157 having the twin contact structure in which electrically-conductive materials are embedded in a first through hole exposes a wiring line in the multi-layered wiring layer 125 of the second substrate 110B from the back surface side of the first substrate 110A, and a second through hole that exposes a wiring line in the multi-layered wiring layer 135 of the third substrate 110C.

Specifically, as illustrated in FIG. 8A, the TSV 157 is provided to have a structure in which electrically-conductive materials are embedded in a first through hole that penetrates the first substrate 110A from the back surface side of the first substrate 110A and exposes a wiring line in the multi-layered wiring layer 125 of the second substrate 110B, and a second through hole that penetrates the first substrate 110A and the second substrate 110B and exposes a wiring line in the multi-layered wiring layer 135 of the third substrate 110C. Note that the TSV 157 may be coupled to a wiring line including the second metal similar to the pad 151, or may be coupled to a wiring line including the first metal similar to a normal wiring line. In addition, the solid-state imaging device 8A is provided with the pads 151 inside the multi-layered wiring layer 105 of the first substrate 110A and the multi-layered wiring layer 125 of the second substrate 110B, and the pads 151 are exposed by the pad openings 153a and 153b. As a result, in the solid-state imaging device 8A, the respective signal lines of the first substrate 110A, the second substrate 110B, and the third substrate 110C are electrically coupled to each other and the respective power supply lines of the first substrate 110A, the second substrate 110B, and the third substrate 110C are electrically coupled to each other through the TSVs 157, the pads 151, and the pad openings 153a and 153b.

In addition, as illustrated in FIG. 8B, the pad 151 may be provided to the back surface side of the first substrate 110A, and may be electrically coupled to a wiring line in the multi-layered wiring layer 105 of the first substrate 110A by the electrically-conductive material layer 510 with which the inner wall of the lead line opening 155 is filmed. Specifically, the lead line opening 155 is formed to penetrate the semiconductor substrate 101 from the back surface side of the first substrate 110A and expose a wiring line in the multi-layered wiring layer 105 of the first substrate 110A. In addition, the inner wall of the lead line opening 155 is filmed with the electrically-conductive material layer 510 including tungsten (W) or the like, and the electrically-conductive material layer 510 extends above the insulating film 109 and the TSV 157 on the back surface side of the first substrate 110A. Further, the pad 151 is provided on the electrically-conductive material layer 510 that extends above the insulating film 109 on the back surface side of the first substrate 110A. The pad 151 may be electrically coupled to the respective signal lines and power supply lines of the second substrate 110B and the third substrate 110C through the electrically-conductive material layer 510 extended over the TSV 157 exposed to the back surface of the first substrate 110A.

Further, as illustrated in FIG. 8C, in contrast to the structure of the solid-state imaging device 8B, the pad 151 may be formed by being embedded inside the insulating film 109.

In addition, as illustrated in FIG. 8D, in contrast to the structure of a solid-state imaging device 8C, the TSV 157 may be provided to have a structure in which films including electrically-conductive materials are formed on the inner walls of the first through hole and the second through hole instead of a structure in which electrically-conductive materials are embedded in the first through hole and the second through hole. Specifically, the first through hole and the second through hole (i.e., lead line openings 155b and 155a) of the TSV 157 are filmed with the electrically-conductive material layers 510, and the electrically-conductive material layers 510 electrically couple a wiring line in the multi-layered wiring layer 125 of the second substrate 110B and a wiring line in the multi-layered wiring layer 135 of the third substrate 110C to each other. In such a case, the TSV 157 may have a structure similar to a pad lead structure in which the pad 151 and wiring lines in the multi-layered wiring layers of the respective substrates are electrically coupled to each other by the electrically-conductive material layers 510 with which the inner walls of the lead line openings 155a and 155b are filmed. Thus, the TSV 157 is also able to function as the pad lead structure, and it is possible to form the TSV 157 concurrently when the pad lead structure including the lead line opening 155c is formed.

Further, as illustrated in FIG. 8E, in contrast to the structure of a solid-state imaging device 8D, the pad 151 may be provided on the insulating film 109 to protrude from the back surface of the first substrate 110A.

In addition, as illustrated in FIGS. 8F and 8G, in contrast to the structures of the solid-state imaging devices 8D and 8E, the electrically-conductive material layers 510 may be coupled to a wiring line including the second metal similar to the pad 151, or may be coupled to a wiring line including the first metal similar to a normal wiring line.

Note that, in the solid-state imaging devices 8A to 8G illustrated in FIGS. 8A, 8B, 8C, 8D, 8E, 8F, and 8G the electrically-conductive material layer 510 may be provided to be electrically isolated for each of the lead line openings 155a, 155b, and 155c. In addition, the pad 151 may be provided for each of the lead line openings 155a, 155b, and 155c, or the plurality of pads 151 may be provided for each of the lead line openings 155a, 155b, and 155c.

4-4. Fourth Configuration Example

Next, with reference to FIGS. 9A, 9B, 9C, 9D, 9E, and 9F, solid-state imaging devices 9A to 9F according to the fourth configuration example are described. FIGS. 9A, 9B, 9C, 9D, 9E, and 9F are vertical cross-sectional views of examples of the solid-state imaging devices 9A to 9F according to the fourth configuration example.

The solid-state imaging devices 9A to 9F according to the fourth configuration example are each provided with the TSV 157 coupled to a wiring line in the multi-layered wiring layer 125 of the second substrate 110B and a wiring line in the multi-layered wiring layer 135 of the third substrate 110C, and having the shared contact structure in which an electrically-conductive material is embedded in one through hole.

Specifically, as illustrated in FIG. 9A, the TSV 157 is provided by penetrating the third substrate 110C from the back surface side of the third substrate 110C, and is provided to have a structure in which an electrically-conductive material is embedded in one through hole that contacts a wiring line in the multi-layered wiring layer 135 of the third substrate 110C and exposes a wiring line in the multi-layered wiring layer 125 of the second substrate 110B. In other words, the TSV 157 may be formed to have a structure in which an electrically-conductive material is embedded in a through hole that exposes at least a side surface of a wiring line included in the multi-layered wiring layer 135 and exposes an upper surface of a wiring line included in the multi-layered wiring layer 125. The TSV 157 having the shared contact structure may contact a plurality of wiring lines in the multi-layered wiring layer 135 of the third substrate 110C on both sides, or may contact one wiring line in the multi-layered wiring layer 135 of the third substrate 110C on one side. The same applies to the other TSVs 157 each having the shared contact structure described below, and the TSV 157 may be in contact with the wiring lines in the multi-layered wiring layers 105, 125, and 135 on both sides or on one side. Note that the TSV 157 may be coupled to a wiring line including the second metal similar to the pad 151, or may be coupled to a wiring line including the first metal similar to a normal wiring line. In addition, the solid-state imaging device 9A is provided with the pads 151 inside the multi-layered wiring layer 105 of the first substrate 110A and the multi-layered wiring layer 125 of the second substrate 110B, and the pads 151 are exposed by the pad openings 153a and 153b. As a result, in the solid-state imaging device 9A, the respective signal lines of the first substrate 110A, the second substrate 110B, and the third substrate 110C are electrically coupled to each other and the respective power supply lines of the first substrate 110A, the second substrate 1101B, and the third substrate 110C are electrically coupled to each other through the TSVs 157, the pads 151, and the pad openings 153a and 153b.

In addition, as illustrated in FIG. 9B, the pad 151 may be provided to the back surface side of the first substrate 110A, and may be electrically coupled to a wiring line in the multi-layered wiring layer 105 of the first substrate 110A and a wiring line in the multi-layered wiring layer 125 of the second substrate 110B by electrically-conductive material layers 510 with which the inner walls of the lead line openings 155a and 155b are filmed. Specifically, the lead line opening 155a is formed to penetrate the semiconductor substrate 101 from the back surface side of the first substrate 110A and expose a wiring line in the multi-layered wiring layer 105 of the first substrate 110A, and the lead line opening 155b is formed to penetrate the first substrate 110A from the back surface side of the first substrate 110A and expose a wiring line in the multi-layered wiring layer 125 of the second substrate 110B. In addition, the inner walls of the lead line openings 155a and 155b are filmed with the electrically-conductive material layers 510 including tungsten (W) or the like, and the electrically-conductive material layers 510 extend above the insulating film 109 on the back surface side of the first substrate 110A. Further, the pad 151 is provided on the electrically-conductive material layer 510 that extends above the insulating film 109 on the back surface side of the first substrate 110A. That is, the pad 151 may be provided on the back surface of the first substrate 110A and electrically coupled to the multi-layered wiring layers 105, 125, and 135 of the respective substrates through the electrically-conductive material layers 510.

Further, as illustrated in FIG. 9C, in contrast to the structure of the solid-state imaging device 9B, the pad 151 may be formed by being embedded inside the insulating film 109.

In addition, as illustrated in FIG. 9D, the TSV 157 may be provided by penetrating the second substrate 110B from the back surface side of the second substrate 110B, and is provided to have a structure in which an electrically-conductive material is embedded in one through hole that contacts a wiring line in the multi-layered wiring layer 125 of the second substrate 110B and exposes a wiring line in the multi-layered wiring layer 135 of the third substrate 110C. Note that the TSV 157 may be coupled to a wiring line including the second metal similar to the pad 151, or may be coupled to a wiring line including the first metal similar to a normal wiring line. This also allows the TSV 157 to electrically couple a wiring line of the second substrate 110B and a wiring line of the third substrate 110C to each other. Accordingly, the respective signal lines of the first substrate 110A, the second substrate 110B and the third substrate 110C may be electrically coupled to each other, and the respective power supply lines of the first substrate 110A, the second substrate 110B and the third substrate 110C may be electrically coupled to each other.

In addition, as illustrated in FIG. 9E, in contrast to the structure of the solid-state imaging device 9D, the pad 151 may be provided to the back surface side of the first substrate 110A. In such a case, the pad 151 may be electrically coupled to a wiring line in the multi-layered wiring layer 105 of the first substrate 110A and a wiring line in the multi-layered wiring layer 125 of the second substrate 110B through the electrically-conductive material layers 510 with which the inner walls of the lead line openings 155a and 155b are filmed.

Further, as illustrated in FIG. 9F, in contrast to the structure of the solid-state imaging device 9E, the pad 151 may be formed by being embedded inside the insulating film 109.

Note that, in the solid-state imaging devices 9A to 9F illustrated in FIGS. 9A, 9B, 9C, 9D, 9E, and 9F, the electrically-conductive material layer 510 may be provided to be electrically isolated for each of the lead line openings 155a and 155b. In addition, the pad 151 may be provided for each of the lead line openings 155a and 155b, or the plurality of pads 151 may be provided for each of the lead line openings 155a and 155b.

4-5. Fifth Configuration Example

Then, with reference to FIGS. 10A, 10B, 10C, 10D, and 10E, solid-state imaging devices 10A to 10E according to the fifth configuration example are described. FIGS. 10A, 10B, 10C, 10D, and 10E are vertical cross-sectional views of examples of the solid-state imaging devices 10A to 10E according to the fifth configuration example.

The solid-state imaging devices 10A to 10E according to the fifth configuration example are each provided with the TSV 157 having the shared contact structure in which an electrically-conductive material is embedded in one through hole provided by penetrating the first substrate 110A and the second substrate 110B from the back surface side of the first substrate 110A.

Specifically, as illustrated in FIG. 10A, the TSV 157 is provided by penetrating the first substrate 110A and the second substrate 110B from the back surface side of the first substrate 110A, and is provided to have a structure in which an electrically-conductive material is embedded in one through hole that contacts a wiring line in the multi-layered wiring layer 125 of the second substrate 110B and exposes a wiring line in the multi-layered wiring layer 135 of the third substrate 110C. Note that the TSV 157 may be coupled to a wiring line including the second metal similar to the pad 151, or may be coupled to a wiring line including the first metal similar to a normal wiring line. In addition, the solid-state imaging device 10A is provided with the pads 151 inside the multi-layered wiring layer 105 of the first substrate 110A and the multi-layered wiring layer 125 of the second substrate 110B, and the pads 151 are exposed by the pad openings 153a and 153b. As a result, in the solid-state imaging device 10A, the respective signal lines of the first substrate 110A, the second substrate 1101B, and the third substrate 110C are electrically coupled to each other and the respective power supply lines of the first substrate 110A, the second substrate 110B, and the third substrate 110C are electrically coupled to each other through the TSVs 157, the pads 151, and the pad openings 153a and 153b.

In addition, as illustrated in FIG. 10B, the pad 151 may be provided to the back surface side of the first substrate 110A, and may be electrically coupled to a wiring line in the multi-layered wiring layer 105 of the first substrate 110A by the electrically-conductive material layer 510 with which the inner wall of the lead line opening 155 is filmed. Specifically, the lead line opening 155 is formed to penetrate the semiconductor substrate 101 from the back surface side of the first substrate 110A and expose a wiring line in the multi-layered wiring layer 105 of the first substrate 110A. In addition, the inner wall of the lead line opening 155 is filmed with the electrically-conductive material layer 510 including tungsten (W) or the like, and the electrically-conductive material layer 510 extends above the insulating film 109 and the TSV 157 on the back surface side of the first substrate 110A. Further, the pad 151 is provided on the electrically-conductive material layer 510 that extends above the insulating film 109 on the back surface side of the first substrate 110A. The pad 151 may be electrically coupled to the respective signal lines and power supply lines of the second substrate 110B and the third substrate 110C through the electrically-conductive material layer 510 extended over the TSV 157 exposed to the back surface of the first substrate 110A.

Further, as illustrated in FIG. 10C, the pad 151 may be formed by being embedded inside the insulating film 109.

In addition, as illustrated in FIG. 10D, in contrast to the structure of a solid-state imaging device 10C, the TSV 157 may be provided to have a structure in which a film including an electrically-conductive material is formed on the inner wall of one through hole instead of a structure in which an electrically-conductive material is embedded in one first through hole. Specifically, the inner wall (i.e., lead line opening 155a) of the through hole of the TSV 157 is filmed with the electrically-conductive material layer 510, and the electrically-conductive material layer 510 electrically couples a wiring line in the multi-layered wiring layer 125 of the second substrate 110B and a wiring line in the multi-layered wiring layer 135 of the third substrate 110C to each other. In such a case, the TSV 157 may have a structure similar to a pad lead structure in which the pad 151 and wiring lines in the multi-layered wiring layers of the respective substrates are electrically coupled to each other by the electrically-conductive material layer 510 with which the inner wall of the lead line opening 155a is filmed. Thus, the TSV 157 is also able to function as the pad lead structure, and it is possible to form the TSV 157 concurrently when the pad lead structure including the lead line opening 155b is formed.

Further, as illustrated in FIG. 10E, in contrast to the structure of the solid-state imaging device 10D, the pad 151 may be formed by being embedded inside the insulating film 109.

Note that, in the solid-state imaging devices 10A to 10E illustrated in FIGS. 10A, 10B, 10C, 10D, and 10E, the electrically-conductive material layer 510 may be provided to be electrically isolated for each of the lead line openings 155a and 155b. In addition, the pad 151 may be provided for each of the lead line openings 155a and 155b, or the plurality of pads 151 may be provided for each of the lead line openings 155a and 155b.

4-6. Sixth Configuration Example

Next, with reference to FIGS. 11A, 11B, and 11C, solid-state imaging devices 11A to 11C according to the sixth configuration example are described. FIGS. 11A, 11B, and 11C are vertical cross-sectional views of examples of the solid-state imaging devices 11A to 11C according to the sixth configuration example.

The solid-state imaging devices 11A to 11C according to the sixth configuration example are each provided with the electrode junction structure 159 in which the electrodes provided to the respective bonding surfaces of the second substrate 110B and the third substrate 110C are joined in direct contact with each other.

Specifically, as illustrated in FIG. 11A, the electrode junction structure 159 is formed by joining an electrode formed on the uppermost layer of the multi-layered wiring layer 125 of the second substrate 110B and an electrode formed on the uppermost layer of the multi-layered wiring layer 135 of the third substrate 110C in direct contact with each other. Note that the electrode junction structure 159 may be coupled to a wiring line including the second metal similar to the pad 151, or may be coupled to a wiring line including the first metal similar to a normal wiring line. In addition, the solid-state imaging device 11A is provided with the pads 151 inside the multi-layered wiring layer 105 of the first substrate 110A and the multi-layered wiring layer 125 of the second substrate 110B, and the pads 151 are exposed by the pad openings 153a and 153b. As a result, in the solid-state imaging device 1A, the respective signal lines of the first substrate 110A, the second substrate 110B, and the third substrate 110C are electrically coupled to each other and the respective power supply lines of the first substrate 110A, the second substrate 110B, and the third substrate 110C are electrically coupled to each other through the electrode junction structures 159, the pads 151, and the pad openings 153a and 153b.

In addition, as illustrated in FIG. 11B, the pad 151 may be provided to the back surface side of the first substrate 110A, and may be electrically coupled to a wiring line in the multi-layered wiring layer 105 of the first substrate 110A and a wiring line in the multi-layered wiring layer 125 of the second substrate 110B by electrically-conductive material layers 510 with which the inner walls of the lead line openings 155a and 155b are filmed. Specifically, the lead line opening 155a is formed to penetrate the semiconductor substrate 101 from the back surface side of the first substrate 110A and expose a wiring line in the multi-layered wiring layer 105 of the first substrate 110A, and the lead line opening 155b is formed to penetrate the first substrate 110A from the back surface side of the first substrate 110A and expose a wiring line in the multi-layered wiring layer 125 of the second substrate 110B. In addition, the inner walls of the lead line openings 155a and 155b are filmed with the electrically-conductive material layers 510 including tungsten (W) or the like, and the electrically-conductive material layers 510 extend above the insulating film 109 on the back surface side of the first substrate 110A. Further, the pad 151 is provided on the electrically-conductive material layer 510 that extends above the insulating film 109 on the back surface side of the first substrate 110A. That is, the pad 151 may be provided on the back surface of the first substrate 110A and electrically coupled to the wiring lines in the multi-layered wiring layers 105, 125, and 135 of the respective substrates through the electrically-conductive material layers 510.

Further, as illustrated in FIG. 11C, in contrast to the structure of the solid-state imaging device 11B, the pad 151 may be formed by being embedded inside the insulating film 109.

Note that, in the solid-state imaging devices 11A to 11C illustrated in FIGS. 11A, 11B, and 11C, the electrically-conductive material layer 510 may be provided to be electrically isolated for each of the lead line openings 155a and 155b. In addition, the pad 151 may be provided for each of the lead line openings 155a and 155b, or the plurality of pads 151 may be provided for each of the lead line openings 155a and 155b.

4-7. Seventh Configuration Example

Then, with reference to FIGS. 12A, 12B, 12C, 12D, 12E, and 12F, solid-state imaging devices 12A to 12F according to the seventh configuration example are described. FIGS. 12A, 12B, 12C, 12D, 12E, and 12F are vertical cross-sectional views of examples of the solid-state imaging devices 12A to 12F according to the seventh configuration example.

The solid-state imaging devices 12A to 12F according to the seventh configuration example are each provided with the TSV 157 having the twin contact structure in which electrically-conductive materials are embedded in the first through hole that exposes a wiring line in the multi-layered wiring layer 125 of the second substrate 110B and the second through hole that exposes a wiring line in the multi-layered wiring layer 135 of the third substrate 110C, and the electrode junction structure 159 in which the respective electrodes provided to the bonding surfaces of the second substrate 110B and the third substrate 110C are joined in contact with each other.

Specifically, as illustrated in FIG. 12A, the TSV 157 is provided to have a structure in which electrically-conductive materials are embedded in a first through hole that penetrates the third substrate 110C from the back surface side of the third substrate 110C and exposes a wiring line in the multi-layered wiring layer 125 of the second substrate 110B, and a second through hole that penetrates the semiconductor substrate 131 and exposes a wiring line in the multi-layered wiring layer 135 of the third substrate 110C. In addition, the electrode junction structure 159 is formed by joining an electrode provided to the uppermost layer of the multi-layered wiring layer 125 of the second substrate 110B and an electrode provided to the uppermost layer of the multi-layered wiring layer 135 of the third substrate 110C in direct contact with each other. As a result, in the solid-state imaging device 12A, the respective signal lines of the first substrate 110A, the second substrate 110B, and the third substrate 110C are electrically coupled to each other and the respective power supply lines of the first substrate 110A, the second substrate 110B, and the third substrate 110C are electrically coupled to each other through the TSVs 157, the electrode junction structures 159, the pads 151, and the pad openings 153a and 153b.

In addition, as illustrated in FIG. 12B, the pad 151 may be provided to the back surface side of the first substrate 110A, and may be electrically coupled to a wiring line in the multi-layered wiring layer 105 of the first substrate 110A and a wiring line in the multi-layered wiring layer 125 of the second substrate 110B by electrically-conductive material layers 510 with which the inner walls of the lead line openings 155a and 155b are filmed. Specifically, the lead line opening 155a is formed to penetrate the semiconductor substrate 101 from the back surface side of the first substrate 110A and expose a wiring line in the multi-layered wiring layer 105 of the first substrate 110A, and the lead line opening 155b is formed to penetrate the first substrate 110A from the back surface side of the first substrate 110A and expose a wiring line in the multi-layered wiring layer 125 of the second substrate 110B. In addition, the inner walls of the lead line openings 155a and 155b are filmed with the electrically-conductive material layers 510 including tungsten (W) or the like, and the electrically-conductive material layers 510 extend above the insulating film 109 on the back surface side of the first substrate 110A. Further, the pad 151 is provided on the electrically-conductive material layer 510 that extends above the insulating film 109 on the back surface side of the first substrate 110A. That is, the pad 151 may be provided on the back surface of the first substrate 110A and electrically coupled to the wiring lines in the multi-layered wiring layers 105, 125, and 135 of the respective substrates through the electrically-conductive material layers 510.

Further, as illustrated in FIG. 12C, in contrast to the structure of the solid-state imaging device 12B, the pad 151 may be embedded inside the insulating film 109.

In addition, as illustrated in FIG. 12D, the TSV 157 may be provided by penetrating the second substrate from the back surface side of the second substrate 110B. Specifically, the TSV 157 may be provided to have a structure in which electrically-conductive materials are embedded in a first through hole that penetrates the semiconductor substrate 121 from the back surface side of the second substrate 110B and exposes a wiring line in the multi-layered wiring layer 125 of the second substrate 110B, and a second through hole that penetrates the third substrate 110C from the back surface side of the second substrate 110B and exposes a wiring line in the multi-layered wiring layer 135 of the third substrate 110C. This also allows the TSV 157 to electrically couple a wiring line of the second substrate 110B and a wiring line of the third substrate 110C to each other. Accordingly, the respective signal lines of the first substrate 110A, the second substrate 110B and the third substrate 110C may be electrically coupled to each other, and the respective power supply lines of the first substrate 110A, the second substrate 110B and the third substrate 110C may be electrically coupled to each other.

In addition, as illustrated in FIG. 12E, in contrast to the structure of the solid-state imaging device 12D, the pad 151 may be provided to the back surface side of the first substrate 110A, and may be electrically coupled to a wiring line in the multi-layered wiring layer 105 of the first substrate 110A and a wiring line in the multi-layered wiring layer 125 of the second substrate 110B by electrically-conductive material layers 510 with which the inner walls of the lead line openings 155a and 155b are filmed. Specifically, the lead line opening 155a is formed to penetrate the semiconductor substrate 101 from the back surface side of the first substrate 110A and expose a wiring line in the multi-layered wiring layer 105 of the first substrate 110A, and the lead line opening 155b is formed to penetrate the first substrate 110A from the back surface side of the first substrate 110A and expose a wiring line in the multi-layered wiring layer 125 of the second substrate 110B. In addition, the inner walls of the lead line openings 155a and 155b are filmed with the electrically-conductive material layers 510 including tungsten (W) or the like, and the electrically-conductive material layers 510 extend above the insulating film 109 on the back surface side of the first substrate 110A. Further, the pad 151 is provided on the electrically-conductive material layer 510 that extends above the insulating film 109 on the back surface side of the first substrate 110A. That is, the pad 151 may be provided on the back surface of the first substrate 110A and electrically coupled to the wiring lines in the multi-layered wiring layers 105, 125, and 135 of the respective substrates through the electrically-conductive material layers 510.

In addition, as illustrated in FIG. 12F, in contrast to the structure of the solid-state imaging device 12E, the pad 151 may be formed by being embedded inside the insulating film 109.

Note that, in the solid-state imaging devices 12A to 12F illustrated in FIGS. 12A, 12B, 12C, 12D, 12E, and 12F, the electrically-conductive material layer 510 may be provided to be electrically isolated for each of the lead line openings 155a and 155b. In addition, the pad 151 may be provided for each of the lead line openings 155a and 155b, or the plurality of pads 151 may be provided for each of the lead line openings 155a and 155b. In addition, the TSV 157 and the electrode junction structure 159 may be coupled to a wiring line including the second metal similar to the pad 151, or may be coupled to a wiring line including the first metal similar to a normal wiring line.

4-8. Eighth Configuration Example

Next, with reference to FIGS. 13A, 13B, 13C, 13D, and 13E, solid-state imaging devices 13A to 13E according to the eighth configuration example are described. FIGS. 13A, 13B, 13C, 13D, and 13E are vertical cross-sectional views of examples of the solid-state imaging devices 13A to 13E according to the eighth configuration example.

The solid-state imaging devices 13A to 13E according to the eighth configuration example are each provided with the TSV 157 having the twin contact structure in which electrically-conductive materials are embedded in the first through hole that exposes a wiring line in the multi-layered wiring layer 125 of the second substrate 110B from the back surface side of the first substrate 110A and the second through hole that exposes a wiring line in the multi-layered wiring layer 135 of the third substrate 110C from the back surface side of the first substrate 110A, and the electrode junction structure 159 in which the respective electrodes provided to the bonding surfaces of the second substrate 110B and the third substrate 110C are joined in contact with each other.

Specifically, as illustrated in FIG. 13A, the TSV 157 is provided to have a structure in which electrically-conductive materials are embedded in a first through hole that penetrates the first substrate 110A from the back surface side of the first substrate 110A and exposes a wiring line in the multi-layered wiring layer 125 of the second substrate 110B, and a second through hole that penetrates the first substrate 110A and the second substrate 110B and exposes a wiring line in the multi-layered wiring layer 135 of the third substrate 110C. Note that the TSV 157 may be coupled to a wiring line including the second metal similar to the pad 151, or may be coupled to a wiring line including the first metal similar to a normal wiring line. In addition, the electrode junction structure 159 is formed by joining an electrode provided to the uppermost layer of the multi-layered wiring layer 125 of the second substrate 110B and an electrode provided to the uppermost layer of the multi-layered wiring layer 135 of the third substrate 110C in direct contact with each other. As a result, in the solid-state imaging device 13A, the respective signal lines of the first substrate 110A, the second substrate 110B, and the third substrate 110C are electrically coupled to each other and the respective power supply lines of the first substrate 110A, the second substrate 110B, and the third substrate 110C are electrically coupled to each other through the TSVs 157, the electrode junction structures 159, the pads 151, and the pad openings 153a and 153b.

In addition, as illustrated in FIG. 13B, the pad 151 may be provided to the back surface side of the first substrate 110A, and may be electrically coupled to a wiring line in the multi-layered wiring layer 105 of the first substrate 110A by the electrically-conductive material layer 510 with which the inner wall of the lead line opening 155 is filmed. Specifically, the lead line opening 155 is formed to penetrate the semiconductor substrate 101 from the back surface side of the first substrate 110A and expose a wiring line in the multi-layered wiring layer 105 of the first substrate 110A. In addition, the inner wall of the lead line opening 155 is filmed with the electrically-conductive material layer 510 including tungsten (W) or the like, and the electrically-conductive material layer 510 extends above the insulating film 109 and the TSV 157 on the back surface side of the first substrate 110A. Further, the pad 151 is provided on the electrically-conductive material layer 510 that extends above the insulating film 109 on the back surface side of the first substrate 110A. That is, the pad 151 may be provided on the back surface of the first substrate 110A and electrically coupled to the wiring lines in the multi-layered wiring layers 105, 125, and 135 of the respective substrates through the electrically-conductive material layers 510.

Further, as illustrated in FIG. 13C, in contrast to the structure of the solid-state imaging device 13B, the pad 151 may be formed by being embedded inside the insulating film 109.

In addition, as illustrated in FIG. 13D, in contrast to the structure of a solid-state imaging device 13C, the TSV 157 may be provided to have a structure in which films including electrically-conductive materials are formed on the inner walls of the first through hole and the second through hole instead of a structure in which electrically-conductive materials are embedded in the first through hole and the second through hole. Specifically, the inner walls of the first through hole and the second through hole (i.e., lead line openings 155b and 155a) of the TSV 157 are filmed with the electrically-conductive material layers 510, and the electrically-conductive material layers 510 electrically couple a wiring line in the multi-layered wiring layer 125 of the second substrate 110B and a wiring line in the multi-layered wiring layer 135 of the third substrate 110C to each other. In such a case, the TSV 157 may have a structure similar to a pad lead structure in which the pad 151 and wiring lines in the multi-layered wiring layers of the respective substrates are electrically coupled to each other by the electrically-conductive material layers 510 with which the inner walls of the lead line openings 155a and 155b are filmed. Thus, the TSV 157 is also able to function as the pad lead structure, and it is possible to form the TSV 157 concurrently when the pad lead structure including the lead line opening 155c is formed.

Further, as illustrated in FIG. 13E, in contrast to the structure of the solid-state imaging device 13D, the pad 151 may be formed by being embedded inside the insulating film 109.

Note that, in the solid-state imaging devices 13A to 13E illustrated in FIGS. 13A, 13B, 13C, 13D, and 13E, the electrically-conductive material layer 510 may be provided to be electrically isolated for each of the lead line openings 155a, 155b, and 155c. In addition, the pad 151 may be provided for each of the lead line openings 155a, 155b, and 155c, or the plurality of pads 151 may be provided for each of the lead line openings 155a, 155b, and 155c.

4-9. Ninth Configuration Example

Then, with reference to FIGS. 14A, 14B, 14C, 14D, 14E, and 14F, solid-state imaging devices 14A to 14F according to the ninth configuration example are described. FIGS. 14A, 14B, 14C, 14D, 14E, and 14F are vertical cross-sectional views of examples of the solid-state imaging devices 14A to 14F according to the ninth configuration example.

The solid-state imaging devices 14A to 14F according to the ninth configuration example are each provided with the TSV 157 that contacts a wiring line in the multi-layered wiring layer 125 of the second substrate 110B and a wiring line in the multi-layered wiring layer 135 of the third substrate 110C, and has the shared contact structure in which an electrically-conductive material is embedded in one through hole, and the electrode junction structure 159 in which the respective electrodes provided to the bonding surfaces of the second substrate 110B and the third substrate 110C are joined in contact with each other.

Specifically, as illustrated in FIG. 14A, the TSV 157 is provided by penetrating the third substrate 110C from the back surface side of the third substrate 110C, and is provided to have a structure in which an electrically-conductive material is embedded in one through hole that contacts a wiring line in the multi-layered wiring layer 135 of the third substrate 110C and exposes a wiring line in the multi-layered wiring layer 125 of the second substrate 110B. Note that the TSV 157 may be coupled to a wiring line including the second metal similar to the pad 151, or may be coupled to a wiring line including the first metal similar to a normal wiring line. In addition, the electrode junction structure 159 is formed by joining an electrode provided to the uppermost layer of the multi-layered wiring layer 125 of the second substrate 110B and an electrode provided to the uppermost layer of the multi-layered wiring layer 135 of the third substrate 110C in direct contact with each other. As a result, in the solid-state imaging device 14A, the respective signal lines of the first substrate 110A, the second substrate 110B, and the third substrate 110C are electrically coupled to each other and the respective power supply lines of the first substrate 110A, the second substrate 110B, and the third substrate 110C are electrically coupled to each other through the TSVs 157, the electrode junction structures 159, the pads 151, and the pad openings 153a and 153b.

In addition, as illustrated in FIG. 14B, the pad 151 may be provided to the back surface side of the first substrate 110A, and may be electrically coupled to a wiring line in the multi-layered wiring layer 105 of the first substrate 110A and a wiring line in the multi-layered wiring layer 125 of the second substrate 110B by electrically-conductive material layers 510 with which the inner walls of the lead line openings 155a and 155b are filmed. Specifically, the lead line opening 155a is formed to penetrate the semiconductor substrate 101 from the back surface side of the first substrate 110A and expose a wiring line in the multi-layered wiring layer 105 of the first substrate 110A, and the lead line opening 155b is formed to penetrate the first substrate 110A from the back surface side of the first substrate 110A and expose a wiring line in the multi-layered wiring layer 125 of the second substrate 110B. In addition, the inner walls of the lead line openings 155a and 155b are filmed with the electrically-conductive material layers 510 including tungsten (W) or the like, and the electrically-conductive material layers 510 extend above the insulating film 109 on the back surface side of the first substrate 110A. Further, the pad 151 is provided on the electrically-conductive material layer 510 that extends above the insulating film 109 on the back surface side of the first substrate 110A. That is, the pad 151 may be provided on the back surface of the first substrate 110A and electrically coupled to the wiring lines in the multi-layered wiring layers 105, 125, and 135 of the respective substrates through the electrically-conductive material layers 510.

Further, as illustrated in FIG. 14C, in contrast to the structure of the solid-state imaging device 14B, the pad 151 may be embedded inside the insulating film 109.

In addition, as illustrated in FIG. 14D, the TSV 157 may be provided by penetrating the second substrate 110B from the back surface side of the second substrate 110B, and is provided to have a structure in which an electrically-conductive material is embedded in one through hole that contacts a wiring line in the multi-layered wiring layer 125 of the second substrate 110B and exposes a wiring line in the multi-layered wiring layer 135 of the third substrate 110C. Note that the TSV 157 may be coupled to a wiring line including the second metal similar to the pad 151, or may be coupled to a wiring line including the first metal similar to a normal wiring line. This also allows the TSV 157 to electrically couple a wiring line of the second substrate 110B and a wiring line of the third substrate 110C to each other. Accordingly, the respective signal lines of the first substrate 110A, the second substrate 110B and the third substrate 110C may be electrically coupled to each other, and the respective power supply lines of the first substrate 110A, the second substrate 110B and the third substrate 110C may be electrically coupled to each other.

In addition, as illustrated in FIG. 14E, in contrast to the structure of the solid-state imaging device 14D, the pad 151 may be provided to the back surface side of the first substrate 110A, and may be electrically coupled to a wiring line in the multi-layered wiring layer 105 of the first substrate 110A and a wiring line in the multi-layered wiring layer 125 of the second substrate 110B by electrically-conductive material layers 510 with which the inner walls of the lead line openings 155a and 155b are filmed. Specifically, the lead line opening 155a is formed to penetrate the semiconductor substrate 101 from the back surface side of the first substrate 110A and expose a wiring line in the multi-layered wiring layer 105 of the first substrate 110A, and the lead line opening 155b is formed to penetrate the first substrate 110A from the back surface side of the first substrate 110A and expose a wiring line in the multi-layered wiring layer 125 of the second substrate 110B. In addition, the inner walls of the lead line openings 155a and 155b are filmed with the electrically-conductive material layers 510 including tungsten (W) or the like, and the electrically-conductive material layers 510 extend above the insulating film 109 on the back surface side of the first substrate 110A. Further, the pad 151 is provided on the electrically-conductive material layer 510 that extends above the insulating film 109 on the back surface side of the first substrate 110A. That is, the pad 151 may be provided on the back surface of the first substrate 110A and electrically coupled to the wiring lines in the multi-layered wiring layers 105, 125, and 135 of the respective substrates through the electrically-conductive material layers 510.

In addition, as illustrated in FIG. 14F, in contrast to the structure of the solid-state imaging device 14E, the pad 151 may be formed by being embedded inside the insulating film 109.

Note that, in the solid-state imaging devices 14A to 14F illustrated in FIGS. 14A, 14B, 14C, 14D, 14E, and 14F, the electrically-conductive material layer 510 may be provided to be electrically isolated for each of the lead line openings 155a and 155b. In addition, the pad 151 may be provided for each of the lead line openings 155a and 155b, or the plurality of pads 151 may be provided for each of the lead line openings 155a and 155b.

4-10. Tenth Configuration Example

Next, with reference to FIGS. 15A, 15B, 15C, 15D, and 15E, solid-state imaging devices 15A to 15E according to the tenth configuration example are described. FIGS. 15A, 15B, 15C, 15D, and 15E are vertical cross-sectional views of examples of the solid-state imaging devices 15A to 15E according to the tenth configuration example.

The solid-state imaging devices 15A to 15E according to the tenth configuration example are each provided with the TSV 157 having the shared contact structure in which an electrically-conductive material is embedded in one through hole provided by penetrating the first substrate 110A and the second substrate 110B from the back surface side of the first substrate 110A, and the electrode junction structure 159 in which the electrodes provided to the respective bonding surfaces of the second substrate 110B and the third substrate 110C are joined in contact with each other.

Specifically, as illustrated in FIG. 15A, the TSV 157 is provided by penetrating the first substrate 110A and the second substrate 110B from the back surface side of the first substrate 110A, and is provided to have a structure in which an electrically-conductive material is embedded in one through hole that contacts a wiring line in the multi-layered wiring layer 125 of the second substrate 110B and exposes a wiring line in the multi-layered wiring layer 135 of the third substrate 110C. Note that the TSV 157 may be coupled to a wiring line including the second metal similar to the pad 151, or may be coupled to a wiring line including the first metal similar to a normal wiring line. In addition, the electrode junction structure 159 is formed by joining an electrode provided to the uppermost layer of the multi-layered wiring layer 125 of the second substrate 110B and an electrode provided to the uppermost layer of the multi-layered wiring layer 135 of the third substrate 110C in direct contact with each other. As a result, in the solid-state imaging device 15A, the respective signal lines of the first substrate 110A, the second substrate 110B, and the third substrate 110C are electrically coupled to each other and the respective power supply lines of the first substrate 110A, the second substrate 110B, and the third substrate 110C are electrically coupled to each other through the TSVs 157, the electrode junction structures 159, the pads 151, and the pad openings 153a and 153b.

In addition, as illustrated in FIG. 15B, the pad 151 may be provided to the back surface side of the first substrate 110A, and may be electrically coupled to a wiring line in the multi-layered wiring layer 105 of the first substrate 110A by the electrically-conductive material layer 510 with which the inner wall of the lead line opening 155 is filmed. Specifically, the lead line opening 155 is formed to penetrate the semiconductor substrate 101 from the back surface side of the first substrate 110A and expose a wiring line in the multi-layered wiring layer 105 of the first substrate 110A. In addition, the inner wall of the lead line opening 155 is filmed with the electrically-conductive material layer 510 including tungsten (W) or the like, and the electrically-conductive material layer 510 extends above the insulating film 109 and the TSV 157 on the back surface side of the first substrate 110A. Further, the pad 151 is provided on the electrically-conductive material layer 510 that extends above the insulating film 109 on the back surface side of the first substrate 110A. The pad 151 may be electrically coupled to the respective signal lines and power supply lines of the second substrate 110B and the third substrate 110C through the electrically-conductive material layer 510 extended over the TSV 157 exposed to the back surface of the first substrate 110A.

Further, as illustrated in FIG. 15C, in contrast to the structure of the solid-state imaging device 15B, the pad 151 may be formed by being embedded inside the insulating film 109.

In addition, as illustrated in FIG. 15D, in contrast to the structure of a solid-state imaging device 15C, the TSV 157 may be provided to have a structure in which a film including an electrically-conductive material is formed on the inner wall of one through hole instead of a structure in which an electrically-conductive material is embedded in one first through hole. Specifically, the inner wall (i.e., lead line opening 155a) of the through hole of the TSV 157 is filmed with the electrically-conductive material layer 510, and the electrically-conductive material layer 510 electrically couples a wiring line in the multi-layered wiring layer 125 of the second substrate 110B and a wiring line in the multi-layered wiring layer 135 of the third substrate 110C to each other. In such a case, the TSV 157 may have a structure similar to a pad lead structure in which the pad 151 and wiring lines in the multi-layered wiring layers of the respective substrates are electrically coupled to each other by the electrically-conductive material layer 510 with which the inner wall of the lead line opening 155 is filmed. Thus, the TSV 157 is also able to function as the pad lead structure, and it is possible to form the TSV 157 concurrently when the pad lead structure including the lead line opening 155b is formed.

Further, as illustrated in FIG. 15E, in contrast to the structure of the solid-state imaging device 15D, the pad 151 may be formed by being embedded inside the insulating film 109.

Note that, in the solid-state imaging devices 15A to 15E illustrated in FIGS. 15A, 15B, 15C, 15D, and 15E, the electrically-conductive material layer 510 may be provided to be electrically isolated for each of the lead line openings 155a and 155b. In addition, the pad 151 may be provided for each of the lead line openings 155a and 155b, or the plurality of pads 151 may be provided for each of the lead line openings 155a and 155b.

5. Application Examples (Application to Electronic Apparatus)

Application examples of the solid-state imaging devices 1 to 15E according to the present embodiment described above are described. Several examples of an electronic apparatus to which the solid-state imaging devices 1 to 15E may be applied are described here with reference to FIGS. 16A, 16B, and 16C.

FIG. 16A is a diagram illustrating the appearance of a smartphone that is an example of an electronic apparatus to which the solid-state imaging devices 1 to 15E according to the present embodiment may be applied. As illustrated in FIG. 16A, a smartphone 901 includes an operation unit 903 that includes a button to receive an operation input made by a user, a display unit 905 that displays various kinds of information, and an imaging unit (not illustrated) that is provided in a housing and electronically shoots an image of an object to be observed. The imaging unit may include the solid-state imaging devices 1 to 15E.

Each of FIGS. 16B and 16C are diagrams illustrating the appearance of a digital camera that is another example of the electronic apparatus to which the solid-state imaging devices 1 to 15E according to the present embodiment may be applied. FIG. 16B illustrates the appearance of a digital camera 911 as viewed from the front (subject side), and FIG. 16C illustrates the appearance of the digital camera 911 as viewed from the back. As illustrated in FIGS. 16B and 16C, the digital camera 911 includes a main body (camera body) 913, an interchangeable lens unit 915, a grip unit 917 that is grasped by a user at the time of shooting, a monitor 919 that displays various kinds of information, an EVF 921 that displays a through image observed by a user at the time of shooting, and an imaging unit (not illustrated) that is provided in a housing and electronically shoots an image of an object to be observed. The imaging unit may include the solid-state imaging devices 1 to 15E.

Several examples of the electronic apparatus to which the solid-state imaging devices 1 to 15E according to the present embodiment may be applied have been described above. Note that the electronic apparatus to which the solid-state imaging devices 1 to 15E may be applied is not limited to those exemplified above, but the solid-state imaging devices 1 to 15E are applicable as imaging units mounted on any electronic apparatus such as a video camera, a spectacle-type wearable device, an HMD (Head Mounted Display), a tablet PC, or a game console.

(Application to Another Structure of Solid-state Imaging Device)

Note that the technology according to the present disclosure may be applied to the solid-state imaging device illustrated in FIG. 17A. FIG. 17A is a cross-sectional view of a configuration example of a solid-state imaging device to which the technology according to the present disclosure may be applied.

In the solid-state imaging device, a PD (photodiode) 20019 receives incident light 20001 coming from the back surface (upper surface in the diagram) side of a semiconductor substrate 20018. Above the PD 20019, a planarization film 20013, a CF (color filter) 20012, and a microlens 20011 are provided. The incident light 20001 sequentially passing through the respective units is received by a light-receiving surface 20017, and is subjected to photoelectric conversion.

For example, in the PD 20019, an n-type semiconductor region 20020 is formed as a charge accumulation region that accumulates charges (electrons). In the PD 20019, the n-type semiconductor region 20020 is provided inside p-type semiconductor regions 20016 and 20041 of the semiconductor substrate 20018. The front surface (lower surface) side of the semiconductor substrate 20018 of the n-type semiconductor region 20020 is provided with the p-type semiconductor region 20041 having higher impurity concentration than that of the back surface (upper surface) side. That is, the PD 20019 has an HAD (Hole-Accumulation Diode) structure, and the p-type semiconductor regions 20016 and 20041 are formed to suppress the generation of dark currents at the respective interfaces with the upper surface side and lower surface side of the n-type semiconductor region 20020.

A pixel separation unit 20030 that electrically separates a plurality of pixels 20010 from each other is provided inside the semiconductor substrate 20018, and the PD 20019 is provided to a region defined by this pixel separation unit 20030. In the diagram, in a case where the solid-state imaging device is viewed from the upper surface side, the pixel separation unit 20030 is formed in the shape of a grid to be interposed between the plurality of pixels 20010, for example, and the PD 20019 is formed in a region defined by this pixel separation unit 20030.

In each PD 20019, the anode is grounded. In the solid-state imaging device, signal charges (e.g., electrons) accumulated by the PD 20019 are read out through a transfer Tr (MOS FET) or the like that is not illustrated, and outputted as electric signals to a VSL (vertical signal line) that is not illustrated.

A wiring layer 20050 is provided to the front surface (lower surface) of the semiconductor substrate 20018 that is opposed to the back surface (upper surface) provided with the respective units such as a light-shielding film 20014, the CF 20012, and the microlens 20011.

The wiring layer 20050 includes a wiring line 20051 and an insulating layer 20052. The wiring line 20051 is formed in the insulating layer 20052, and electrically coupled to each element. The wiring layer 20050 is a so-called multi-layered wiring layer, and is formed by alternately stacking interlayer insulating films and the wiring lines 20051 a plurality of times. The interlayer insulating films are included in the insulating layer 20052. Here, as the wiring lines 20051, wiring lines to a Tr such as the transfer Tr for reading out charges from the PD 20019, and respective wiring lines such as the VSL are stacked with the insulating layer 20052 interposed therebetween.

The wiring layer 20050 is provided with a support substrate 20061 on the surface opposite to the side on which the PD 20019 is provided. For example, a substrate including a silicon semiconductor and having a thickness of several hundreds of μm is provided as the support substrate 20061.

The light-shielding film 20014 is provided to the back surface (upper surface in the diagram) side of the semiconductor substrate 20018.

The light-shielding film 20014 is configured to block a portion of the incident light 20001 from above the semiconductor substrate 20018 toward the back surface of the semiconductor substrate 20018.

The light-shielding film 20014 is provided above the pixel separation unit 20030 provided inside the semiconductor substrate 20018. Here, the light-shielding film 20014 is provided to protrude in the shape of a projection with the insulating film 20015 such as a silicon oxide film interposed between the light-shielding film 20014 and the back surface (upper surface) of the semiconductor substrate 20018. In contrast, to make the incident light 20001 enter the PD 20019, the light-shielding film 20014 is not provided, but there is an opening above the PD 20019 provided inside the semiconductor substrate 20018.

That is, in a case where the solid-state imaging device is viewed from the upper surface side in the diagram, the light-shielding film 20014 has a grid shape in a plan view, and an opening through which the incident light 20001 passes to the light-receiving surface 20017 is formed.

The light-shielding film 20014 includes a light-shielding material that blocks light. For example, titanium (Ti) films and tungsten (W) films are sequentially stacked to form the light-shielding film 20014. In addition, it is possible to form the light-shielding film 20014 by sequentially stacking, for example, titanium nitride (TiN) films and tungsten (W) films.

The light-shielding film 20014 is covered with the planarization film 20013. The planarization film 20013 is formed using an insulating material that transmits light.

The pixel separation unit 20030 includes a groove 20031, a fixed-charge film 20032, and an insulating film 20033.

The fixed-charge film 20032 is formed on the back surface (upper surface) side of the semiconductor substrate 20018 to cover the groove 20031 that defines the space between the plurality of pixels 20010.

Specifically, the fixed-charge film 20032 is provided to cover the inner surface of the groove 20031 formed on the back surface (upper surface) side of the semiconductor substrate 20018 with a predetermined thickness. The insulating film 20033 is then provided to be embedded in (loaded into) the inside of the groove 20031 covered with the fixed-charge film 20032.

Here, the fixed-charge film 20032 is formed using a high dielectric material having a negative fixed charge to form a positive-charge (hole) accumulation region at the interface with the semiconductor substrate 20018 and suppress the generation of dark currents. The fixed-charge film 20032 is formed to have a negative fixed charge. This causes the negative fixed charge to apply an electric field to the interface with the semiconductor substrate 20018, and forms a positive-charge (hole) accumulation region.

It is possible to form the fixed-charge film 20032 by using, for example, a hafnium oxide film (HfO2 film). In addition, it is possible to form the fixed-charge film 20032 to cause the fixed-charge film 20032 to additionally include at least one of oxides of hafnium, zirconium, aluminum, tantalum, titanium, magnesium, yttrium, lanthanide elements, or the like, for example.

In addition, the technology according to the present disclosure may be applied to the solid-state imaging device illustrated in FIG. 17B. FIG. 17B illustrates a schematic configuration of a solid-state imaging device to which the technology according to the present disclosure may be applied.

A solid-state imaging device 30001 includes an imaging unit (so-called pixel unit) 30003 in which a plurality of pixels 30002 is regularly arranged two-dimensionally, and peripheral circuits, that is, a vertical driving unit 30004, a horizontal transfer unit 30005, and an output unit 30006 disposed around the imaging unit 30003. The pixels 30002 each include a photodiode 30021 that is one photoelectric conversion element, and a plurality of pixel transistors (MOS transistors) Tr1, Tr2, Tr3, and Tr4.

The photodiode 30021 has a region in which signal charges photoelectrically converted by using incoming light and generated by the photoelectric conversion are accumulated. In this example, the plurality of pixel transistors includes the four MOS transistors of a transfer transistor T1, a reset transistor Tr2, an amplifying transistor Tr3, and a selection transistor Tr4. The transfer transistor Tr is a transistor that reads out the signal charges accumulated in the photodiode 30021 into a floating diffusion (FD) region 30022 described below. The reset transistor Tr2 is a transistor for setting a prescribed value as the electric potential of the FD region 30022. The amplifying transistor Tr3 is a transistor for electrically amplifying the signal charges read out to the FD region 30022. The selection transistor Tr4 is a transistor for selecting one row of pixels and reading out a pixel signal to the vertical signal line 30008.

Note that, although not illustrated, it is also possible to include the three transistors excluding the selection transistor Tr4 and the photodiode PD in a pixel.

In the circuit configuration of the pixel 30002, the source of the transfer transistor Tr is coupled to the photodiode 30021, and the drain thereof is coupled to the source of the reset transistor Tr2. The FD region 30022 (corresponding to the drain region of the transfer transistor and the source region of the reset transistor) serving as a charge-to-voltage conversion means between the transfer transistor Tr and the reset transistor Tr2 is coupled to the gate of the amplifying transistor Tr3. The source of the amplifying transistor Tr3 is coupled to the drain of the selection transistor Tr4. The drain of the reset transistor Tr2 and the drain of the amplifying transistor Tr3 are coupled to a power supply voltage supplying unit. In addition, the source of the selection transistor Tr4 is coupled to the vertical signal line 30008.

Row reset signals pRST commonly applied to the gates of the reset transistors Tr2 of the pixels arranged in one row, row transfer signals pTRG commonly applied in the same manner to the gates of the transfer transistors Tr of the pixels in one row, and row select signals pSEL commonly applied in the same manner to the gates of the selection transistors Tr4 in one row are each supplied from the vertical driving unit 30004.

The horizontal transfer unit 30005 includes an amplifier or analog/digital converter (ADC) coupled to the vertical signal line 30008 of each column, which is, in this example, an analog/digital converter 30009, a column selection circuit (switch means) 30007, and a horizontal transfer line (e.g., bus wiring including the same number of wiring lines as the number of data bit lines) 30010. The output unit 30006 includes an amplifier or an analog/digital converter and/or a signal processing circuit, which is, in this example, a signal processing circuit 30011 that processes an output from the horizontal transfer line 30010, and an output buffer 30012.

In this solid-state imaging device 30001, the signals of the pixels 30002 in each row are subjected to analog/digital conversion by each analog/digital converter 30009, read out through the sequentially selected column selection circuit 30007 into horizontal transfer lines 30010, and horizontally transferred sequentially. The image data read out to the horizontal transfer line 30010 is outputted by the output buffer 30012 through the signal processing circuit 30011.

As the general operation of the pixel 3002, the gate of the transfer transistor Tr and the gate of the reset transistor Tr2 are first turned on to empty all the charges in the photodiode 30021. The gate of the transfer transistor Tr1 and the gate of the reset transistor Tr2 are then turned off to accumulate charges. Next, the gate of the reset transistor Tr2 is turned on immediately before the charges of the photodiode 30021 are read out, and the electric potential of the FD region 30022 is reset. Afterwards, the gate of the reset transistor Tr2 is turned off, and the gate of the transfer transistor Tr1 is turned on to transfer the charges from the photodiodes 30021 to the FD region 30022. The amplifying transistor Tr3 electrically amplifies signal charges in response to the application of the charges to the gate. Meanwhile, only the selection transistor Tr4 in a pixel to be read is turned on at the time of FD resetting immediately before the reading, and an image signal, subjected to charge-to-voltage conversion, from the amplifying transistor Tr3 in the pixel is read out to the vertical signal line 30008.

Other structural examples of a solid-state imaging device to which the technology according to the present disclosure may be applied have been described above.

(Example of Application to Camera)

The solid-state imaging device described above is applicable to an electronic apparatus such as a camera system such as a digital camera or a video camera, a mobile phone having an imaging function, or another device having an imaging function, for example. As a configuration example of the electronic apparatus, the following describes a camera as an example. FIG. 17C is an explanatory diagram illustrating a configuration example of a video camera to which the technology according to the present disclosure may be applied.

A camera 10000 in this example includes a solid-state imaging device 10001, an optical system 10002 that guides incident light to a light-receiving sensor unit of the solid-state imaging device 10001, a shutter device 10003 provided between the solid-state imaging device 10001 and the optical system 10002, and a drive circuit 10004 that drives the solid-state imaging device 10001. Further, the camera 10000 includes a signal processing circuit 10005 that processes an output signal of the solid-state imaging device 10001.

The optical system (optical lenses) 10002 forms an image of image light (incident light) from a subject on an imaging surface (not illustrated) of the solid-state imaging device 10001. This causes signal charges to be accumulated in the solid-state imaging device 10001 for a predetermined period. Note that the optical system 10002 may include an optical lens group including a plurality of optical lenses. In addition, the shutter device 10003 controls a light irradiating period and a light shielding period of incident light on the solid-state imaging device 10001.

The drive circuit 10004 supplies drive signals to the solid-state imaging device 10001 and the shutter device 10003. The drive circuit 10004 then controls the operation of the solid-state imaging device 10001, and output signals to the signal processing circuit 10005 and the shutter operation of the shutter device 10003 on the basis of the supplied drive signals. That is, in this example, the operation of transferring signals from the solid-state imaging device 10001 to the signal processing circuit 10005 is performed on the basis of drive signals (timing signals) supplied from the drive circuit 10004.

The signal processing circuit 10005 performs various kinds of signal processing on the signals transferred from the solid-state imaging device 10001. The signals (AV-SIGNAL) subjected to the various kinds of signal processing are stored in a storage medium (not illustrated) such as a memory, or outputted to a monitor (not illustrated).

An example of the camera to which the technology according to the present disclosure may be applied has been described above.

(Example of Application to Endoscopic Surgery System)

For example, the technology according to the present disclosure may be applied to an endoscopic surgery system. FIG. 17D is a view depicting an example of a schematic configuration of an endoscopic surgery system to which the technology according to an embodiment of the present disclosure (present technology) can be applied.

In FIG. 17D, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 17E is a block diagram depicting an example of a functional configuration of the camera head 11102 and the CCU 11201 depicted in FIG. 17D.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to, for example, the image pickup unit 11402 of the camera head 11102 out of the components described above. Applying the technology according to the present disclosure to the image pickup unit 11402 makes it possible to obtain a clearer image of a surgical region. This allows a surgeon to check the surgical region with certainty.

Note that the endoscopic surgery system has been described here as an example, but the technology according to the present disclosure may be additionally applied to, for example, a microscopic surgery system or the like.

(Example of Application to Mobile Body)

For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a vessel, or a robot.

FIG. 17F is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 17F, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17F, an audio speaker 12061, a display section 12062, and an instrument panel 12063 are illustrated as the output device. The display section 12062 may, for example, include at least one of an on-board display and a head-up display. FIG. 17G is a diagram depicting an example of the installation position of the imaging section 12031.

In FIG. 17G, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 17G depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle.

In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 and the like out of the components described above. Applying the technology according to the present disclosure to the imaging section 12031 makes it possible to obtain a captured image that is easier to see. This makes it possible to decrease fatigue of a driver. In addition, it is possible to obtain a captured image that is easier to recognize, which makes it possible to improve the accuracy of driving assistance.

6. Supplement

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure. In addition, the appended drawings schematically illustrate an embodiment of the present disclosure. The size proportion of the respective components illustrated in the appended drawings may be thus sometimes different from the actual size proportion of the respective components.

Note that it is needless to say that the solid-state imaging devices 1 to 15E according to the present embodiment may include, as necessary, a structure that allows the respective substrates to be electrically coupled to each other, in addition to the first coupling structure, the second coupling structure, and the third coupling structure described above. In addition, it is needless to say that the various wiring lines included in the solid-state imaging devices 1 to 15E may be coupled to each other in a cross section not illustrated to achieve the functions of the solid-state imaging devices 1 to 15E according to the present embodiment.

Further, the effects described in this specification are merely illustrative or exemplified effects, and are not limitative. That is, with or in the place of the above effects, the technology according to the present disclosure may achieve other effects that are clear to those skilled in the art from the description of this specification. Note that the technical scope of the present disclosure also includes the following configurations.

(1)
A solid-state imaging device including:
  a first substrate including a first semiconductor substrate and a first multi-layered wiring layer stacked on the first semiconductor substrate, the first semiconductor substrate having a pixel unit formed thereon, the pixel unit having pixels arranged thereon;
  a second substrate including a second semiconductor substrate and a second multi-layered wiring layer stacked on the second semiconductor substrate, the second semiconductor substrate having a circuit formed thereon, the circuit having a predetermined function; and
  a third substrate including a third semiconductor substrate and a third multi-layered wiring layer stacked on the third semiconductor substrate, the third semiconductor substrate having a circuit formed thereon, the circuit having a predetermined function,
  the first substrate, the second substrate, and the third substrate being stacked in this order,
  the first substrate and the second substrate being bonded together in a manner that the first multi-layered wiring layer and the second semiconductor substrate are opposed to each other,
  a first coupling structure for electrically coupling a circuit of the first substrate and the circuit of the second substrate to each other not existing, or not including a coupling structure formed from the first substrate as a base over bonding surfaces of the first substrate and the second substrate.

(2)
The solid-state imaging device according to (1), in which the first coupling structure includes an opening provided from a back surface side of the first substrate to expose a predetermined wiring line in the first multi-layered wiring layer, and an opening provided by penetrating at least the first substrate from the back surface side of the first substrate to expose a predetermined wiring line in the second multi-layered wiring layer.

(3)
The solid-state imaging device according to (2), further including a second coupling structure for electrically coupling the circuit of the second substrate and the circuit of the third substrate to each other, in which
  the second coupling structure includes an opening provided by penetrating at least the first substrate from a back surface side of the second substrate to expose a predetermined wiring line in the second multi-layered wiring layer, and an opening provided by penetrating at least the first substrate and the second substrate from the back surface side of the first substrate to expose a predetermined wiring line in the third multi-layered wiring layer.

(4)
The solid-state imaging device according to (3), in which the predetermined wiring line in the second multi-layered wiring layer that is exposed by the opening and the predetermined wiring line in the third multi-layered wiring layer that is exposed by the opening include pads that function as I/O units.

(5)
The solid-state imaging device according to (3), in which
pads that function as I/O units exist on a back surface of the first substrate,
a film including an electrically-conductive material is formed on an inner wall of the opening, and
the predetermined wiring line in the second multi-layered wiring layer that is exposed by the opening and the predetermined wiring line in the third multi-layered wiring layer that is exposed by the opening are electrically coupled to the pads by the electrically-conductive material.

(6)
The solid-state imaging device according to (5), in which the predetermined wiring line in the second multi-layered wiring layer and the predetermined wiring line in the third multi-layered wiring layer are electrically coupled to the same pad by the electrically-conductive material.

(7)
The solid-state imaging device according to (5), in which the predetermined wiring line in the second multi-layered wiring layer and the predetermined wiring line in the third multi-layered wiring layer are electrically coupled to the pads by the electrically-conductive material, the pads being different from each other.

(8)
The solid-state imaging device according to (1), further including a second coupling structure for electrically coupling the circuit of the second substrate and the circuit of the third substrate to each other, in which
the second substrate and the third substrate are bonded together in a manner that the second multi-layered wiring layer and the third multi-layered wiring layer are opposed to each other, and
the second coupling structure includes a via provided by penetrating the second substrate or the third substrate, the via electrically coupling a predetermined wiring line in the second multi-layered wiring layer and a predetermined wiring line in the third multi-layered wiring layer to each other.

(9)
The solid-state imaging device according to (8), in which the via has a structure in which electrically-conductive materials are embedded in a first through hole that exposes the predetermined wiring line in the second multi-layered wiring layer and a second through hole that exposes the predetermined wiring line in the third multi-layered wiring layer and is different from the first through hole, or a structure in which films including electrically-conductive materials are formed on inner walls of the first through hole and the second through hole.

(10)
The solid-state imaging device according to (8), in which the via has a structure in which an electrically-conductive material is embedded in one through hole provided to contact the predetermined wiring line in the second multi-layered wiring layer and expose the predetermined wiring line in the third multi-layered wiring layer, or one through hole provided to contact the predetermined wiring line in the third multi-layered wiring layer and expose the predetermined wiring line in the second multi-layered wiring layer, or a structure in which a film including an electrically-conductive material is formed on an inner wall of the one through hole.

(11)
The solid-state imaging device according to (1), further including a third coupling structure for electrically coupling the circuit of the first substrate and the circuit of the third substrate to each other, in which
the second substrate and the third substrate are bonded together in a manner that the second multi-layered wiring layer and the third multi-layered wiring layer are opposed to each other, and
the third coupling structure includes a via provided by penetrating at least the second substrate from the back surface side of the first substrate or a back surface side of the third substrate, the via electrically coupling a predetermined wiring line in the first multi-layered wiring layer and a predetermined wiring line in the third multi-layered wiring layer to each other.

(12)
The solid-state imaging device according to (11), in which the via has a structure in which electrically-conductive materials are embedded in a first through hole that exposes the predetermined wiring line in the first multi-layered wiring layer, and a second through hole that exposes the predetermined wiring line in the third multi-layered wiring layer and is different from the first through hole, or a structure in which films including electrically-conductive materials are formed on inner walls of the first through hole and the second through hole.

(13)
The solid-state imaging device according to (11), in which the via has a structure in which an electrically-conductive material is embedded in one through hole provided to contact the predetermined wiring line in the third multi-layered wiring layer and expose the predetermined wiring line in the first multi-layered wiring layer, or one through hole provided to contact the predetermined wiring line in the third multi-layered wiring layer and expose the predetermined wiring line in the first multi-layered wiring layer, or a structure in which a film including an electrically-conductive material is formed on an inner wall of the through hole.

(14)
The solid-state imaging device according to (13), in which the via is also electrically coupled to a predetermined wiring line in the second multi-layered wiring layer.

(15)
The solid-state imaging device according to any one of (1) to (14), further including a second coupling structure for electrically coupling the circuit of the second substrate and the circuit of the third substrate to each other, in which
the second coupling structure exists on bonding surfaces of the second substrate and the third substrate, and includes an electrode junction structure in which electrodes formed on the respective bonding surfaces are joined to each other in direct contact with each other.

(16)
The solid-state imaging device according to any one of (1) to (15), in which the second substrate and the third substrate include at least one of a logic circuit or a memory circuit, the logic circuit executing various kinds of signal processing related to an operation of the solid-state imaging device, the memory circuit temporarily holding a pixel signal acquired by each of the pixels of the first substrate.

(17)
The solid-state imaging device according to any one of (1) to (16), in which the second substrate includes a pixel signal processing circuit that performs AD conversion on a pixel signal acquired by each of the pixels of the first substrate, and the first coupling structure exists in association with each of the pixels for transmitting the pixel signal to the pixel signal processing circuit.

(18) An electronic apparatus including
a solid-state imaging device that electronically shoots an image of an object to be observed, the solid-state imaging device including
a first substrate including a first semiconductor substrate and a first multi-layered wiring layer stacked on the first semiconductor substrate, the first semiconductor substrate having a pixel unit formed thereon, the pixel unit having pixels arranged thereon,
a second substrate including a second semiconductor substrate and a second multi-layered wiring layer stacked on the second semiconductor substrate, the second semiconductor substrate having a circuit formed thereon, the circuit having a predetermined function, and
a third substrate including a third semiconductor substrate and a third multi-layered wiring layer stacked on the third semiconductor substrate, the third semiconductor substrate having a circuit formed thereon, the circuit having a predetermined function, the first substrate, the second substrate, and the third substrate being stacked in this order,
the first substrate and the second substrate being bonded together in a manner that the first multi-layered wiring layer and the second semiconductor substrate are opposed to each other,
a first coupling structure for electrically coupling a circuit of the first substrate and the circuit of the second substrate to each other not existing, or not including a coupling structure formed from the first substrate as a base over bonding surfaces of the first substrate and the second substrate.

REFERENCE NUMERALS LIST 1, 1a, 1b, 6A to 6B, 7A to 7E, 8A to 8G, 9A to 9F, 10A to 10E, 11A to 11C, 12A to 12F, 13A to 13E, 14A to 14F, 15A to 15E solid-state imaging device
101, 121, 131 semiconductor substrate
103, 109, 123, 129, 133 insulating film
105, 125, 135 multi-layered wiring layer
110A first substrate
110B second substrate
110C third substrate
111 CF layer
113 ML array
151 pad
153, 153a, 153b, 153c pad opening
155, 155a, 155b, 155c lead line opening
157, 157a, 157b TSV
159 electrode junction structure
510 electrically-conductive material layer
901 smartphone (electronic apparatus)
911 digital camera (electronic apparatus)

The invention claimed is:

1. A light detecting device, comprising:
a first substrate that includes:
a first semiconductor substrate; and
a first multi-layered wiring layer on the first semiconductor substrate;
a second substrate that includes:
a second semiconductor substrate; and
a second multi-layered wiring layer on the second semiconductor substrate;
a third substrate that includes:
a third semiconductor substrate; and
a third multi-layered wiring layer on the third semiconductor substrate;
an electrode pad above the first multi-layered wiring layer;
an opening that passes through the second semiconductor substrate; and
an electrically conductive film arranged on a side wall of the opening, wherein
the first substrate, the second substrate, and the third substrate are stacked in this order,
the electrode pad and a wiring in the second multi-layered wiring layer are electrically connected via the electrically conductive film, and
the opening exposes the wiring in the second multi-layered wiring layer.

2. The light detecting device according to claim 1, wherein
the electrode pad is embedded above the first multi-layered wiring layer.

3. The light detecting device according to claim 1, wherein
the electrode pad is on the electrically conductive film.

4. The light detecting device according to claim 1, wherein
the opening penetrates at least one of the first semiconductor substrate or the second semiconductor substrate.

5. The light detecting device according to claim 1, wherein
the opening penetrates from a back side of the second semiconductor substrate.

6. The light detecting device according to claim 1, further comprising a Through-Silicon Via (TSV) that penetrates the third substrate from a back surface side of the third substrate.

7. The light detecting device according to claim 6, wherein the TSV includes a structure in which an electrically-conductive material is embedded in a through hole.

8. The light detecting device according to claim 6, wherein the TSV is configured to
contact a wiring in the third multi-layered wiring layer of the third substrate.

9. The light detecting device according to claim 1, further comprising a coupling structure configured to electrically couple signal lines and power supply lines corresponding to each of the second substrate and the third substrate, wherein
the coupling structure is on a bonding surface of each of the second substrate and the third substrate, and
the coupling structure includes an electrode junction structure in which electrodes on the bonding surface of the second substrate is joined in direct contact with the bonding surface of the third substrate.

* * * * *